(12) United States Patent
Kim et al.

(10) Patent No.: US 12,396,163 B2
(45) Date of Patent: Aug. 19, 2025

(54) SEMICONDUCTOR DEVICES

(71) Applicant: Samsung Electronics Co., Ltd., Suwon-si (KR)

(72) Inventors: Seok-Hyun Kim, Incheon (KR); Kang-Uk Kim, Seoul (KR); Youngsin Kim, Hwaseong-si (KR); Jina Kim, Hwaseong-si (KR); Donghwa Shin, Gwangju (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 413 days.

(21) Appl. No.: 17/857,441

(22) Filed: Jul. 5, 2022

(65) Prior Publication Data

US 2023/0120682 A1    Apr. 20, 2023

(30) Foreign Application Priority Data

Oct. 15, 2021    (KR) .................. 10-2021-0137810

(51) Int. Cl.
H10B 12/00    (2023.01)

(52) U.S. Cl.
CPC .............. H10B 12/50 (2023.02); H10B 12/09 (2023.02); H10B 12/315 (2023.02)

(58) Field of Classification Search
CPC ....... H10B 12/09; H10B 12/315; H10B 12/50
See application file for complete search history.

(56) References Cited

U.S. PATENT DOCUMENTS

| | | |
|---|---|---|
| 7,888,720 B2 | 2/2011 | Seo et al. |
| 8,766,368 B2 | 7/2014 | Kang et al. |
| 8,797,780 B2 | 8/2014 | Lee et al. |
| 8,883,622 B2 | 11/2014 | Park et al. |
| 9,184,168 B2 | 11/2015 | Ryu et al. |
| 9,287,265 B2 | 3/2016 | Park et al. |

(Continued)

FOREIGN PATENT DOCUMENTS

| | | |
|---|---|---|
| CN | 104425509 A | 3/2015 |
| CN | 107611125 A | 1/2018 |

(Continued)

OTHER PUBLICATIONS

Examination report dated Mar. 12, 2024 from the Taiwanese Patent Office for corresponding application.

*Primary Examiner* — Edward Chin

(74) *Attorney, Agent, or Firm* — Muir Patent Law, PLLC

(57) ABSTRACT

A semiconductor device includes a substrate including an active cell region, a boundary region, and a dummy cell region therebetween, bit lines disposed on the active cell region, extended in a first direction, and spaced apart from each other in a second direction, the bit lines including first and second bit lines alternately arranged in the second direction, bitline pads spaced apart from each other in the second direction on the boundary region, the second bit lines being extended to the dummy cell region and the boundary region in the first direction and being connected to the bitline pads, respectively, and an insulating separation pattern on the boundary region and between the bitline pads. A portion of the insulating separation pattern is extended into a region between the second bit lines on the boundary region and is in contact with an end portion of a corresponding first bit line.

20 Claims, 60 Drawing Sheets

(56) References Cited

U.S. PATENT DOCUMENTS

| | | |
|---|---|---|
| 9,780,095 B2 | 10/2017 | Chun et al. |
| 10,651,176 B2 | 5/2020 | Chun |
| 11,581,326 B2 | 2/2023 | Han et al. |
| 2021/0082924 A1* | 3/2021 | Seong .................. H10B 12/315 |
| 2021/0134810 A1* | 5/2021 | Lin ........................ H10D 1/716 |
| 2021/0167080 A1* | 6/2021 | Han ........................ H10B 43/27 |
| 2021/0375882 A1* | 12/2021 | Chuang ................ H10B 12/482 |
| 2022/0271044 A1 | 8/2022 | Kim et al. |

FOREIGN PATENT DOCUMENTS

| | | |
|---|---|---|
| CN | 112864166 A | 5/2021 |
| KR | 1020060037015 A | 5/2006 |
| KR | 100810616 B1 | 3/2008 |
| KR | 101522016 B1 | 5/2015 |
| KR | 1020170098619 A | 8/2017 |
| KR | 101775430 B1 | 9/2017 |
| KR | 101844058 B1 | 3/2018 |
| KR | 101991943 B1 | 6/2019 |
| KR | 1020200145251 A | 12/2020 |
| KR | 1020210032843 A | 3/2021 |
| KR | 1020220118742 A | 8/2022 |
| TW | 1538106 B | 6/2016 |

* cited by examiner

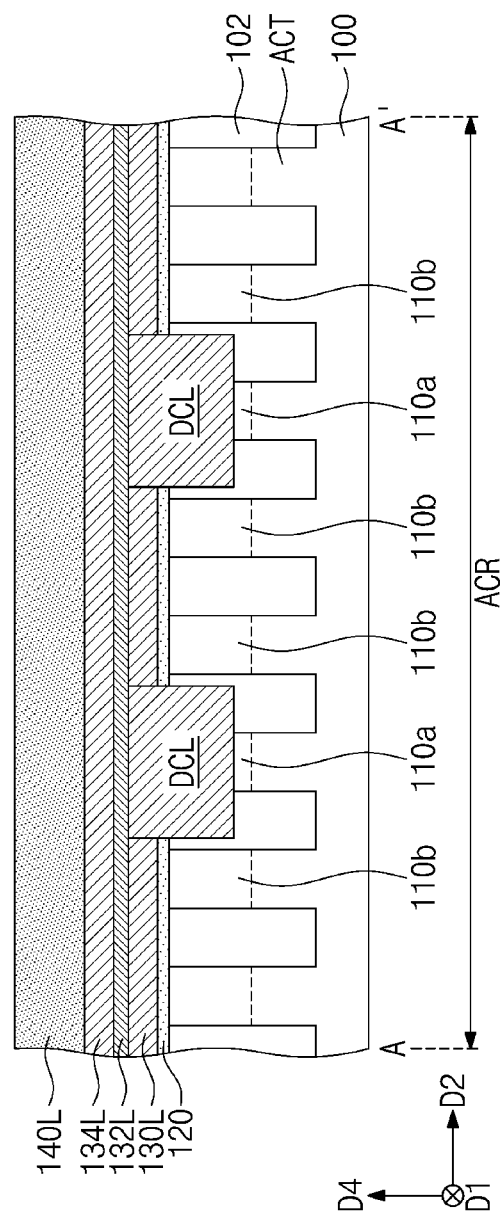

SEMICONDUCTOR DEVICES

CROSS-REFERENCE TO RELATED APPLICATIONS

This U.S. non-provisional patent application claims priority under 35 U.S.C. § 119 to Korean Patent Application No. 10-2021-0137810, filed on Oct. 15, 2021, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor memory device and a method of fabricating the same.

Due to their small-sized, multifunctional, and/or low-cost characteristics, semiconductor devices are being esteemed as important elements in the electronics industry. The semiconductor devices are classified into a semiconductor memory device for storing data, a semiconductor logic device for processing data, and a hybrid semiconductor device including both of memory and logic elements.

Due to the increasing demand for electronic devices with a fast speed and/or low power consumption, the semiconductor device operates at a fast operating speed and/or a low operating voltage, and an integration density of the semiconductor device increases. However, an increase in the integration density of the semiconductor device may lead to deterioration in reliability of the semiconductor device. In addition, as the electronics industry is highly developed, there is an increasing demand for a highly-reliable semiconductor device. Thus, many studies are being conducted to realize a highly-reliable semiconductor device.

SUMMARY

An embodiment of the inventive concept provides a semiconductor device with improved electric characteristics and a method of fabricating the same.

An embodiment of the inventive concept provides a semiconductor device with improved reliability and a method of fabricating the same.

According to an embodiment of the inventive concept, a semiconductor device may include a substrate including an active cell region, a boundary region, and a dummy cell region therebetween, bit lines disposed on the active cell region of the substrate, the bit lines being extended in a first direction and being spaced apart from each other in a second direction crossing the first direction, the bit lines including first bit lines and second bit lines, which are alternately arranged in the second direction, bit line pads disposed on the boundary region of the substrate and spaced apart from each other in the second direction, the second bit lines being extended to the dummy cell region and the boundary region in the first direction and being connected to the bit line pads, respectively, and an insulating separation pattern disposed on the boundary region of the substrate and between two adjacent bit line pads of the bit line pads. A portion of the insulating separation pattern may be extended into a region between two adjacent bit lines among the second bit lines on the boundary region and may be in contact with an end portion of a corresponding first bit line of the first bit lines.

According to an embodiment of the inventive concept, a semiconductor device may include a substrate including an active cell region, a boundary region, and a dummy cell region therebetween, bit lines disposed on the active cell region of the substrate, the bit lines being extended in a first direction and being spaced apart from each other in a second direction crossing the first direction, the bit lines including first bit lines and second bit lines, which are alternately arranged in the second direction, a bit line spacer disposed on a side surface of each of the bit lines, bit line pads disposed on the boundary region of the substrate and spaced apart from each other in the second direction, the second bit lines being extended in the dummy cell region and the boundary region the first direction and being connected to the bit line pads, respectively, and an insulating separation pattern disposed on the boundary region of the substrate and between two adjacent bit line pads among the bit line pads. The insulating separation pattern may include a first portion, which is disposed between the two adjacent bit line pads, and a second portion, which is extended into a region between two adjacent second bit lines among the second bit lines on the boundary region. The second portion of the insulating separation pattern may cover an end portion of a corresponding first bit line of the first bit lines, and the bit line spacer on a side surface of the corresponding first bit line may be extended along a side surface of the second portion of the insulating separation pattern.

BRIEF DESCRIPTION OF THE DRAWINGS

FIGS. 5A, 7A, 9A, 11A, 13A, 15A, 17A, and 19A are sectional views taken along lines A-A' of FIGS. 4, 6, 8, 10, 12, 14, 16, and 18, respectively.

DETAILED DESCRIPTION

Example embodiments of the inventive concepts will now be described more fully with reference to the accompanying drawings, in which example embodiments are shown.

Figure 1:
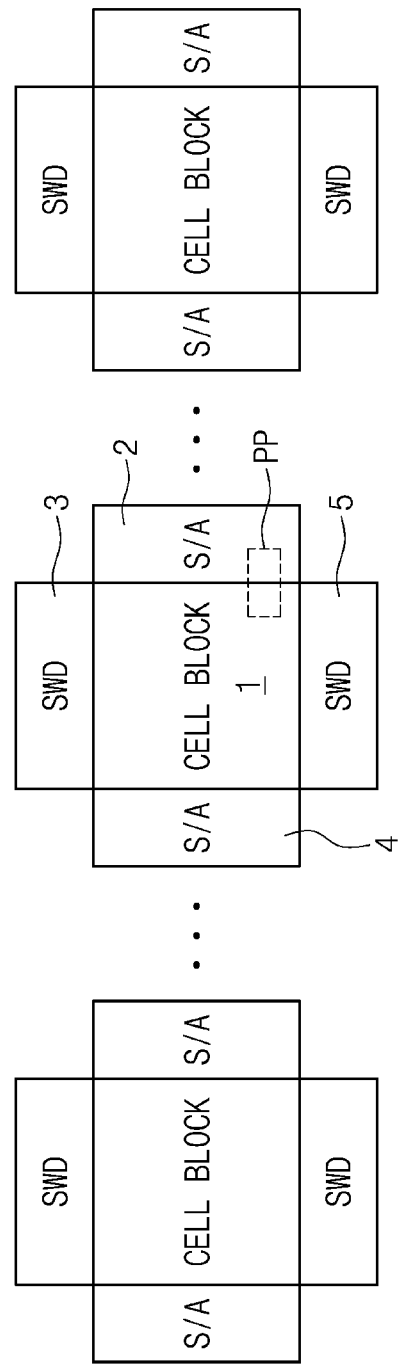
FIG. 1 is a block diagram illustrating a semiconductor device according to an embodiment of the inventive concept.

FIG. 1 is a block diagram illustrating a semiconductor device according to an embodiment of the inventive concept.

Referring to FIG. 1, a semiconductor device may include cell blocks 1 and peripheral blocks 2, 3, 4, and 5, which are disposed around each of the cell blocks 1. The semiconductor device may be a memory device, and each of the cell blocks 1 may include a cell circuit (e.g., an integrated memory circuit). The peripheral blocks 2, 3, 4, and 5 may include various peripheral circuits for an operation of the cell circuit. The peripheral circuits may be electrically connected to the cell circuit. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

Figure 2:
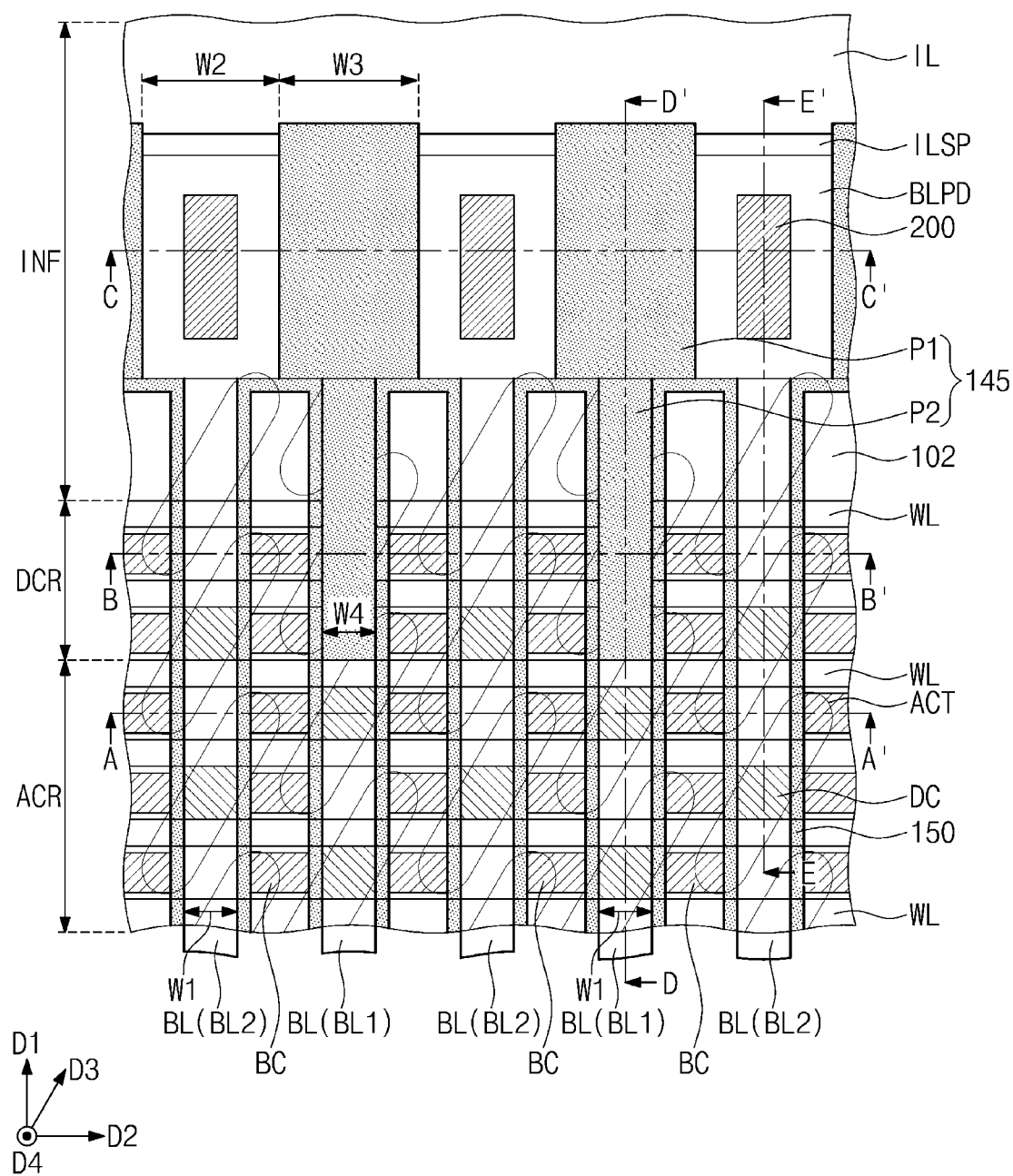
FIG. 2 is a plan view illustrating a semiconductor device according to an embodiment of the inventive concept and corresponding to a portion 'PP' of FIG. 1.
Figure 3A:
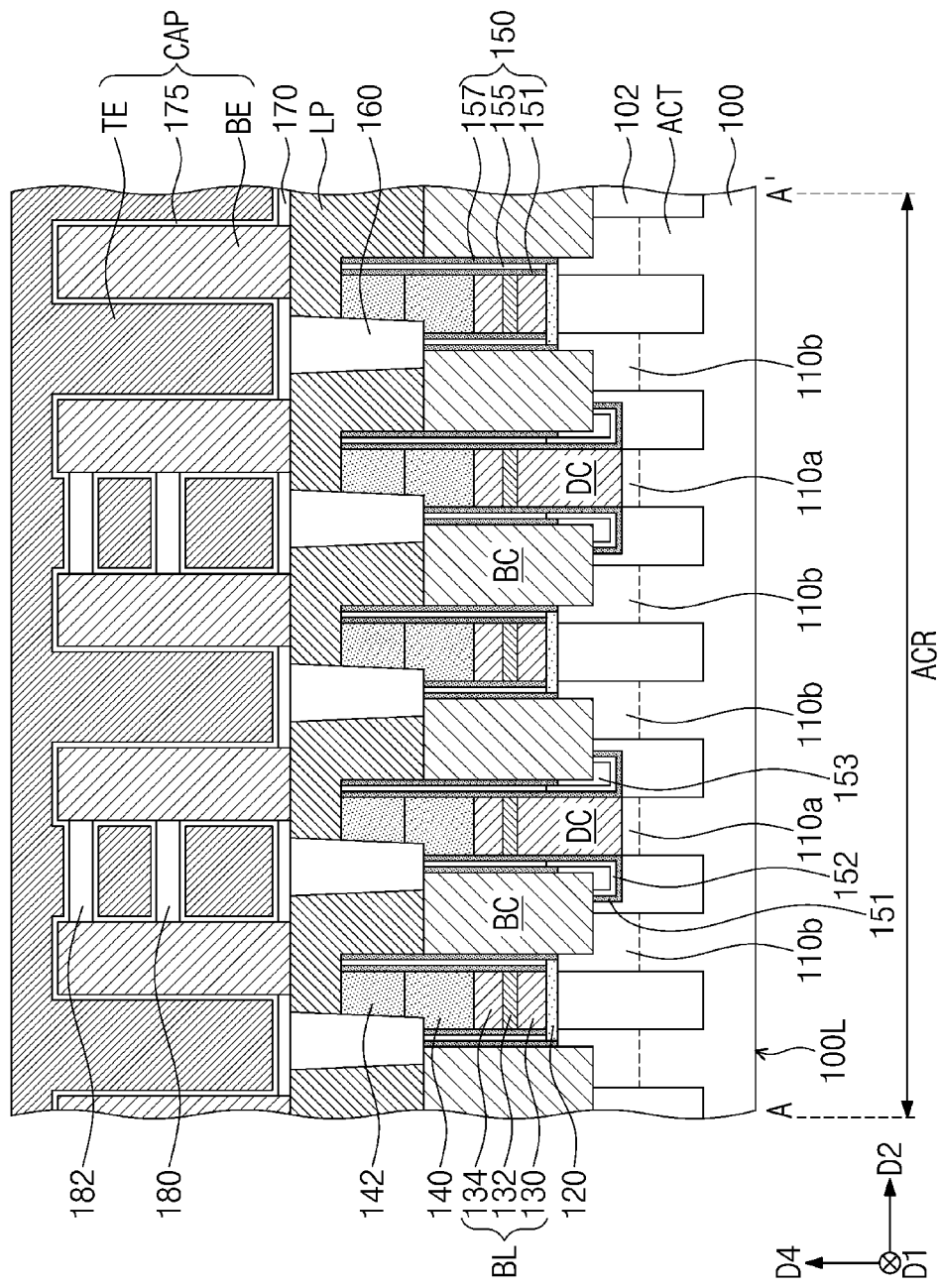
FIGS. 3A, 3B, 3C, 3D, and 3E are sectional views, which are respectively taken along lines A-A', B-B', C-C', D-D', and E-E' of FIG. 2.
Figure 3B:
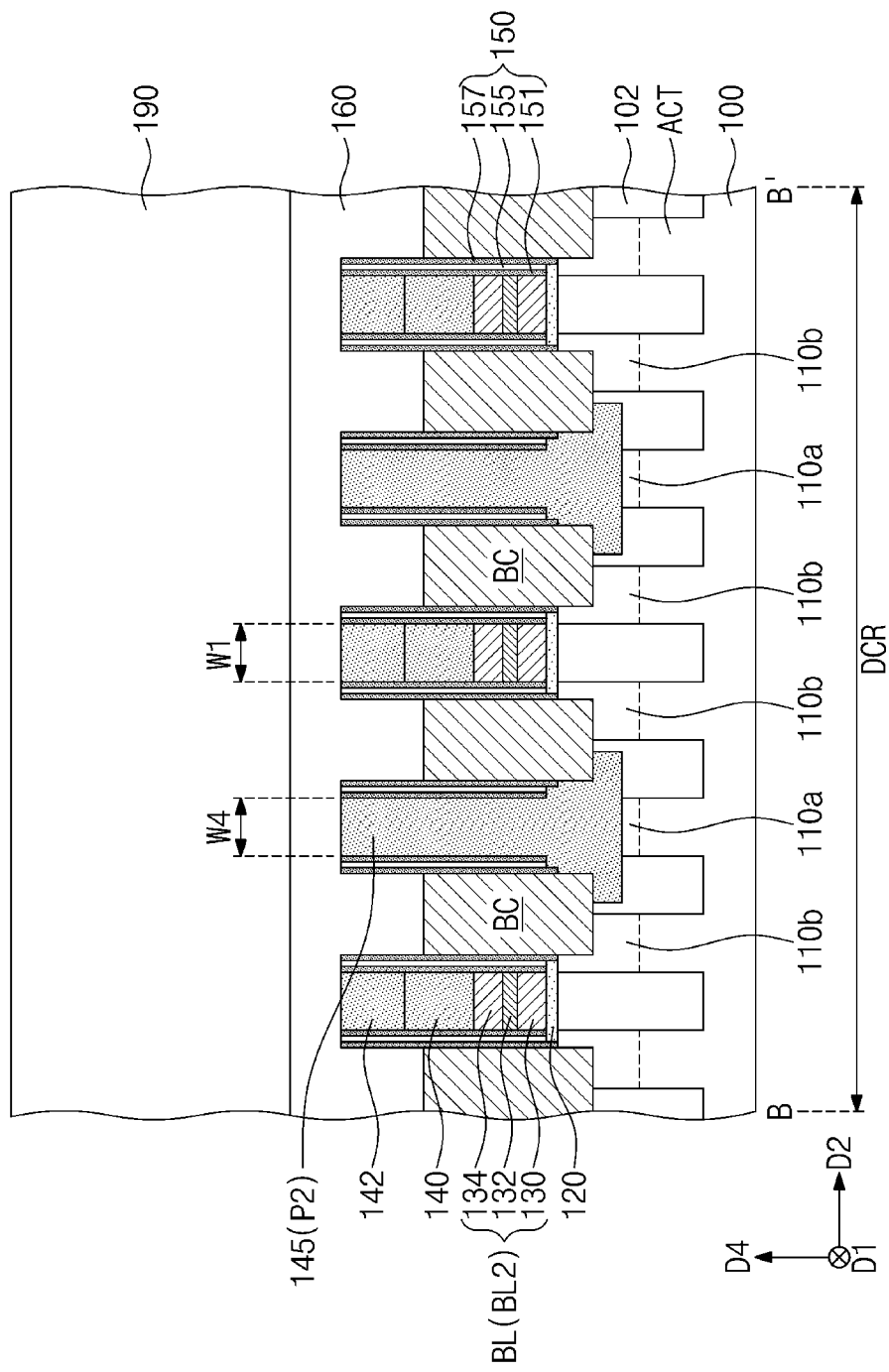
Figure 3C:
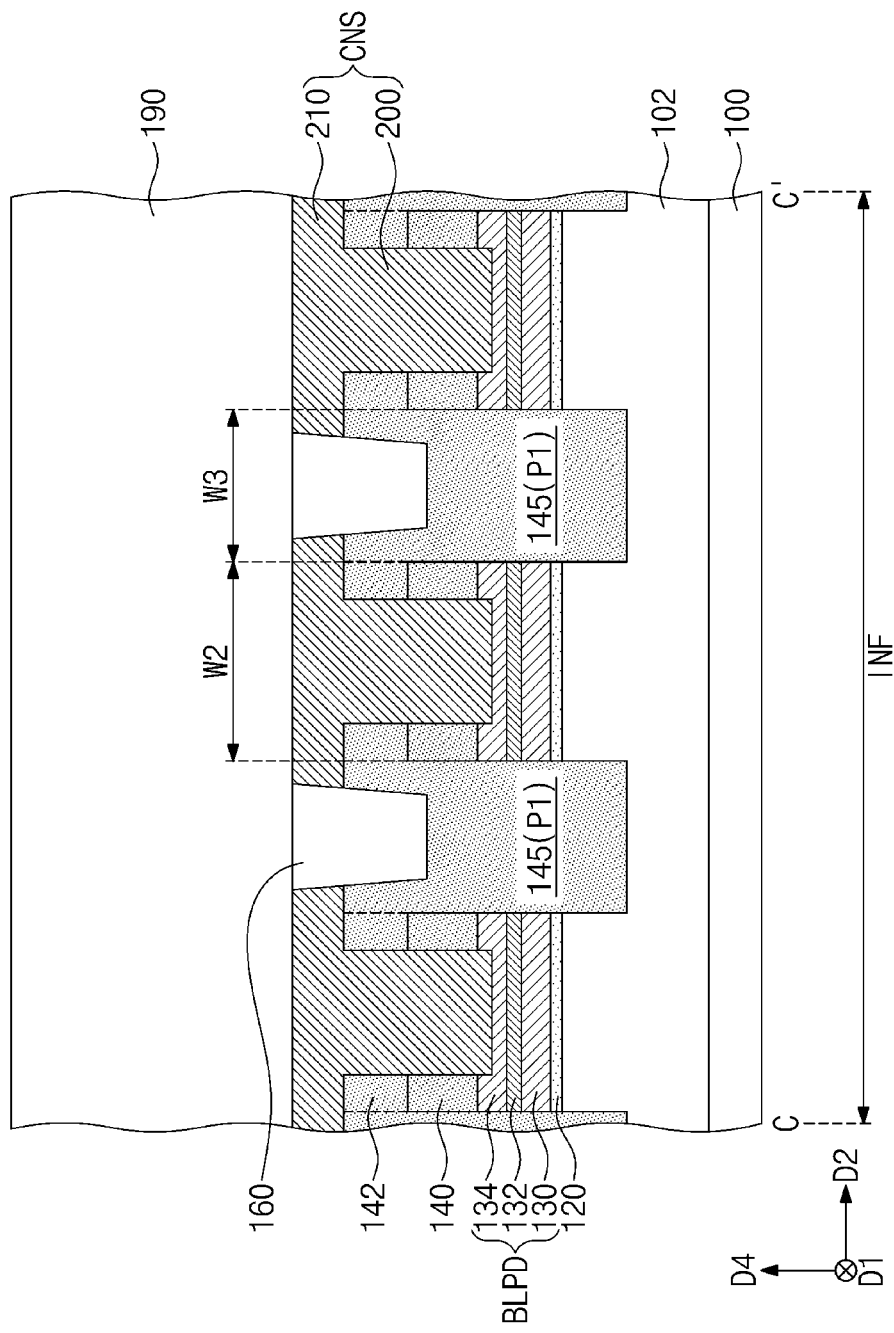
Figure 3D:
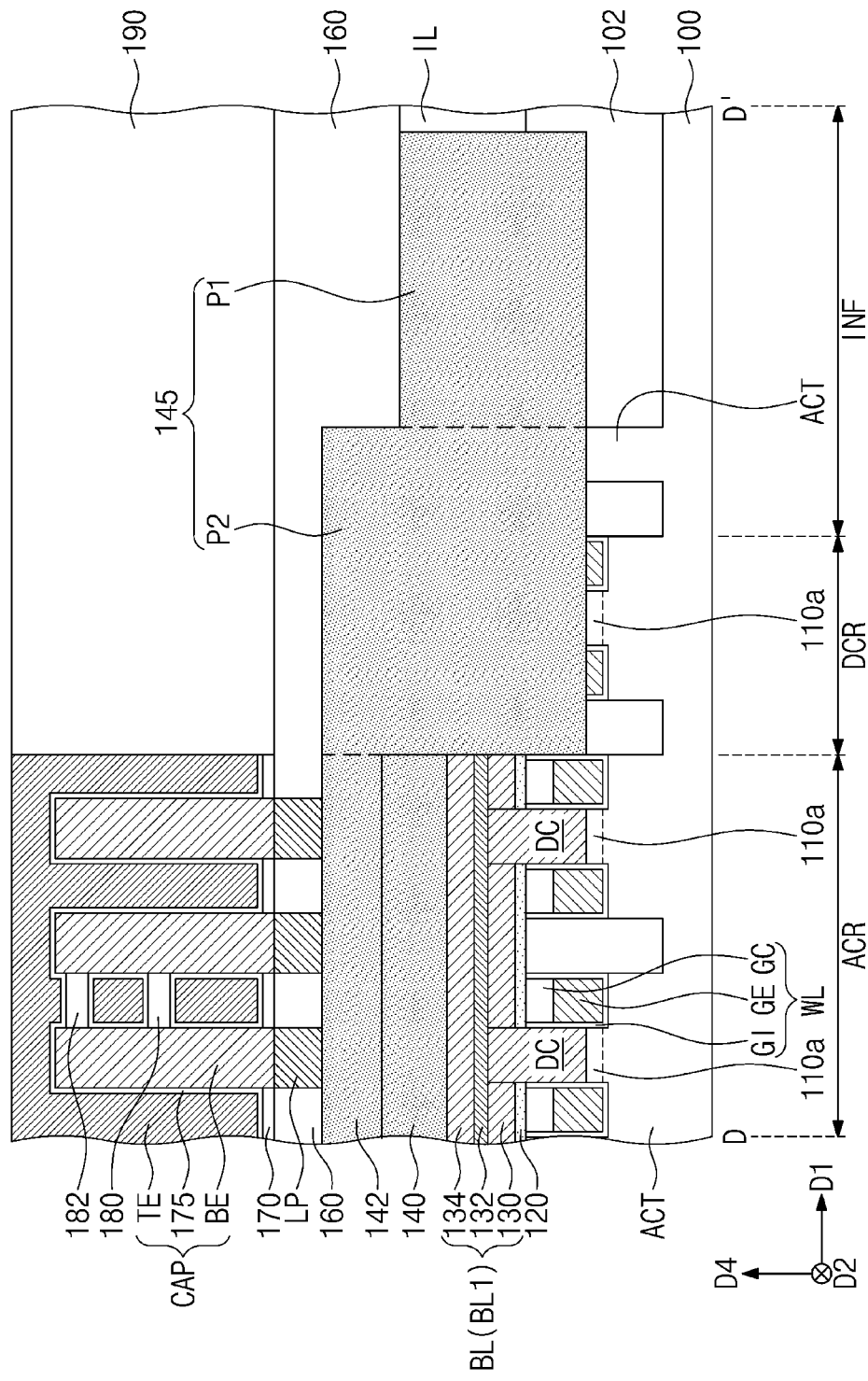
Figure 3E:
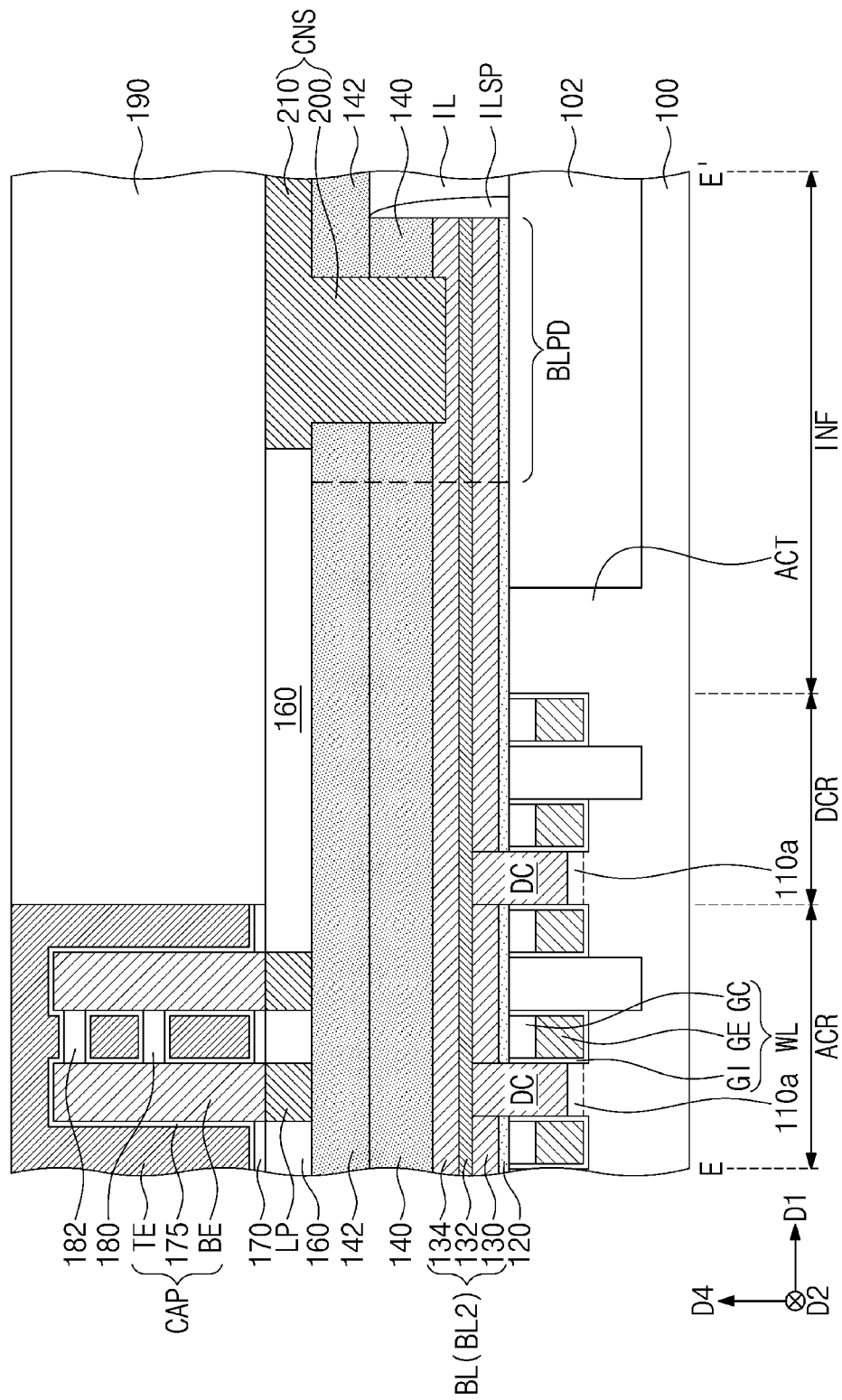
Figure 4:
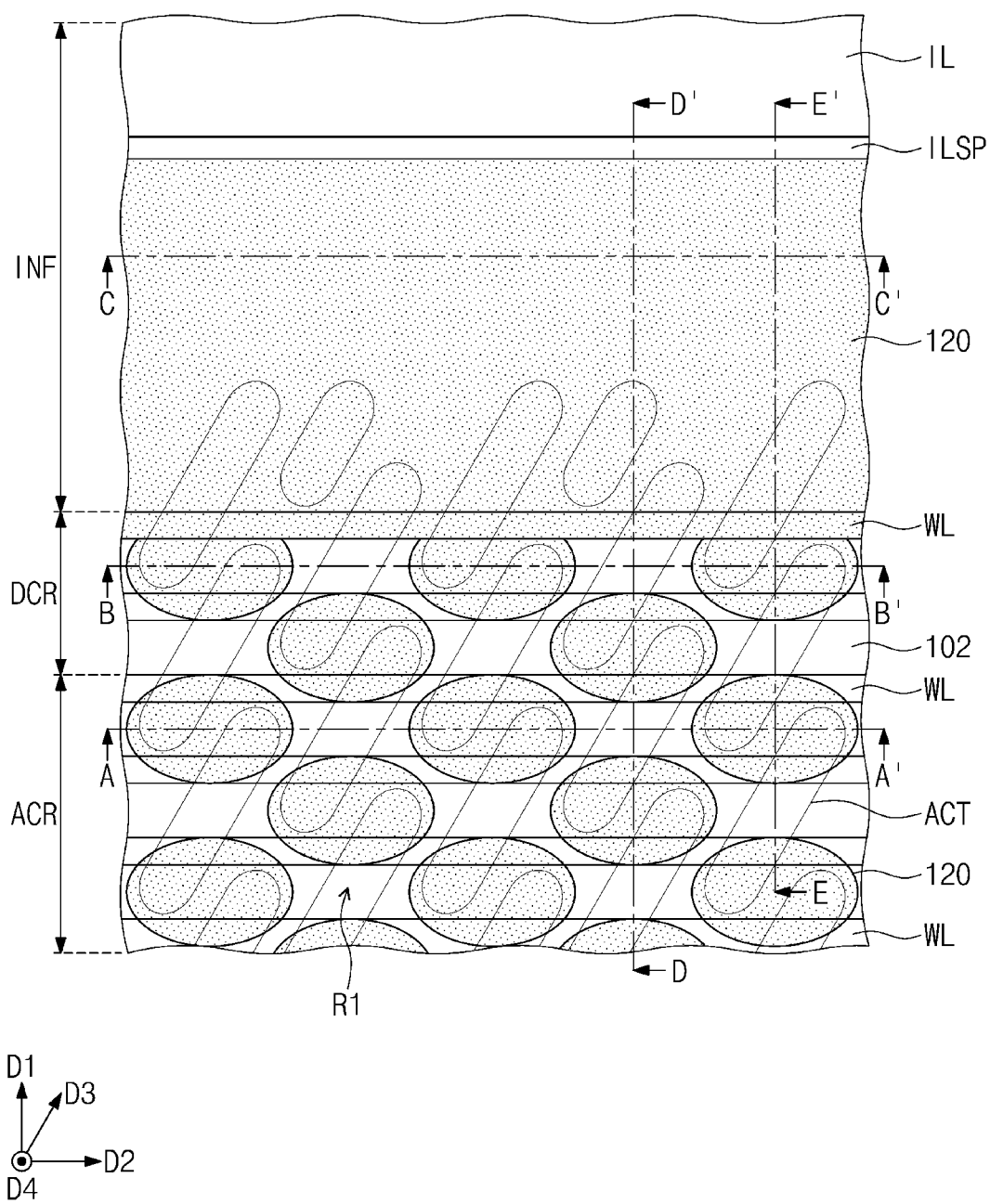
FIGS. 4, 6, 8, 10, 12, 14, 16, and 18 are plan views illustrating a method of fabricating a semiconductor device according to an embodiment of the inventive concept and corresponding to the portion 'PP' of FIG. 1.
Figure 5A:
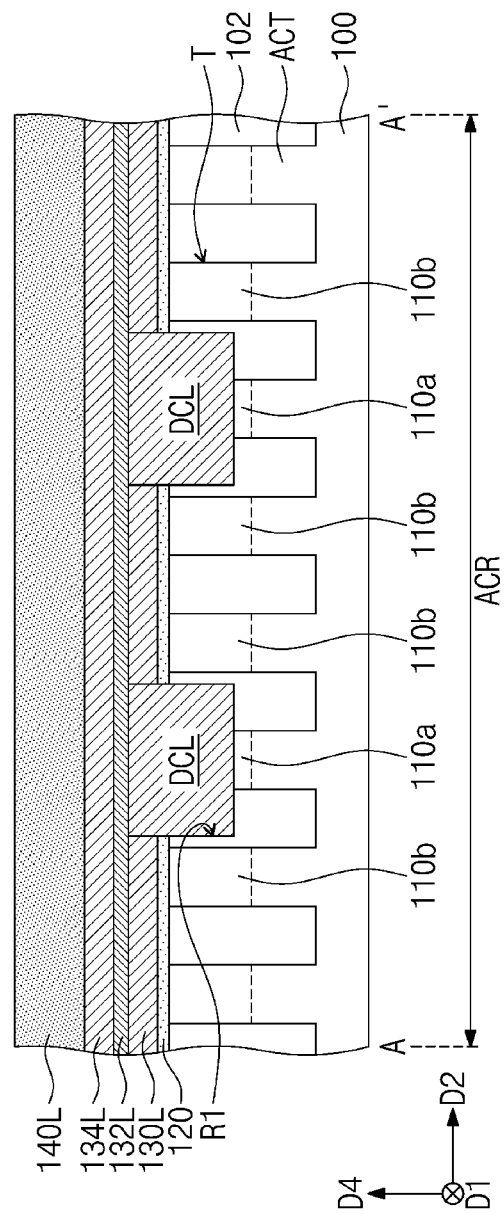
Figure 5B:
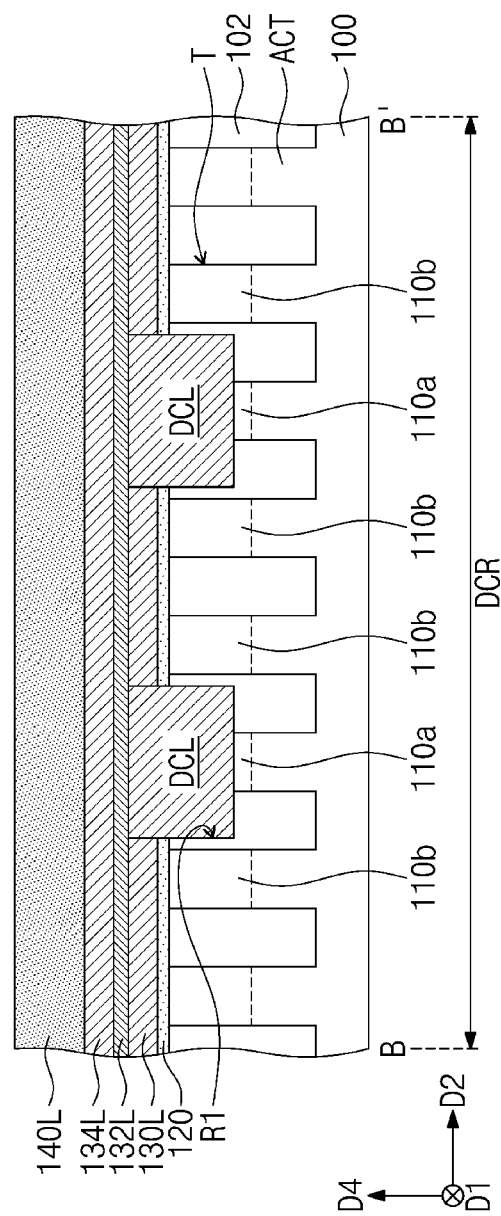
FIGS. 5B, 7B, 9B, 11B, 13B, 15B, 17B, and 19B are sectional views taken along lines B-B' of FIGS. 4, 6, 8, 10, 12, 14, 16, and 18, respectively.
Figure 5C:
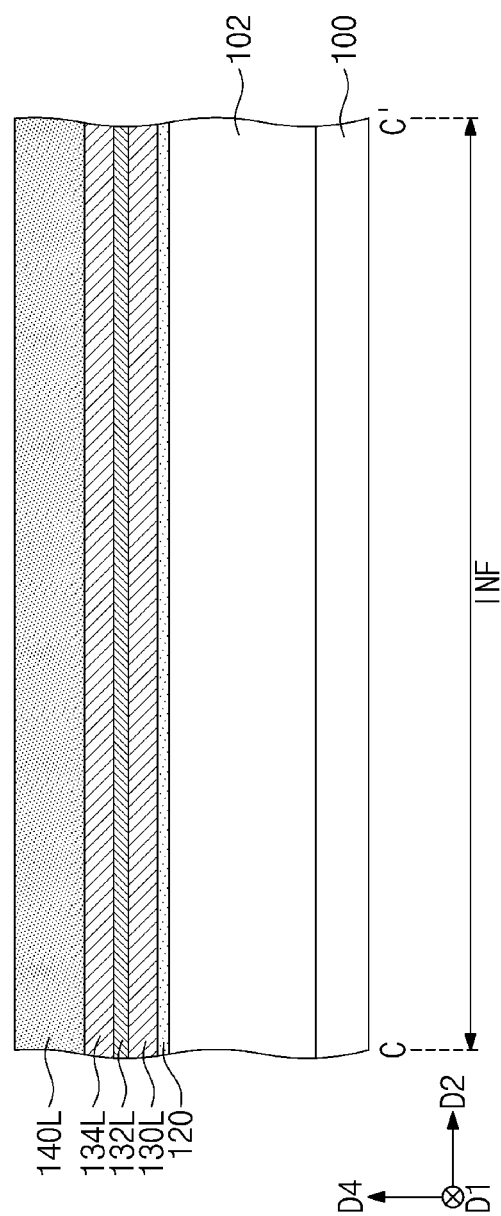
FIGS. 5C, 7C, 9C, 11C, 13C, 15C, 17C, and 19C are sectional views taken along lines C-C' of FIGS. 4, 6, 8, 10, 12, 14, 16, and 18, respectively.
Figure 5D:
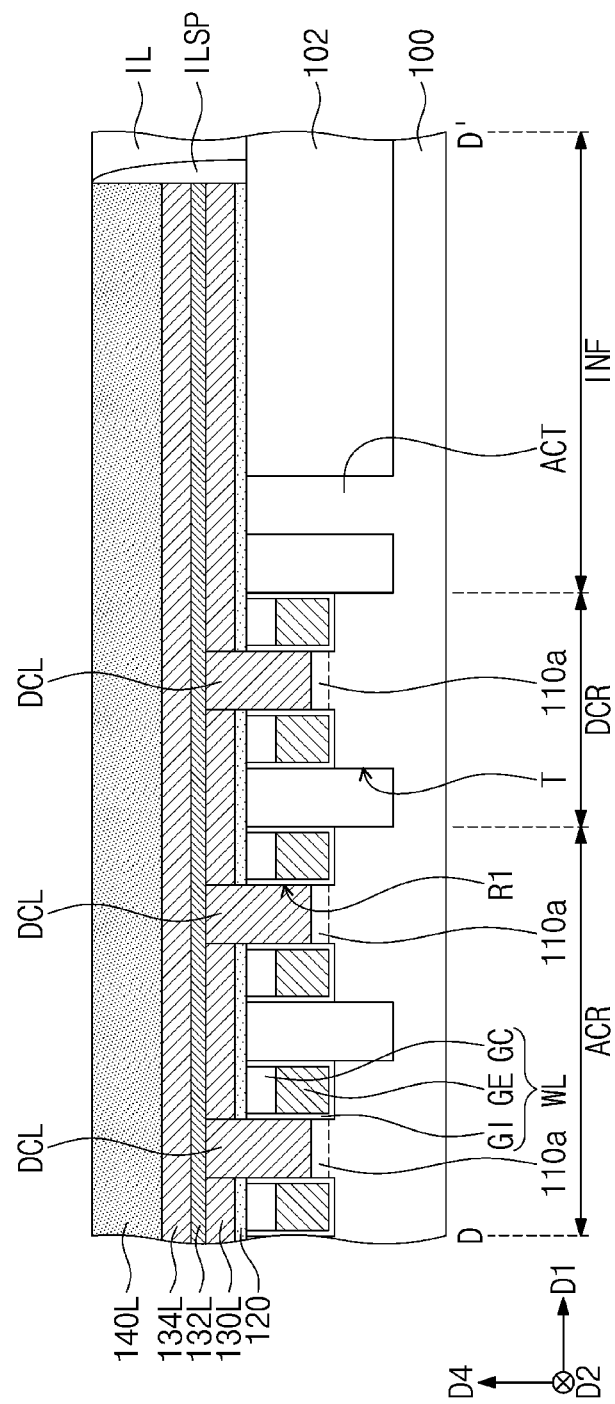
FIGS. 5D, 7D, 9D, 11D, 13D, 15D, 17D, and 19D are sectional views taken along lines D-D' of FIGS. 4, 6, 8, 10, 12, 14, 16, and 18, respectively.
Figure 5E:
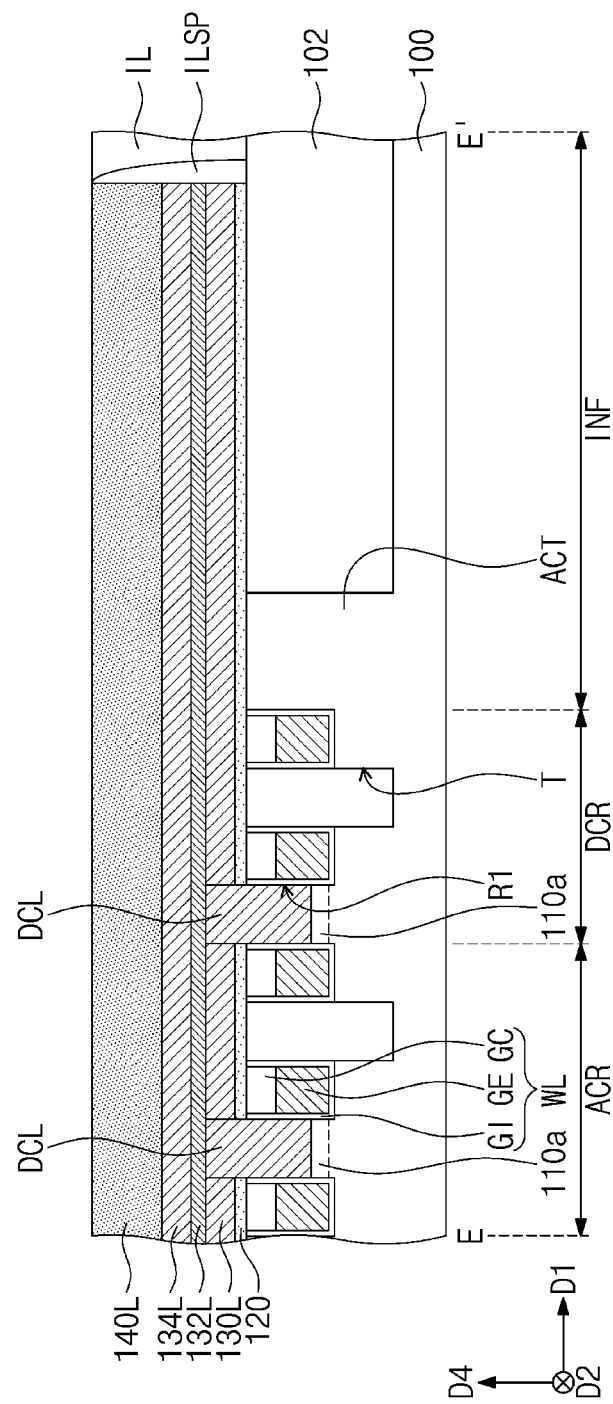
FIGS. 5E, 7E, 9E, 11E, 13E, 15E, 17E, and 19E are sectional views taken along lines E-E' of FIGS. 4, 6, 8, 10, 12, 14, 16, and 18, respectively.
Figure 6:
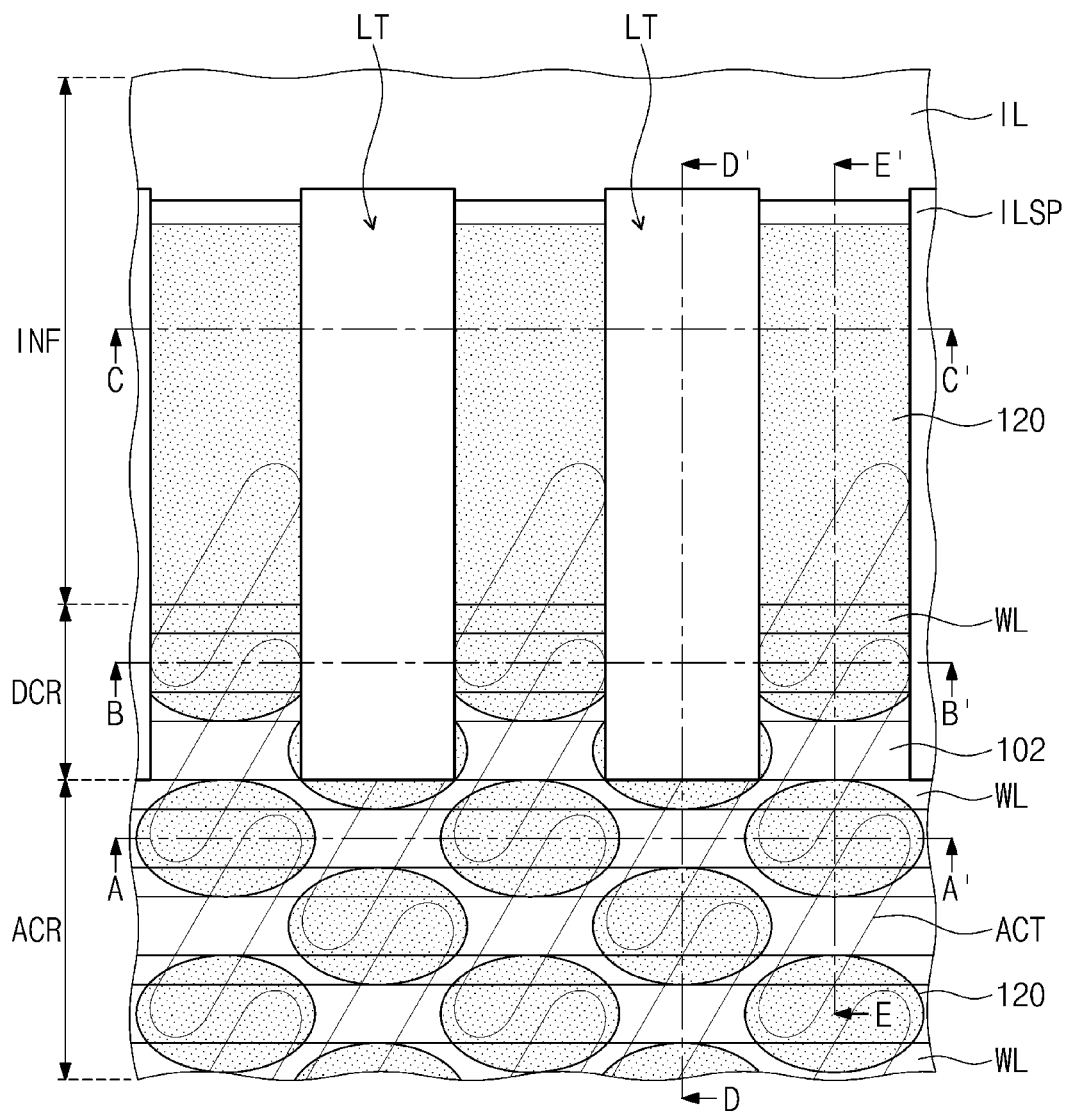
Figure 6:
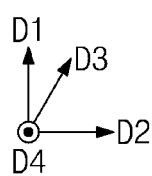
Figure 7B:
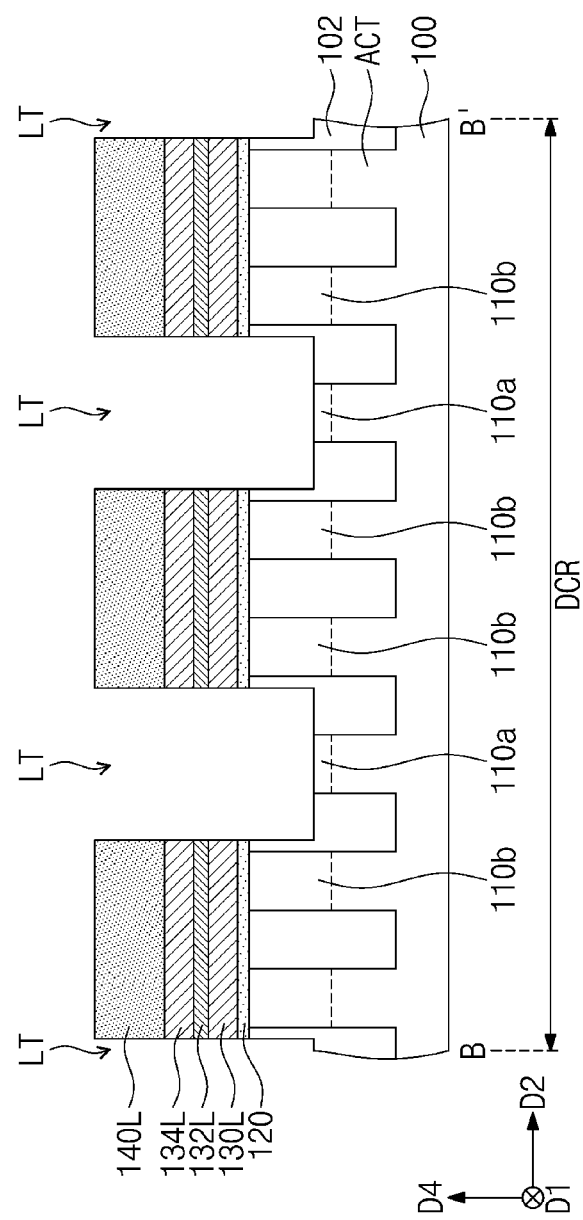
Figure 7C:
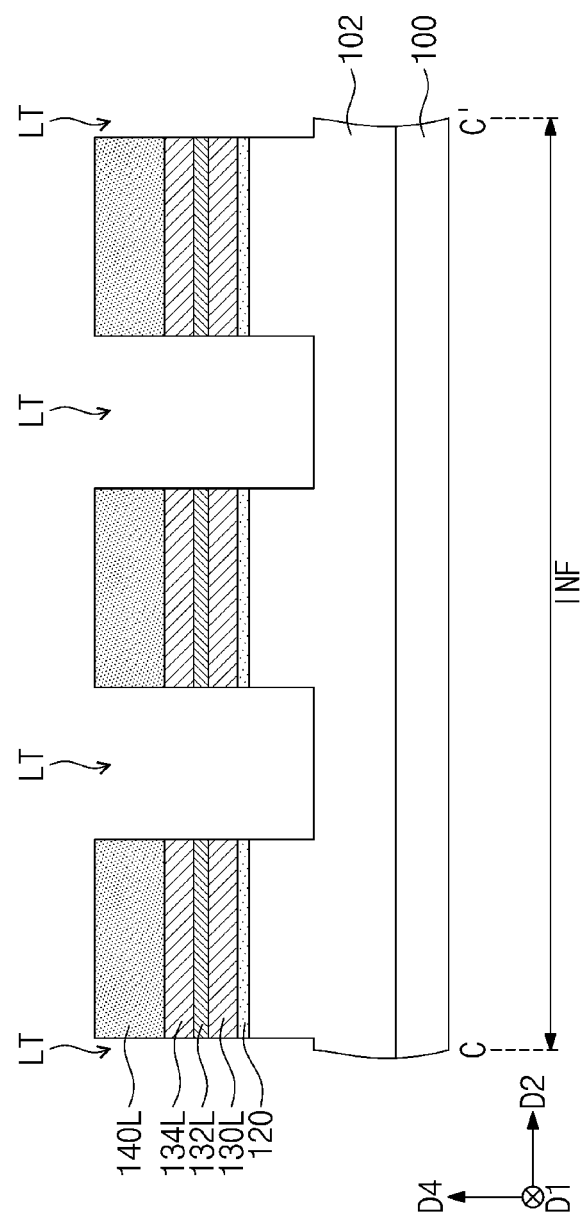
Figure 7D:
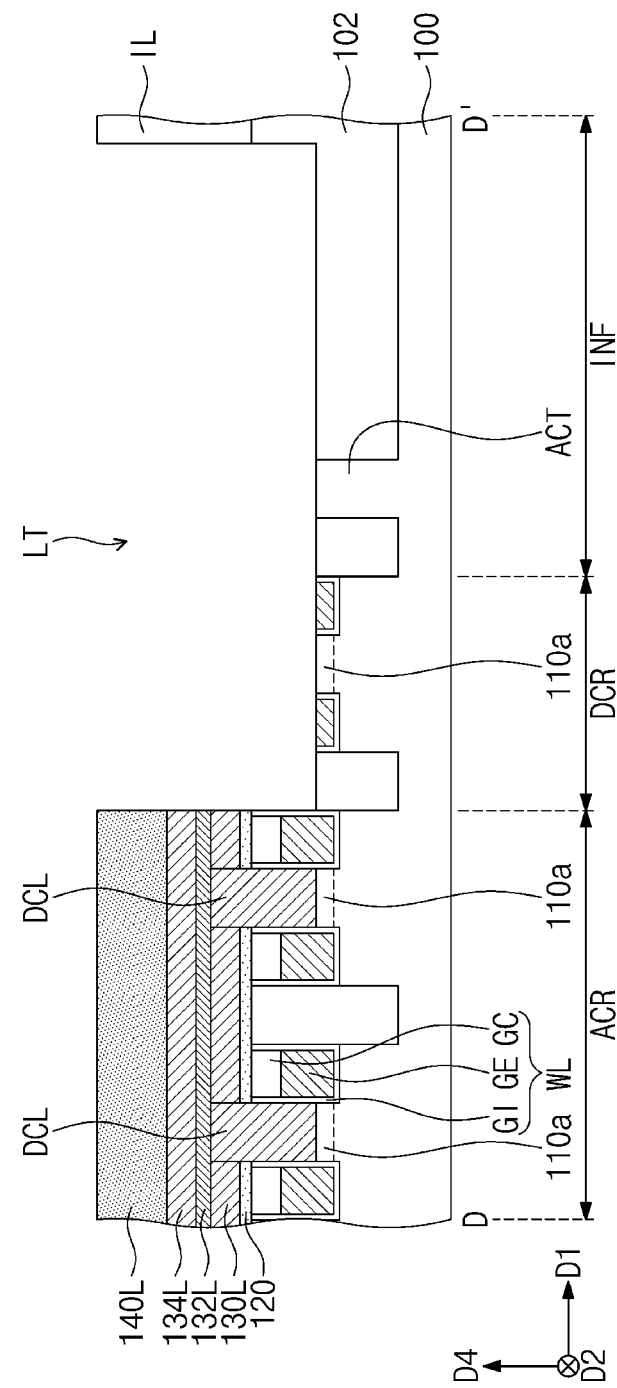
Figure 7E:
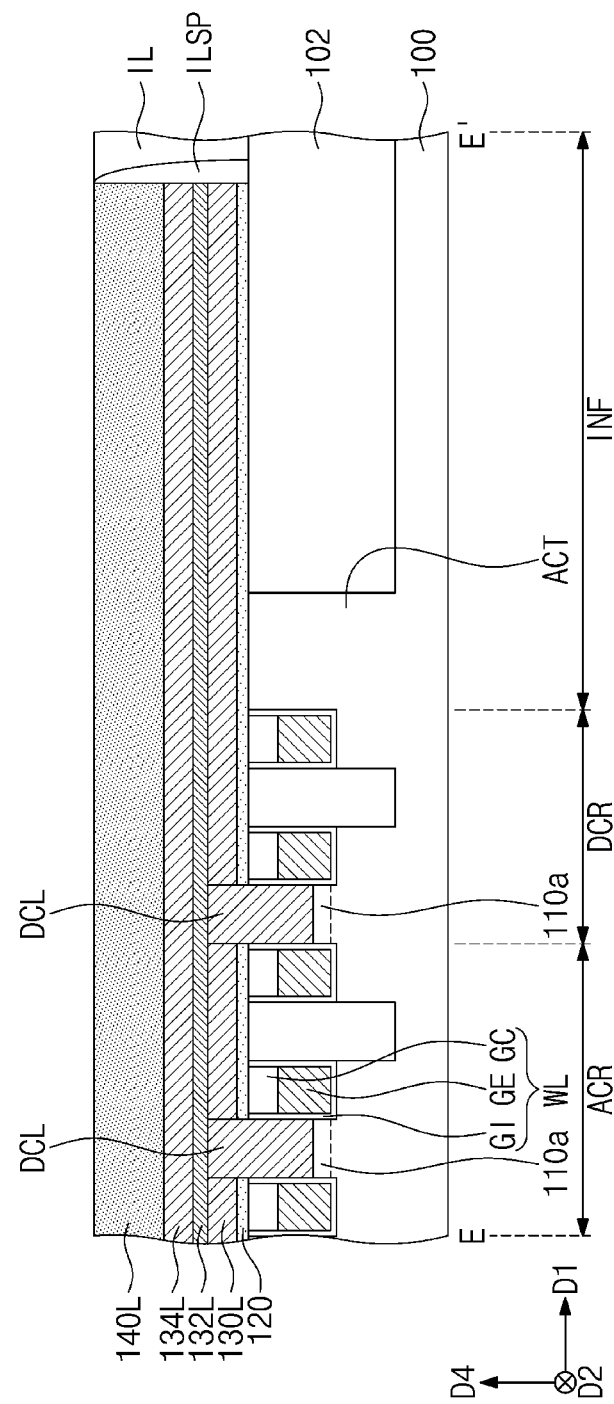
Figure 8:
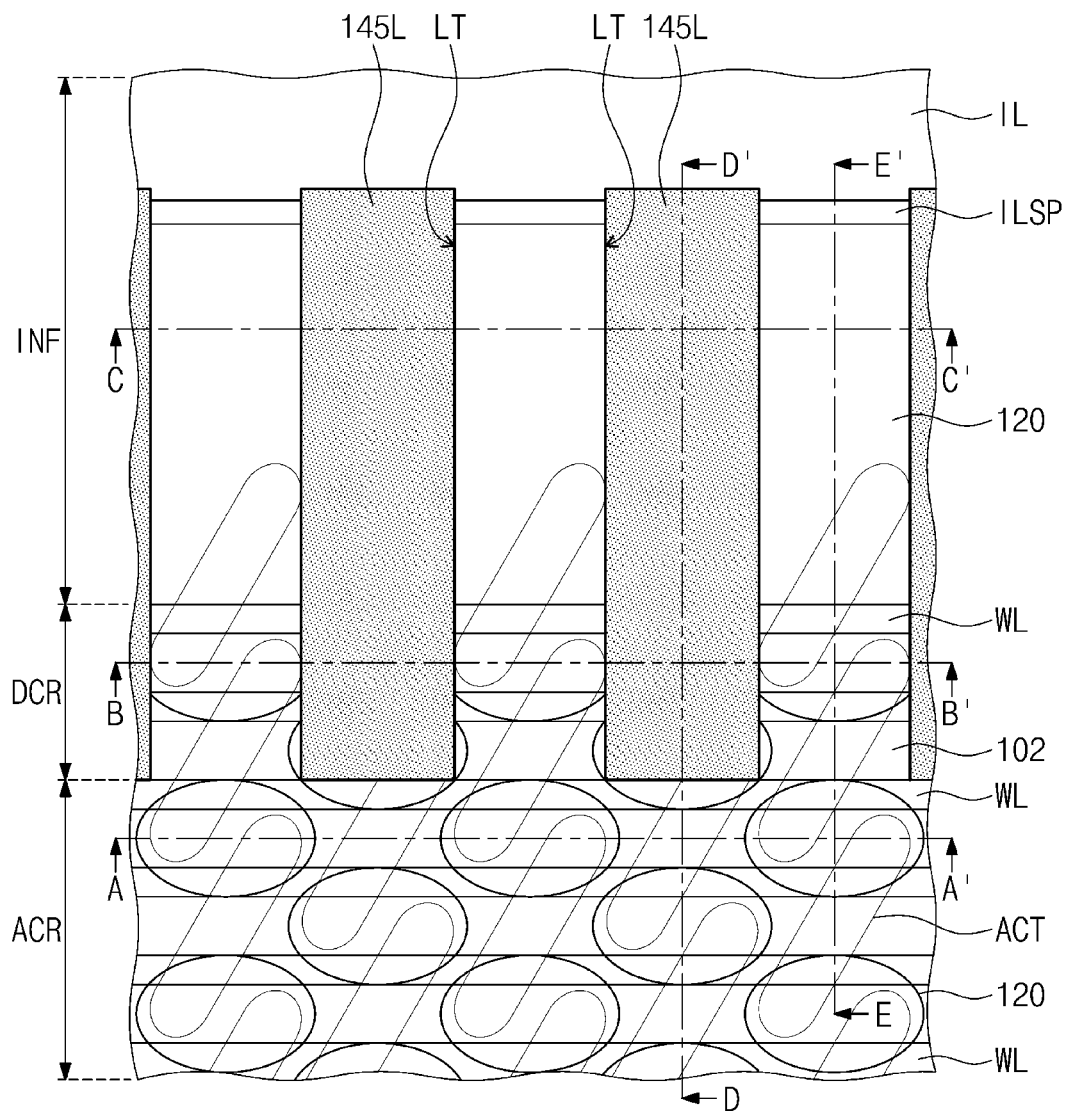
Figure 9A:
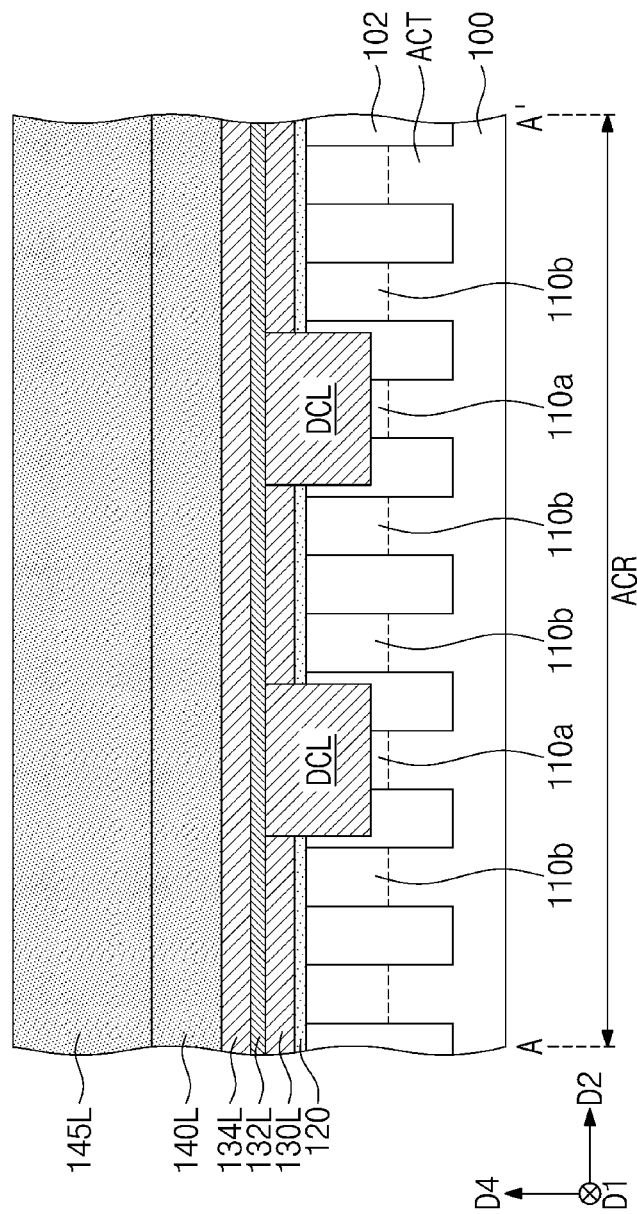
Figure 9B:
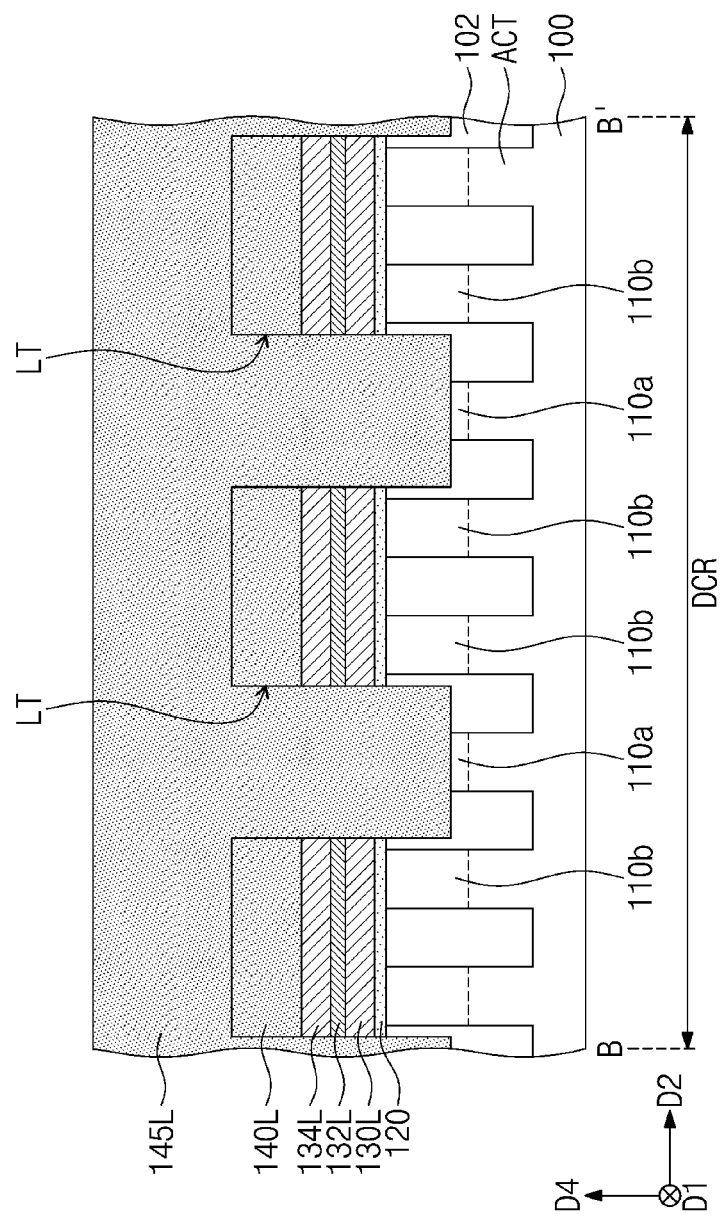
Figure 9C:
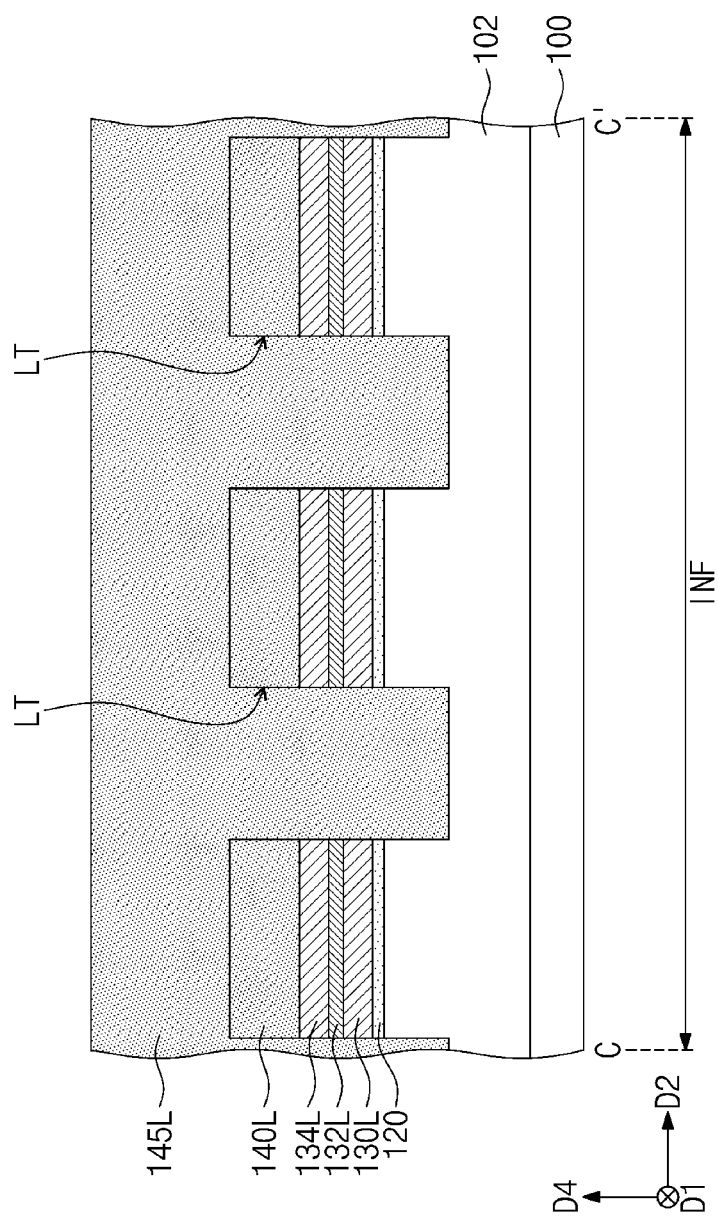
Figure 9D:
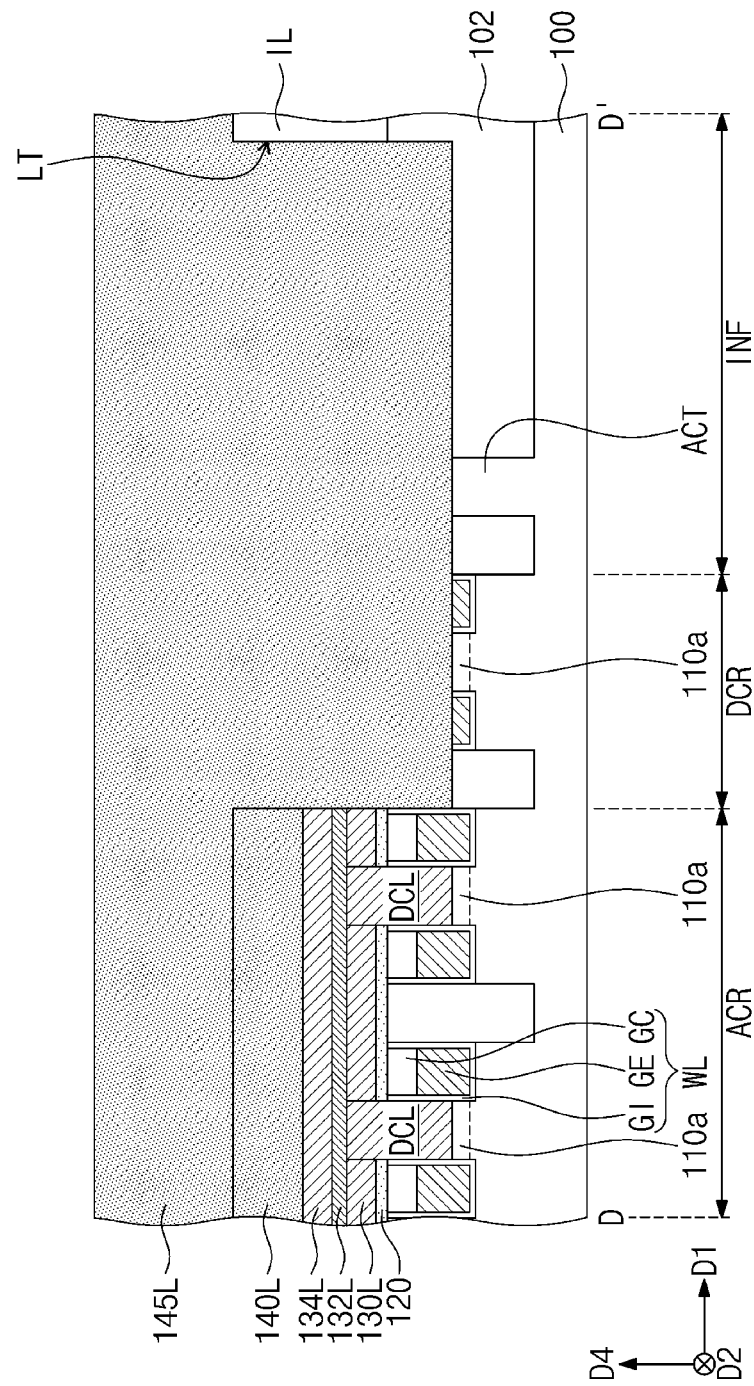
Figure 9E:
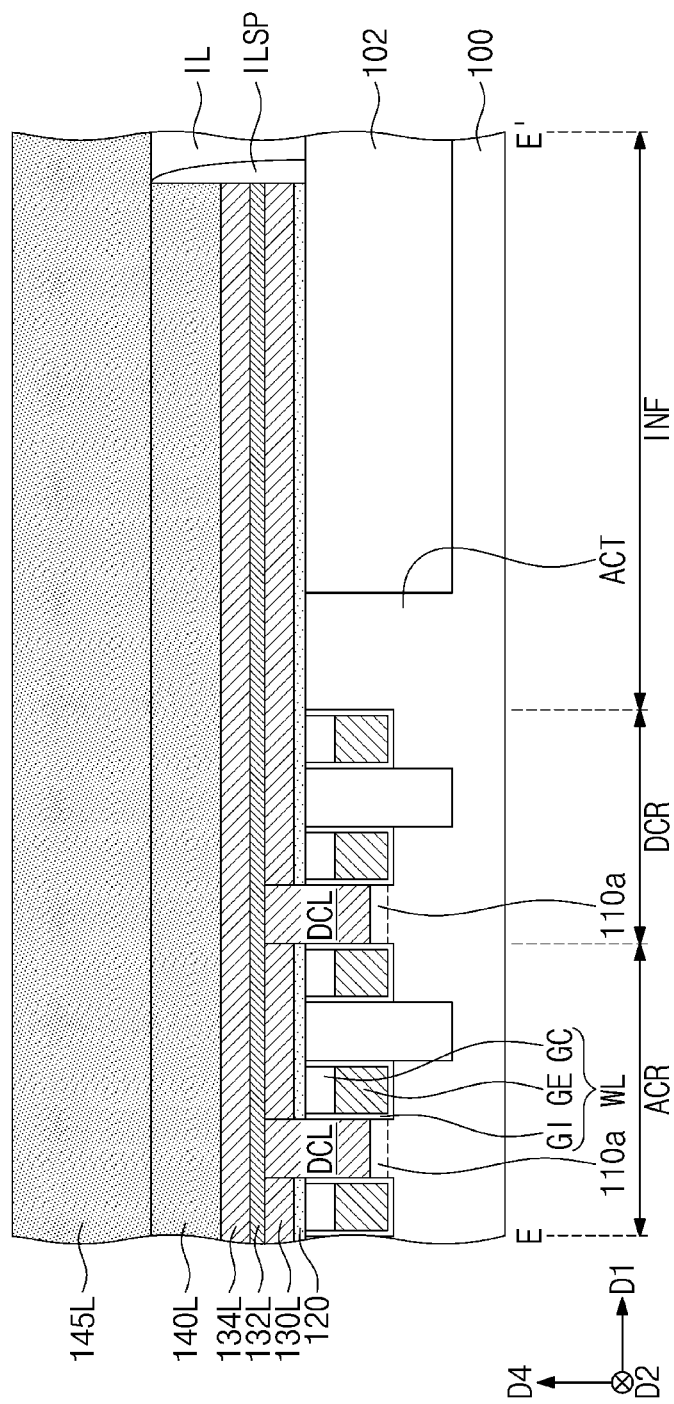
Figure 10:
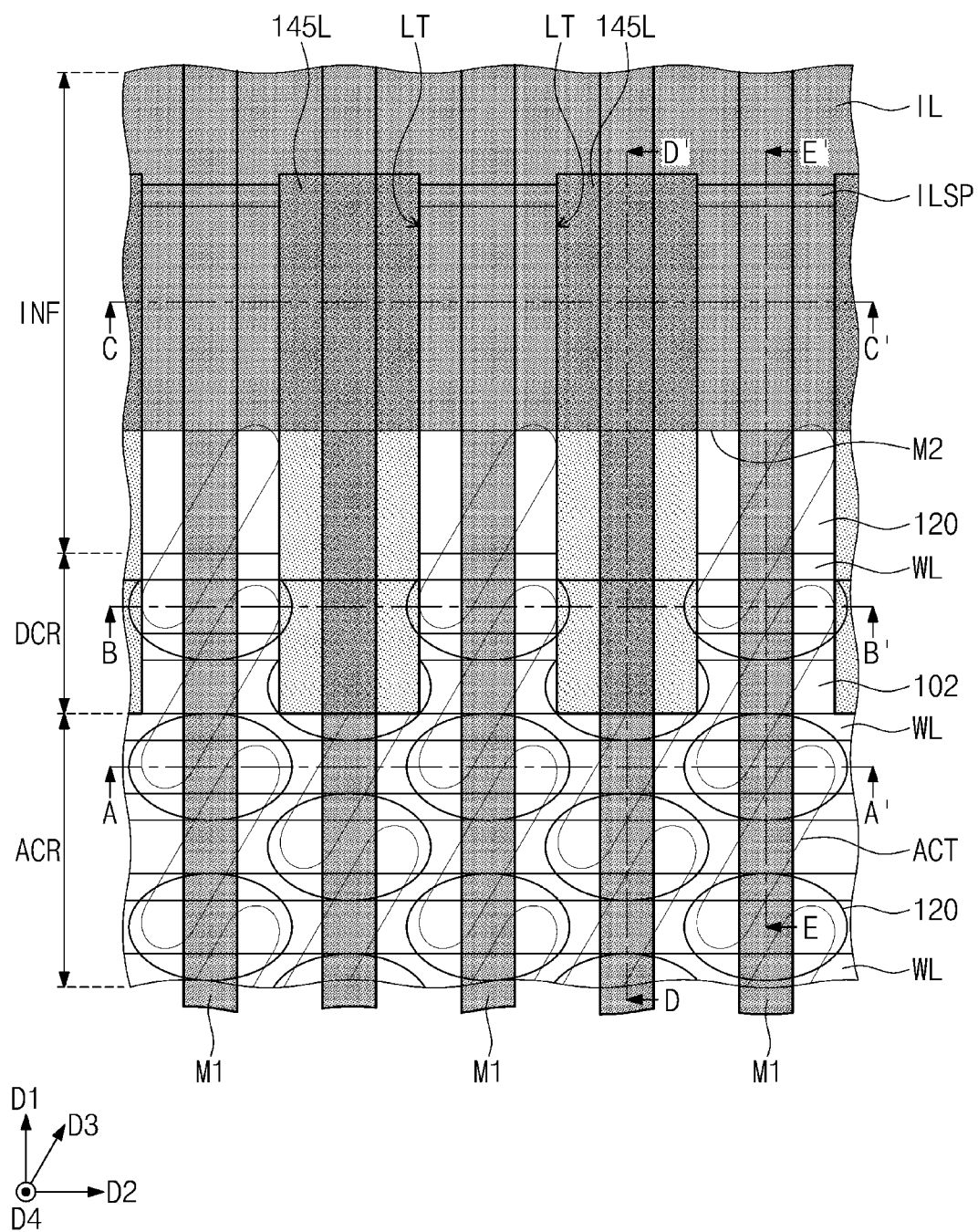
Figure 11A:
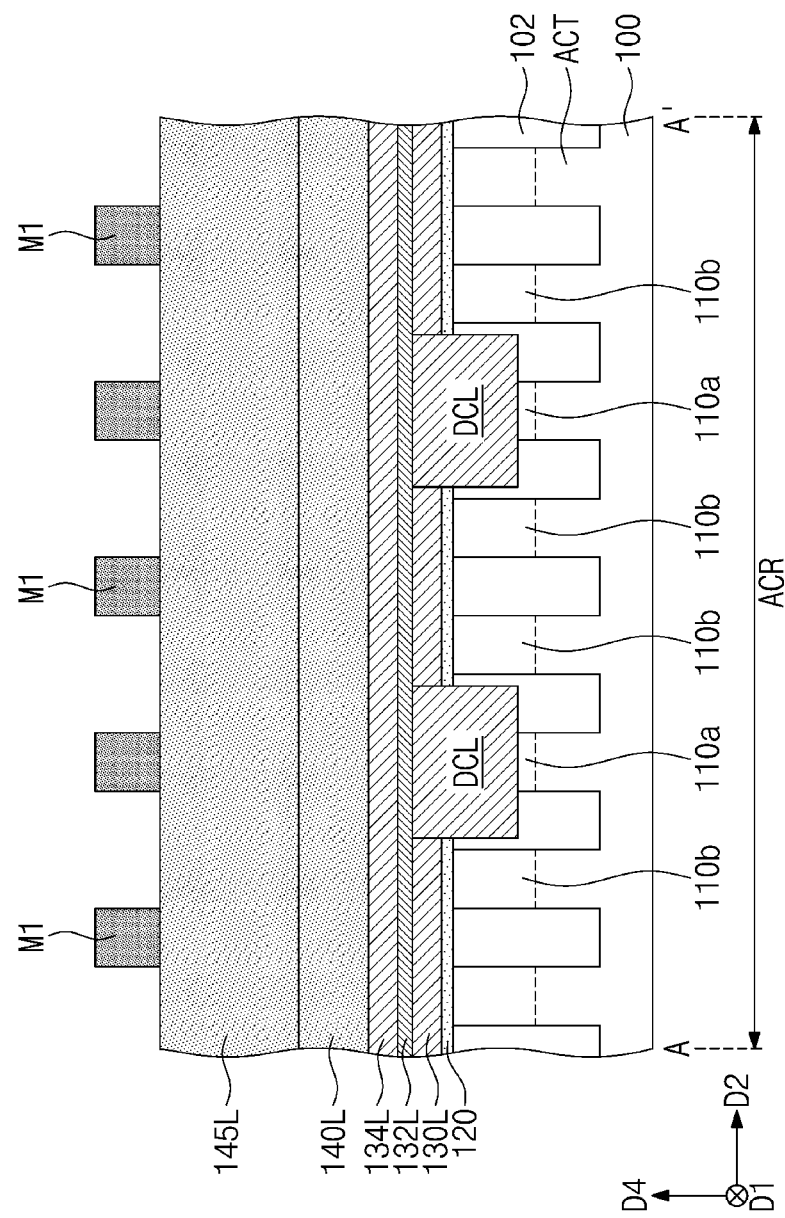
Figure 11B:
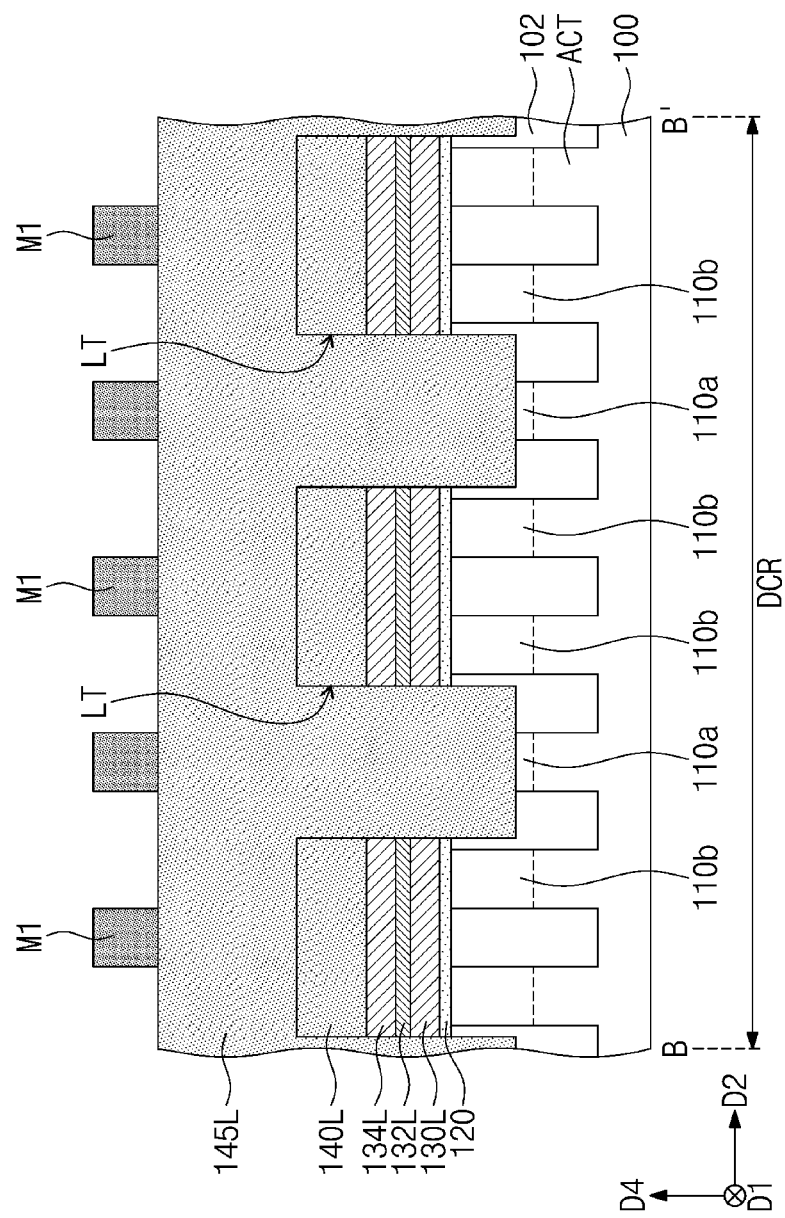
Figure 11C:
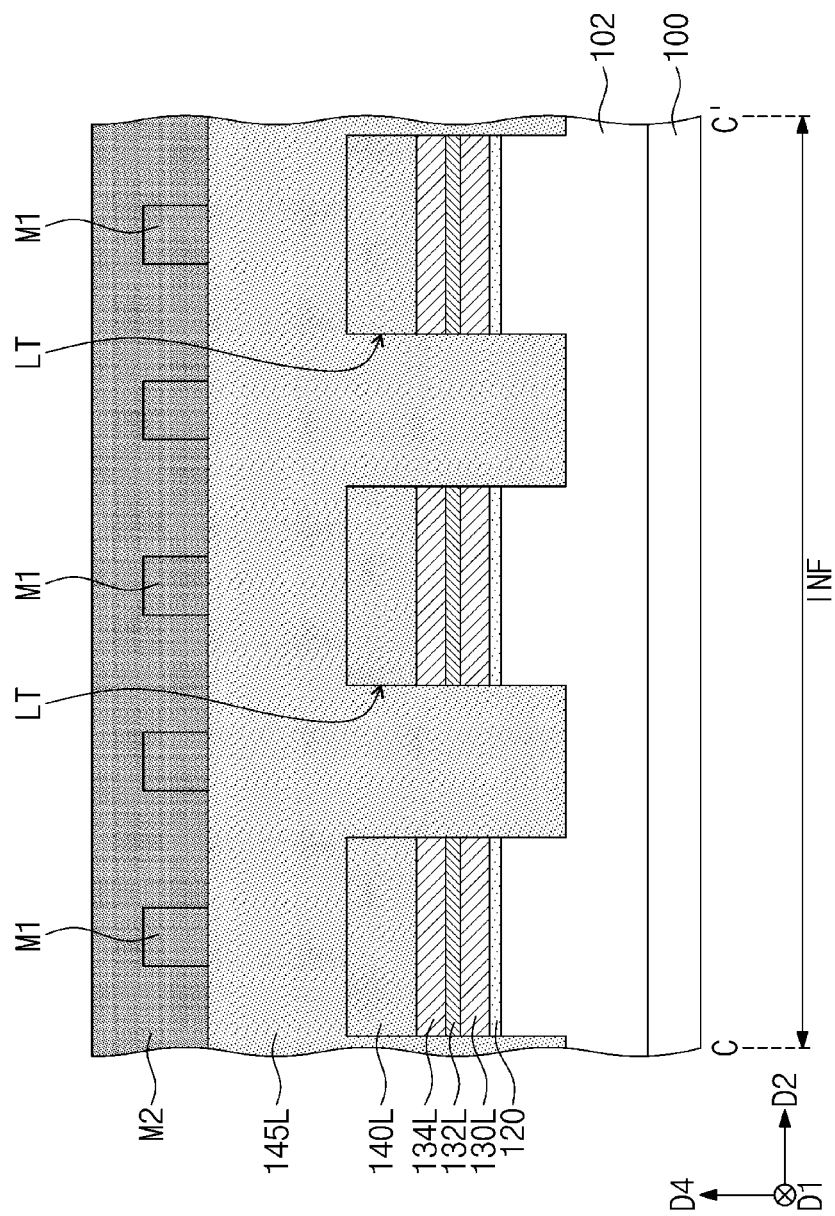
Figure 11D:
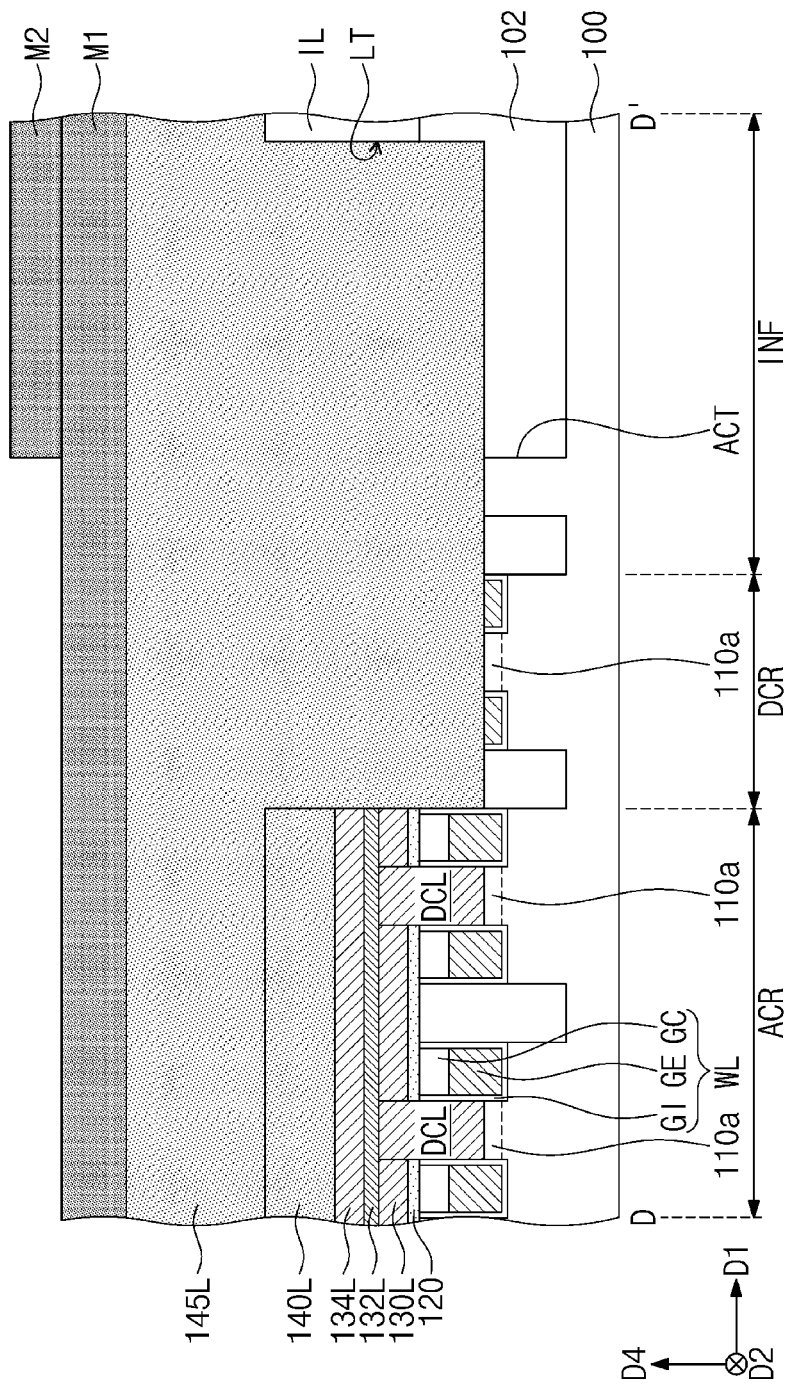
Figure 11E:
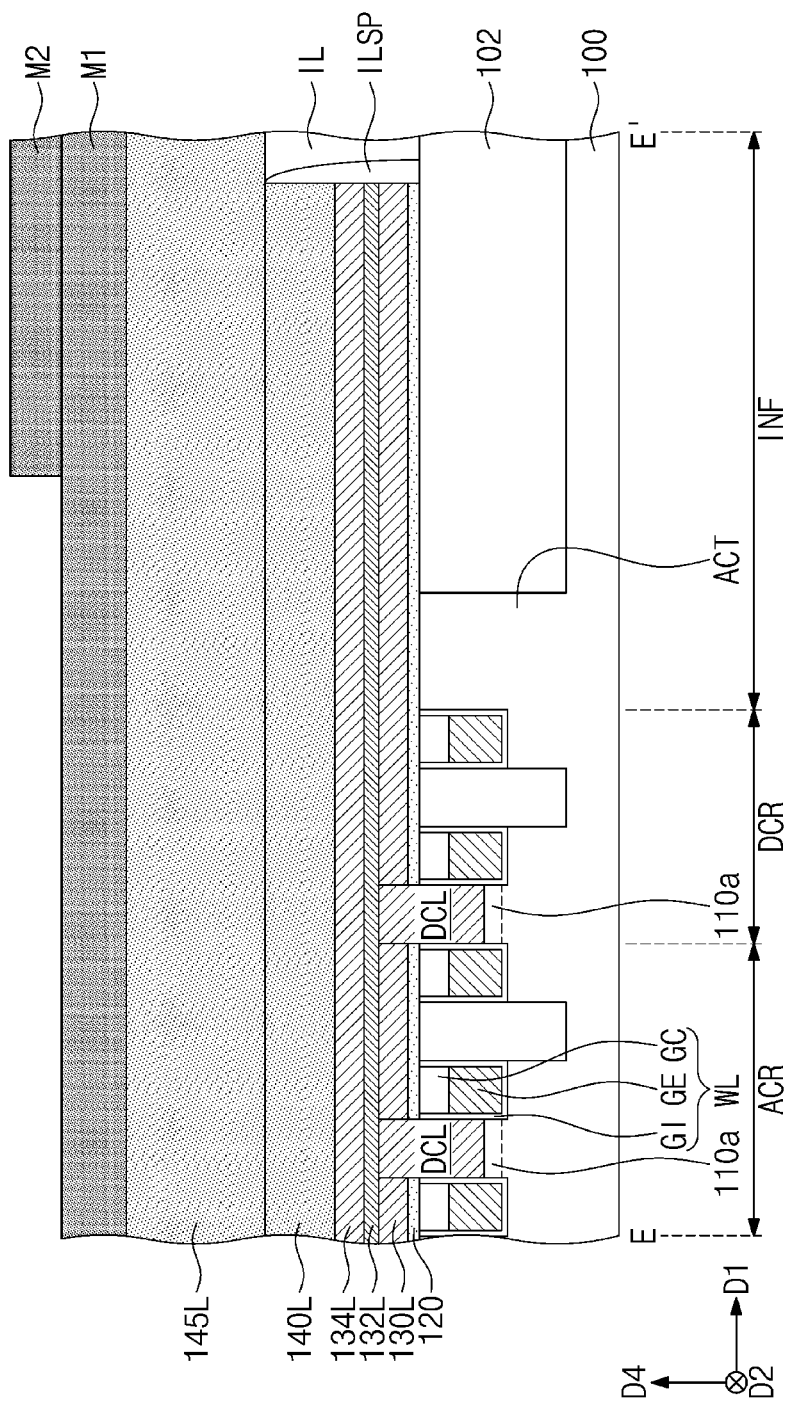
Figure 12:
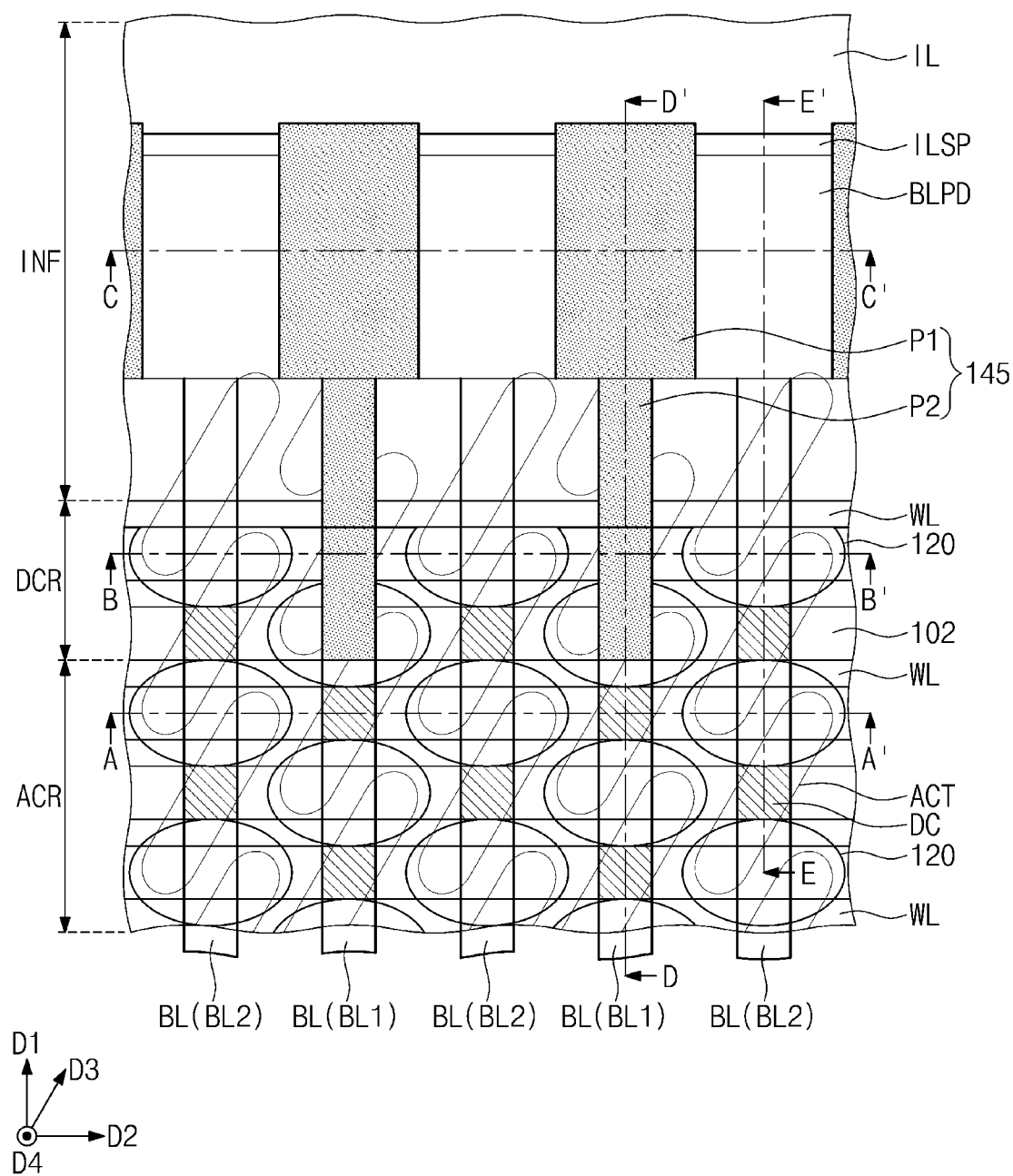
Figure 13A:
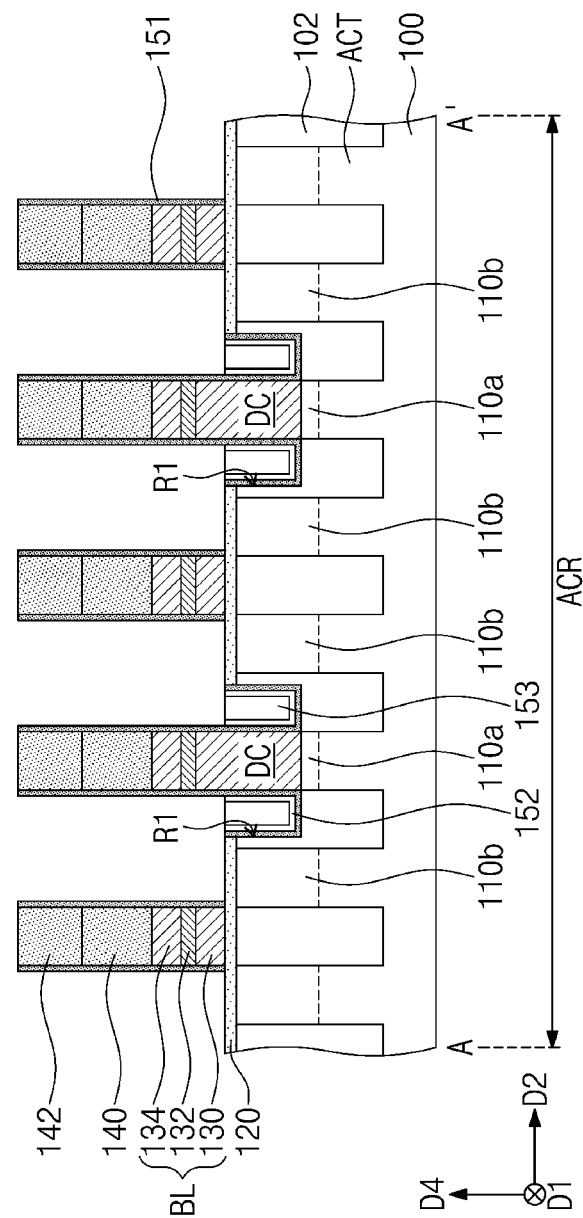
Figure 13B:
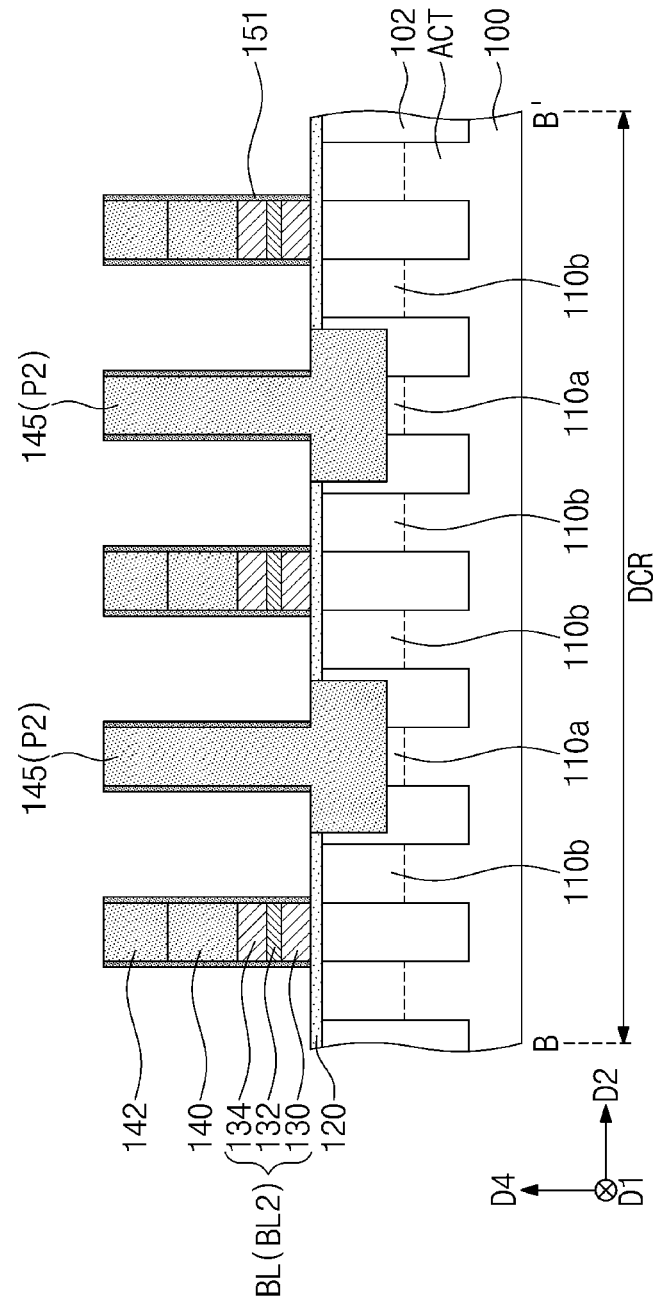
Figure 13C:
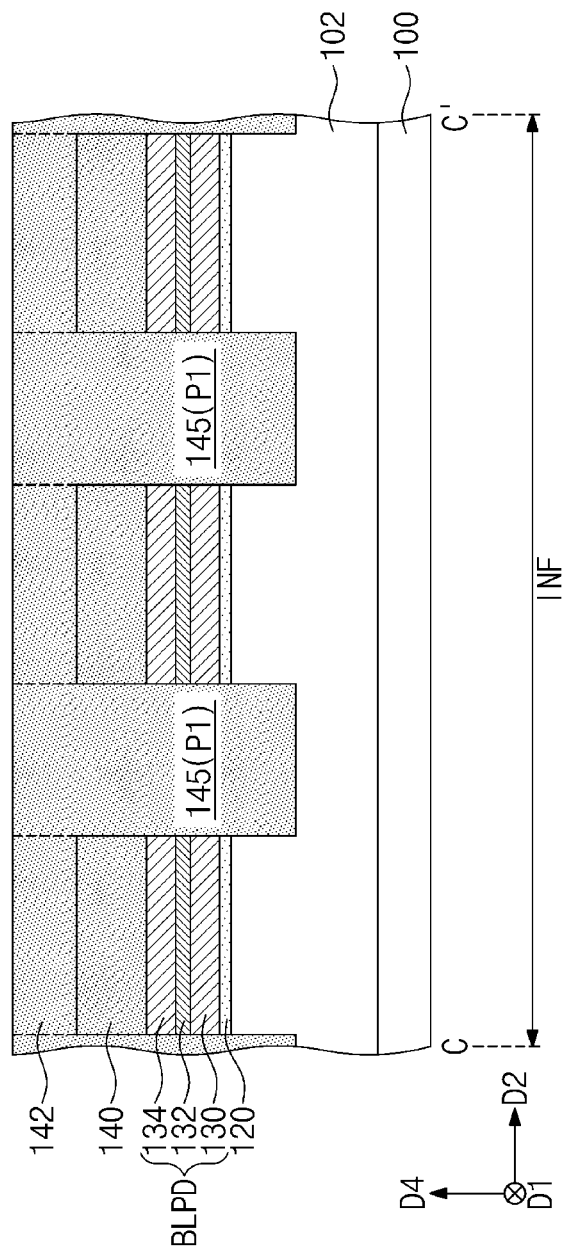
Figure 13D:
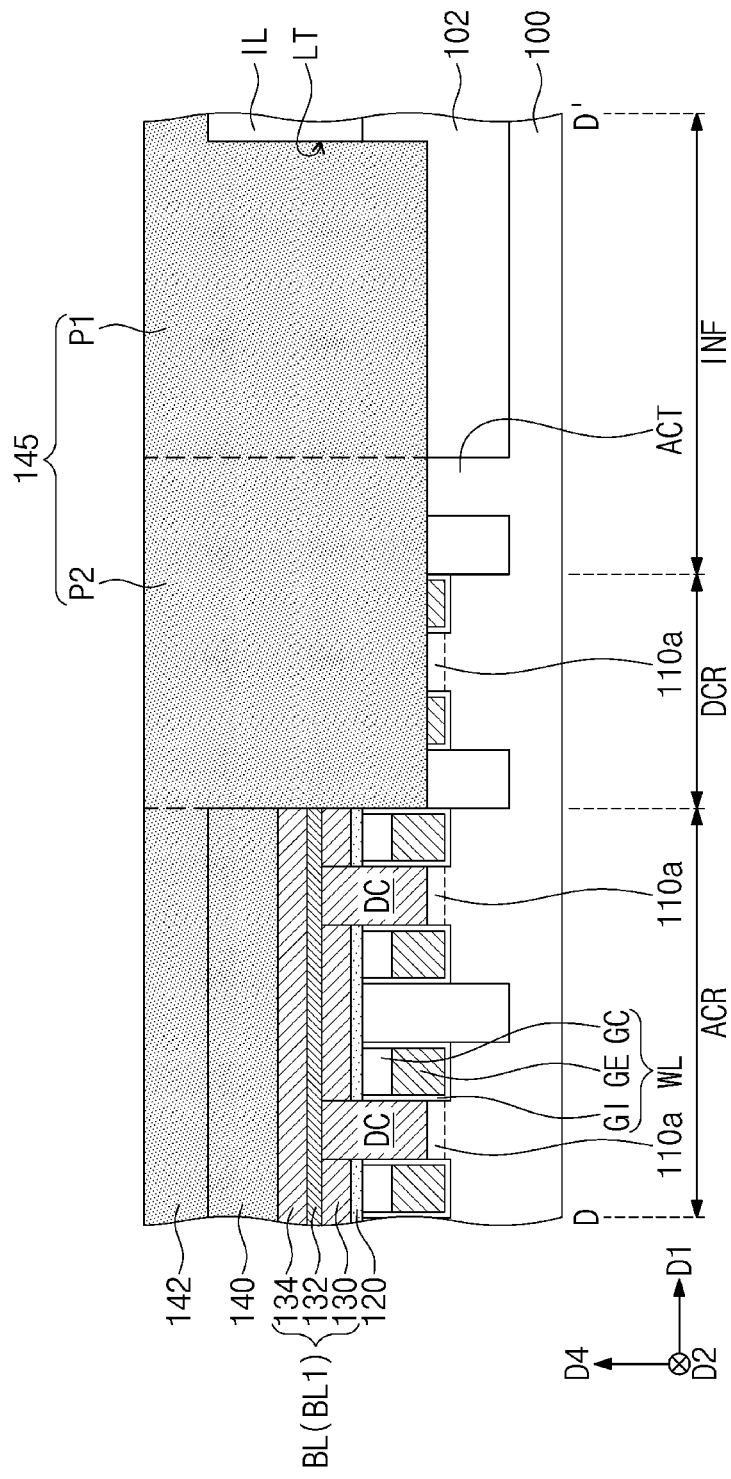
Figure 13E:
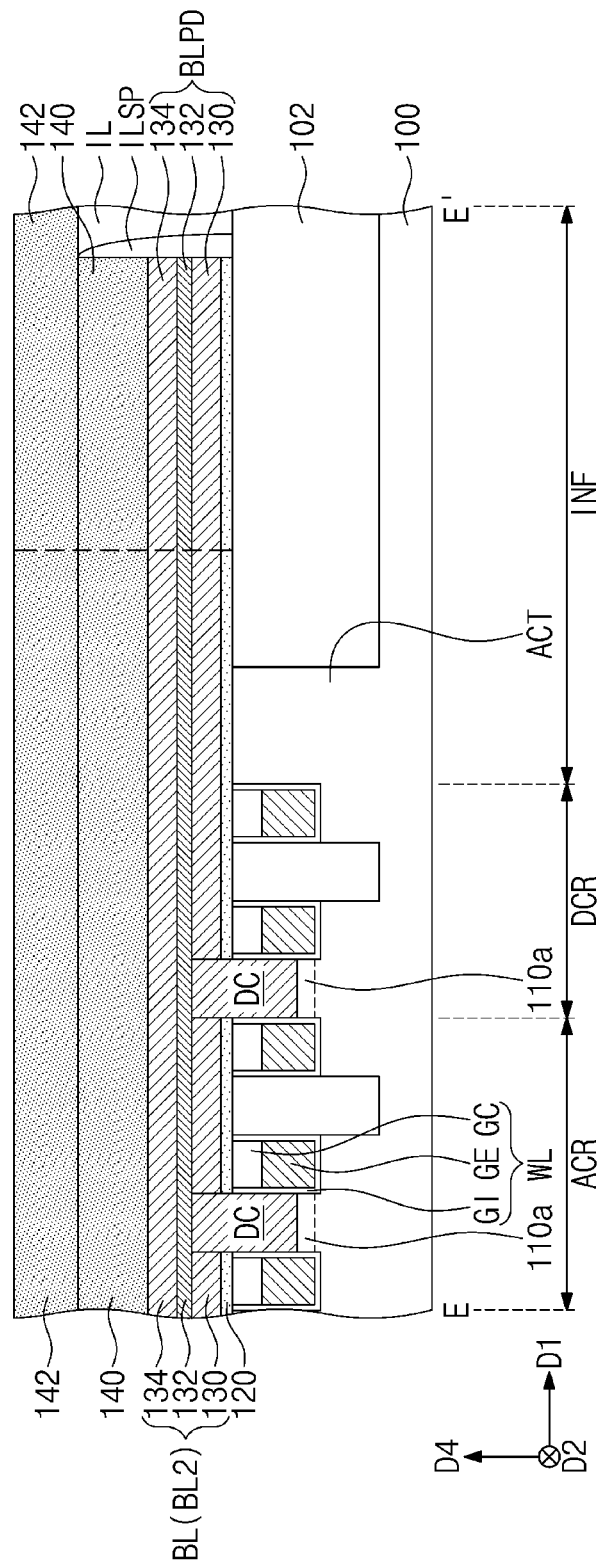
Figure 14:
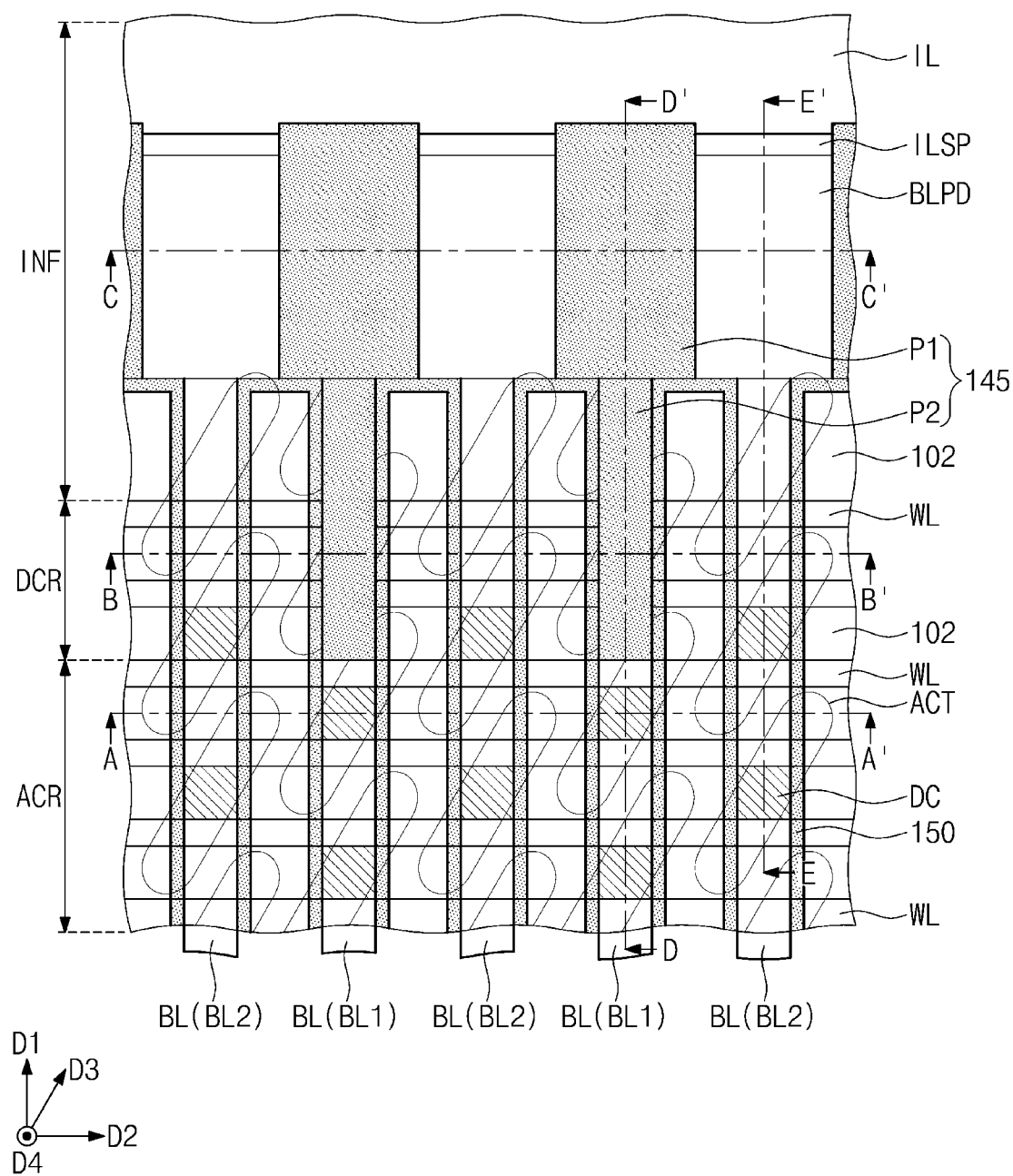
Figure 15A:
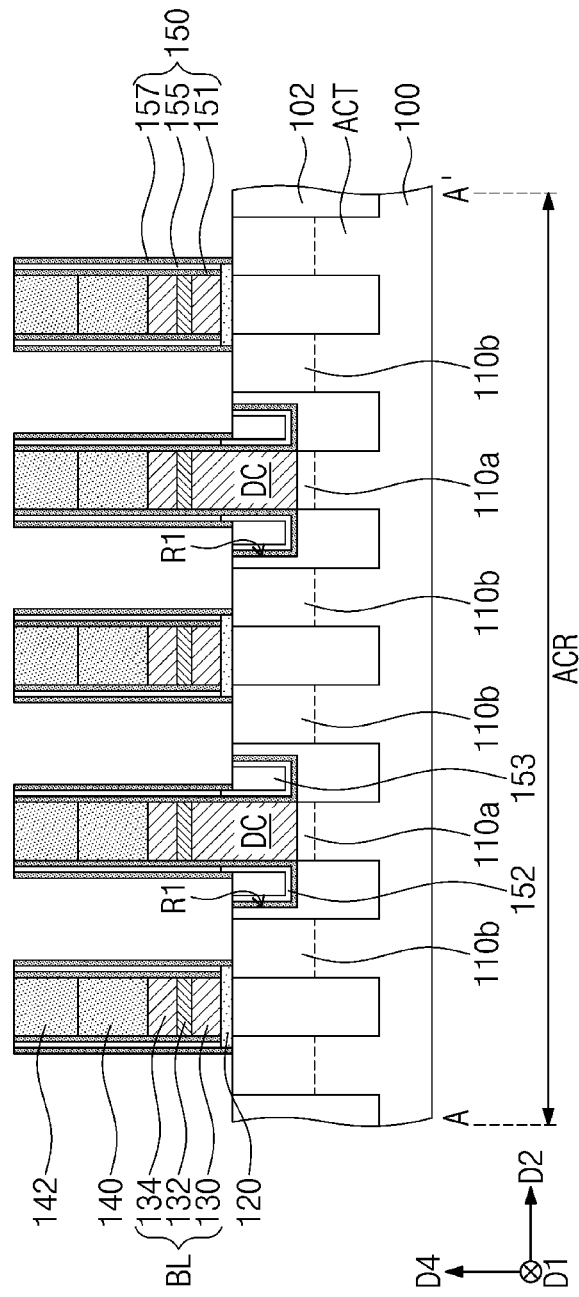
Figure 15B:
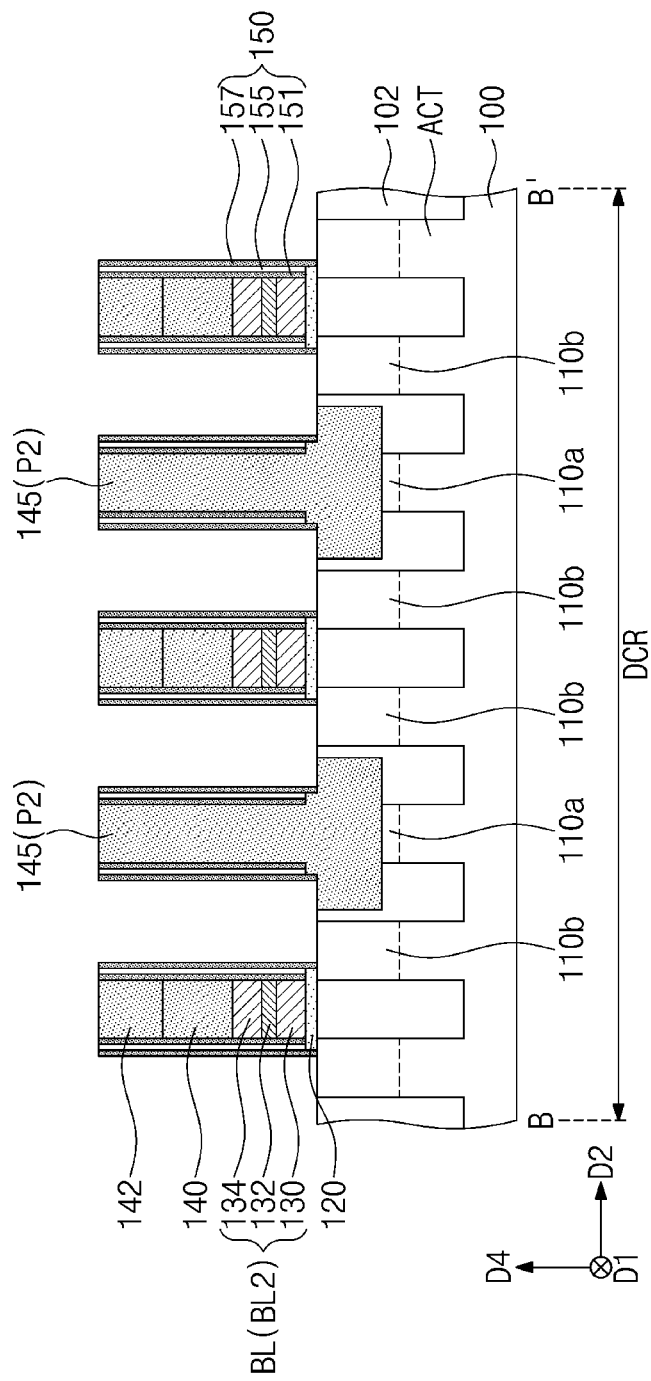
Figure 15C:
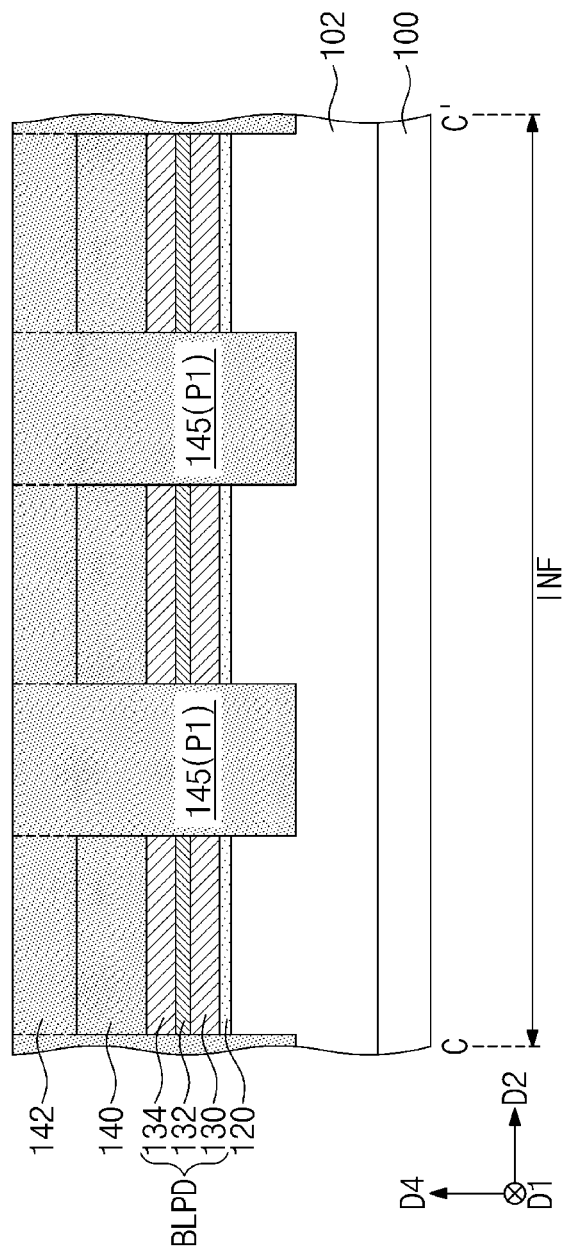
Figure 15D:
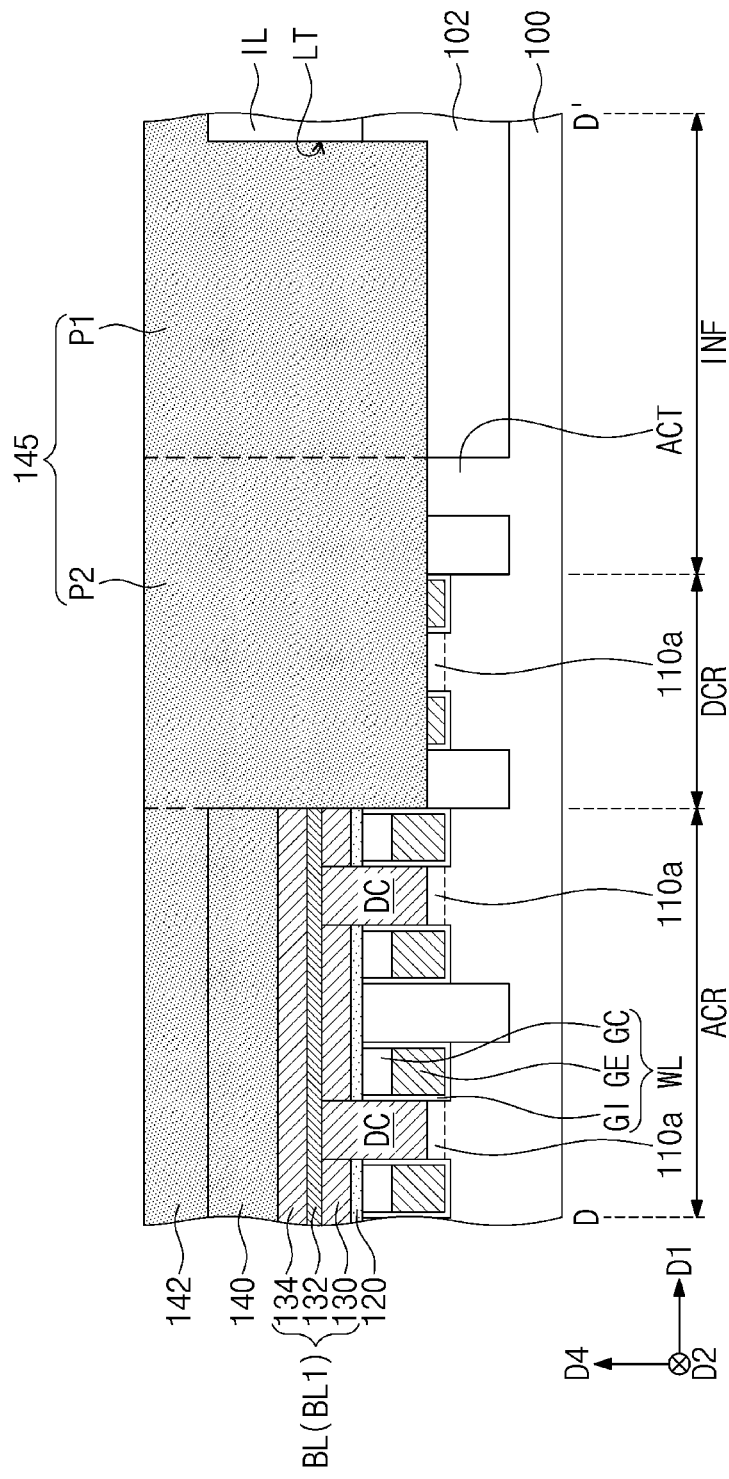
Figure 15E:
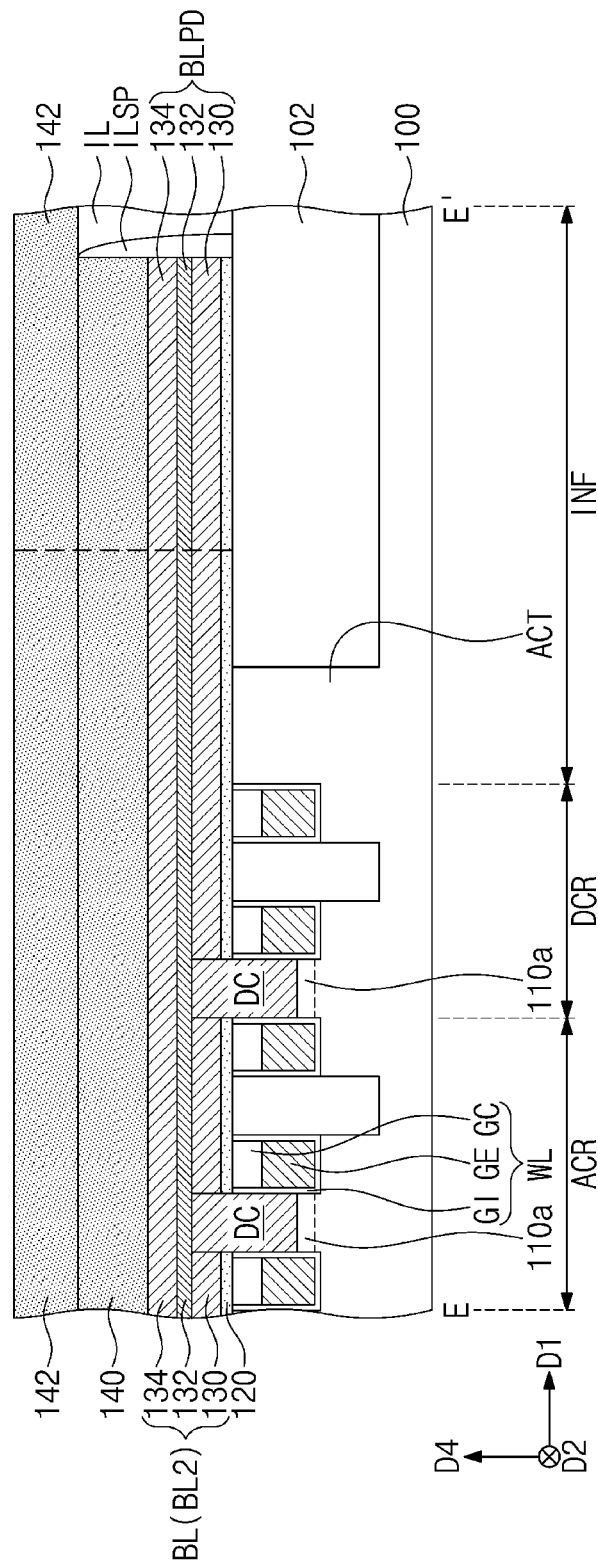
Figure 16:
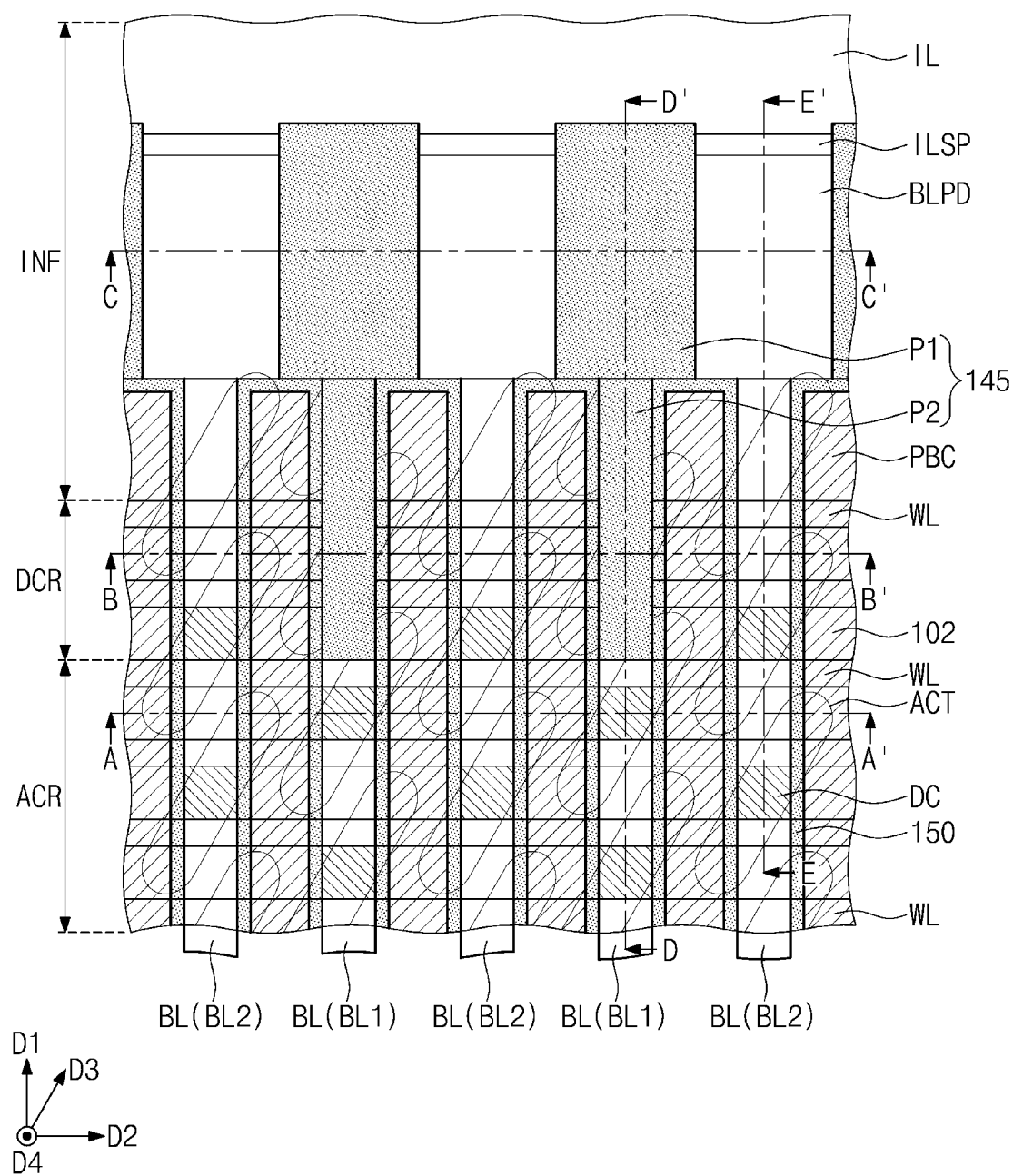
Figure 17A:
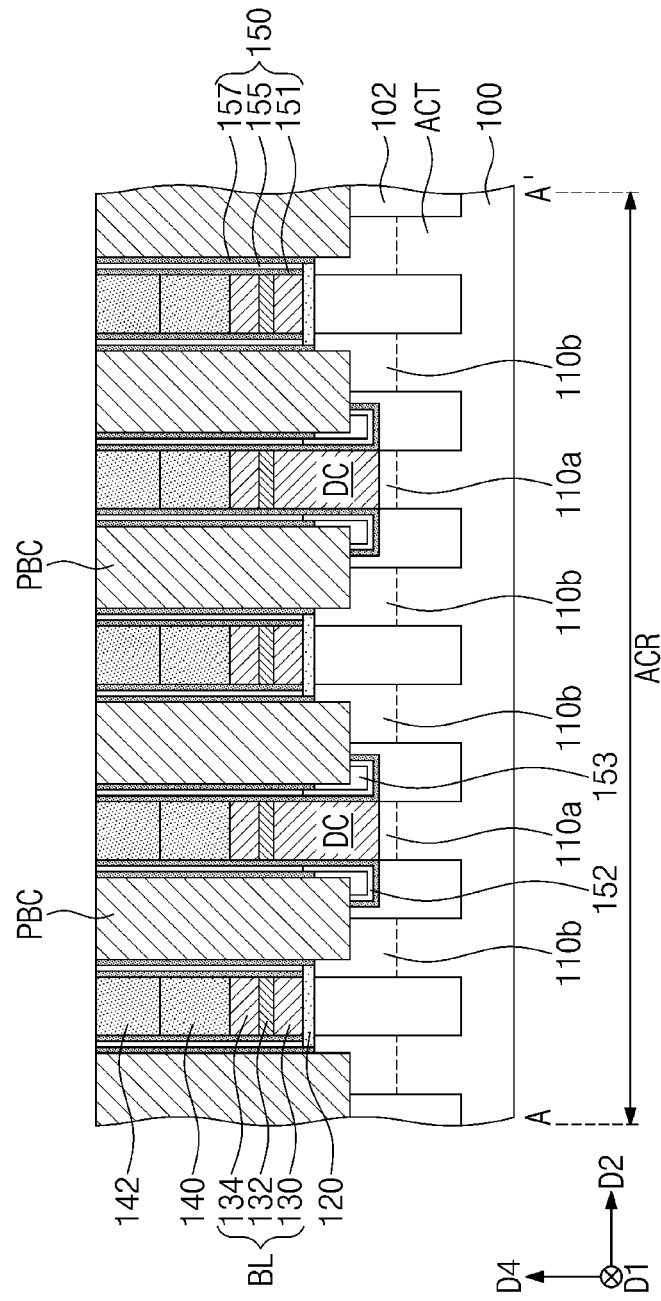
Figure 17B:
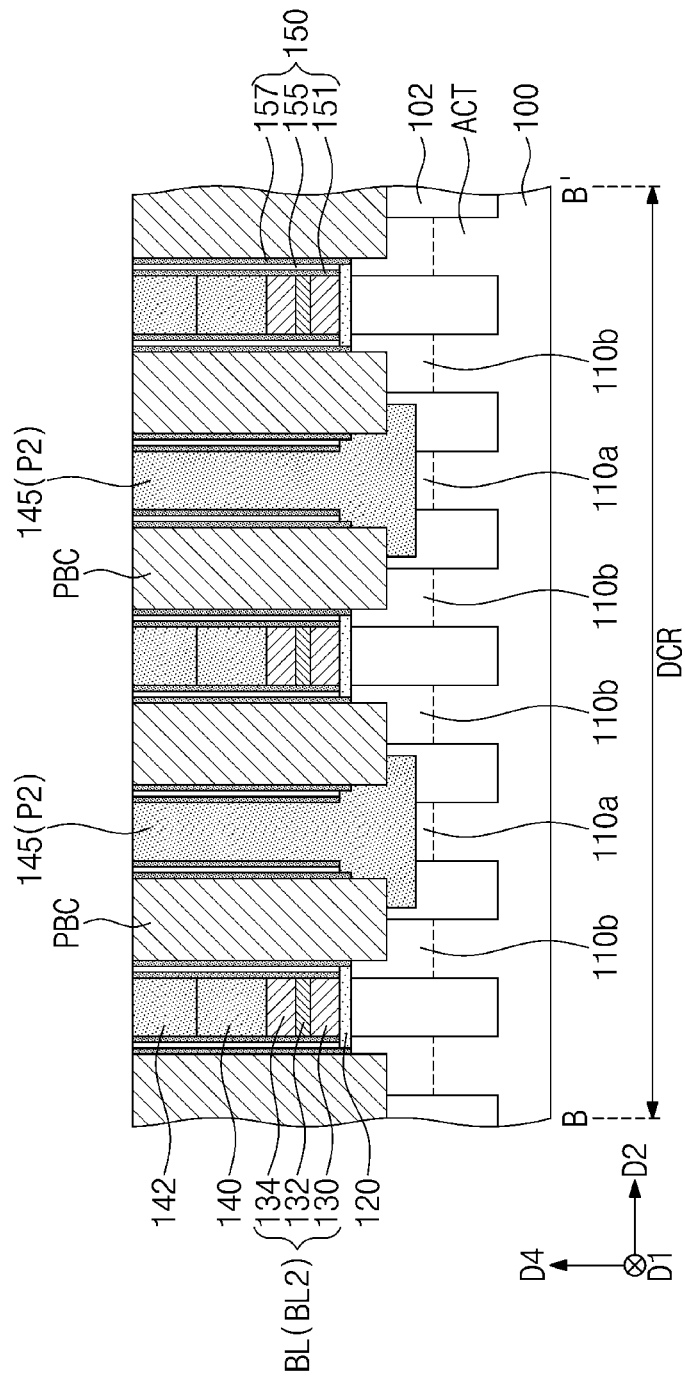
Figure 17C:
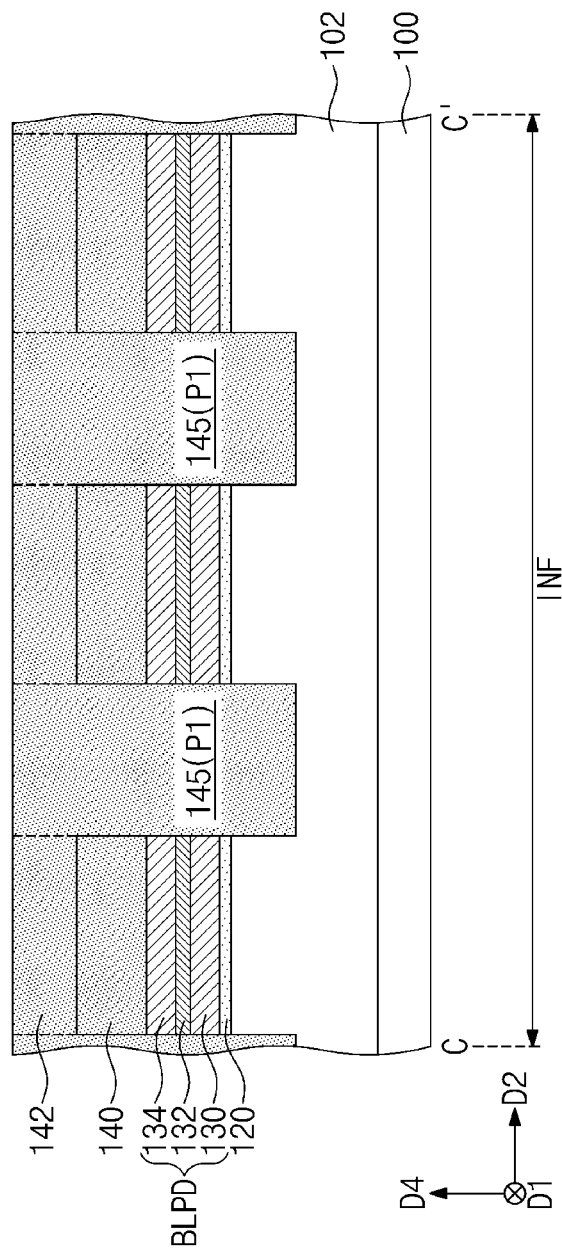
Figure 17D:
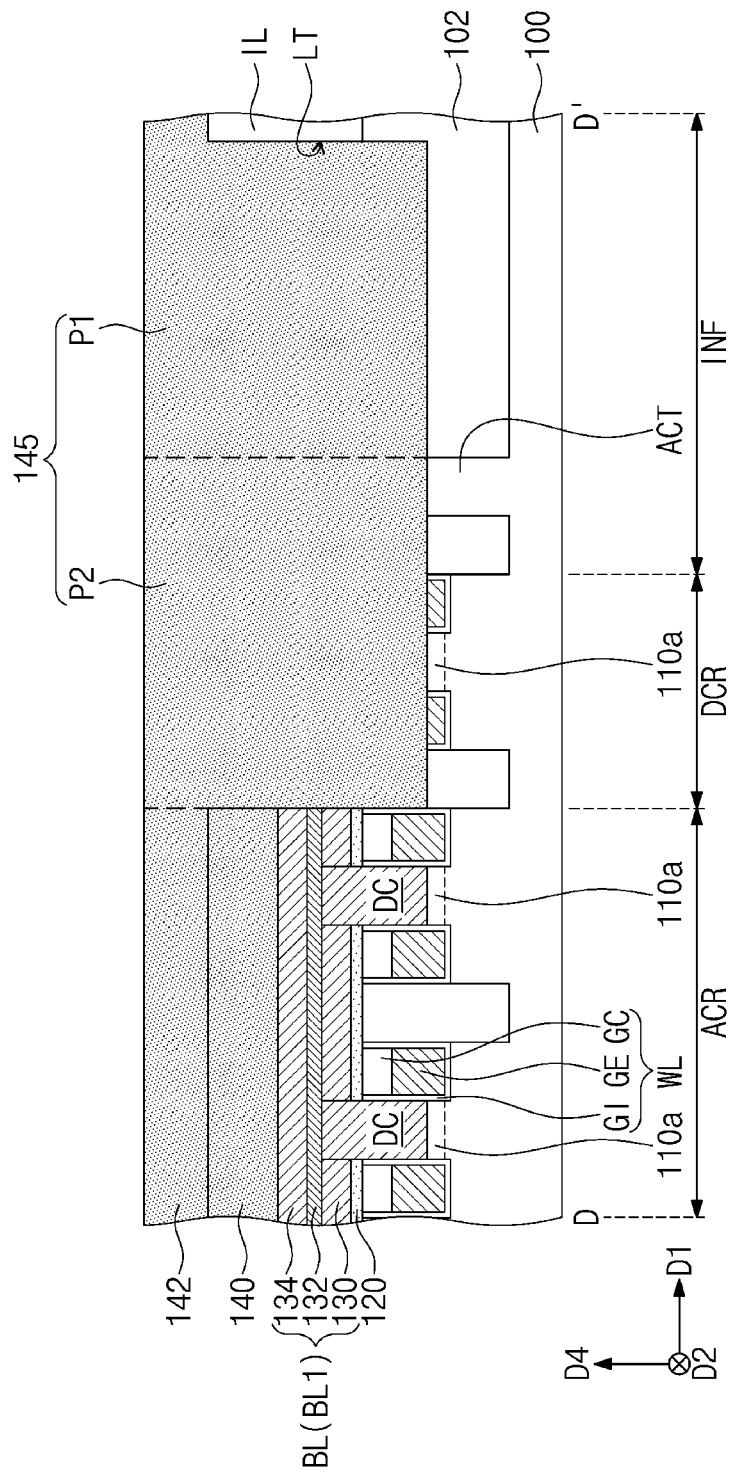
Figure 17E:
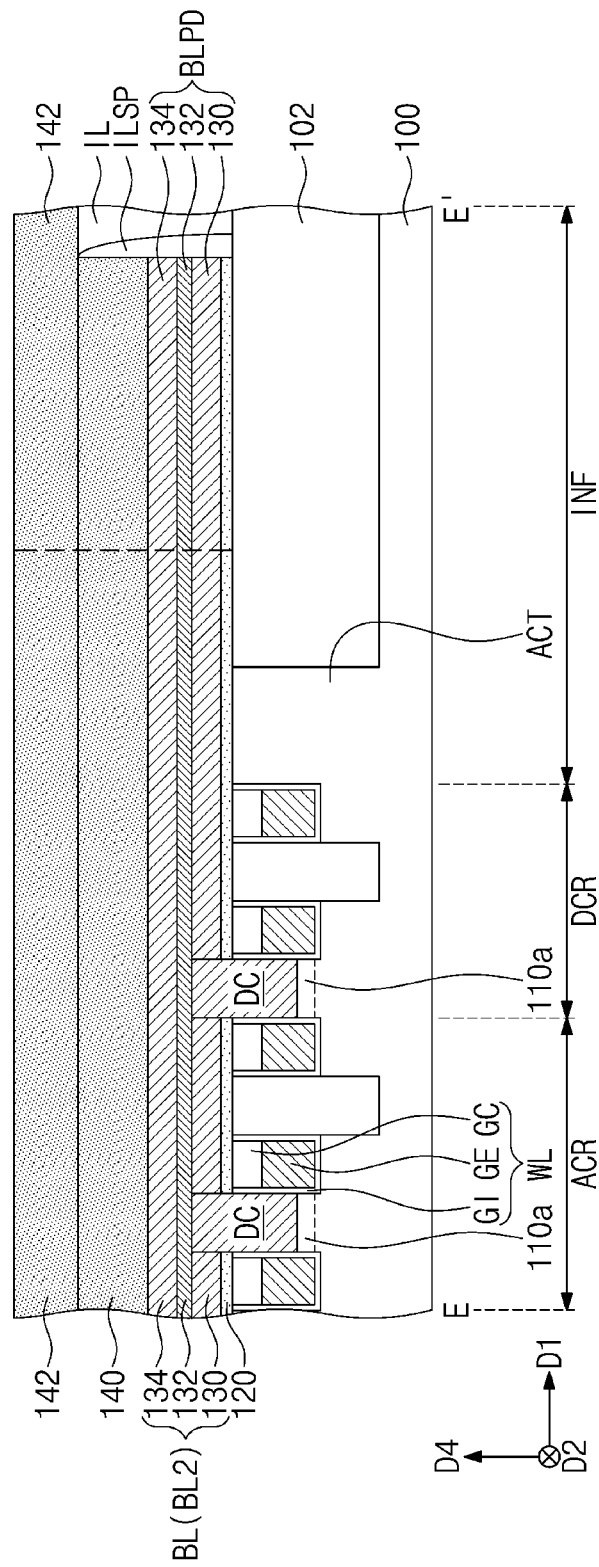
Figure 18:
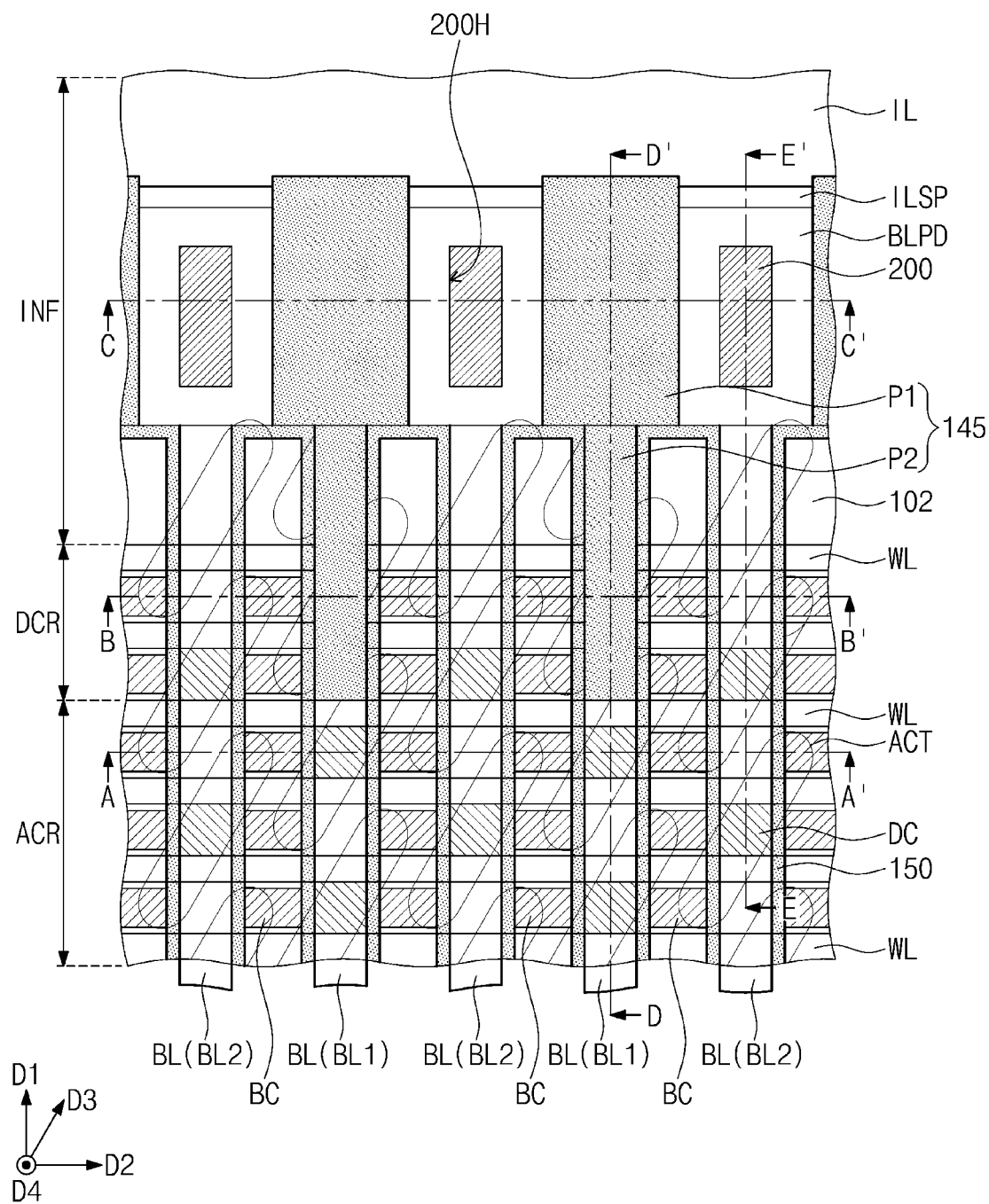
Figure 19A:
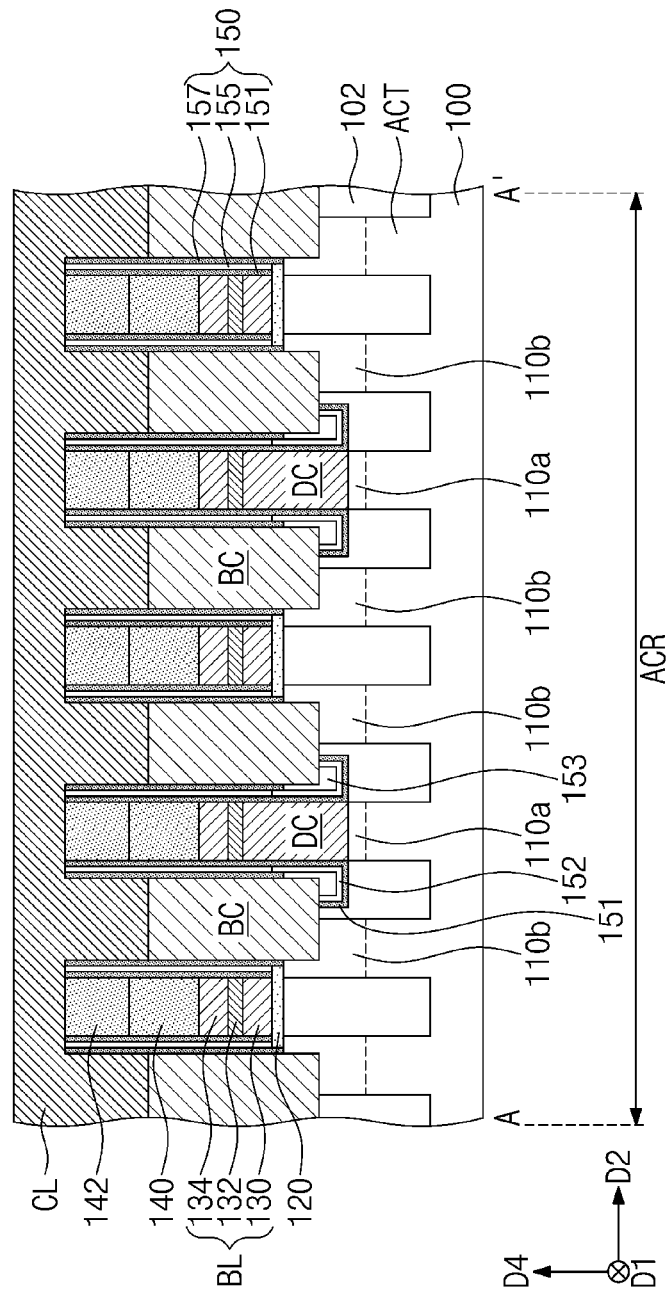
Figure 19B:
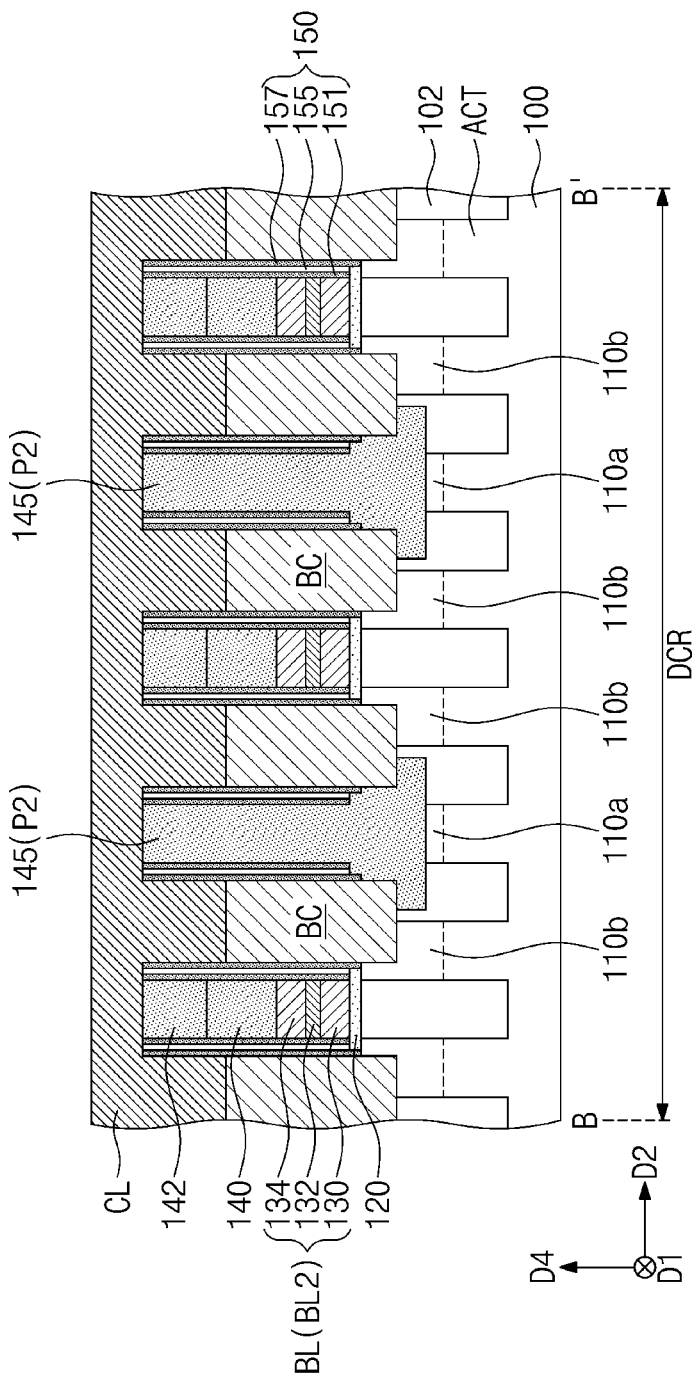
Figure 19C:
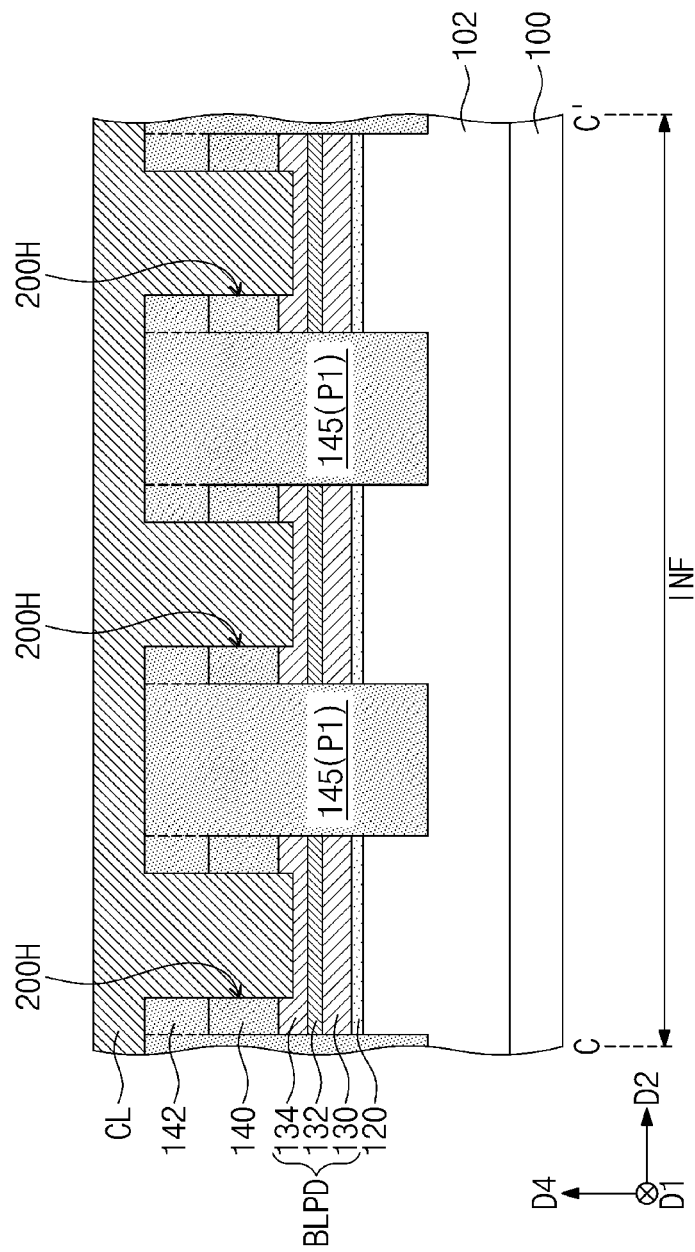
Figure 19D:
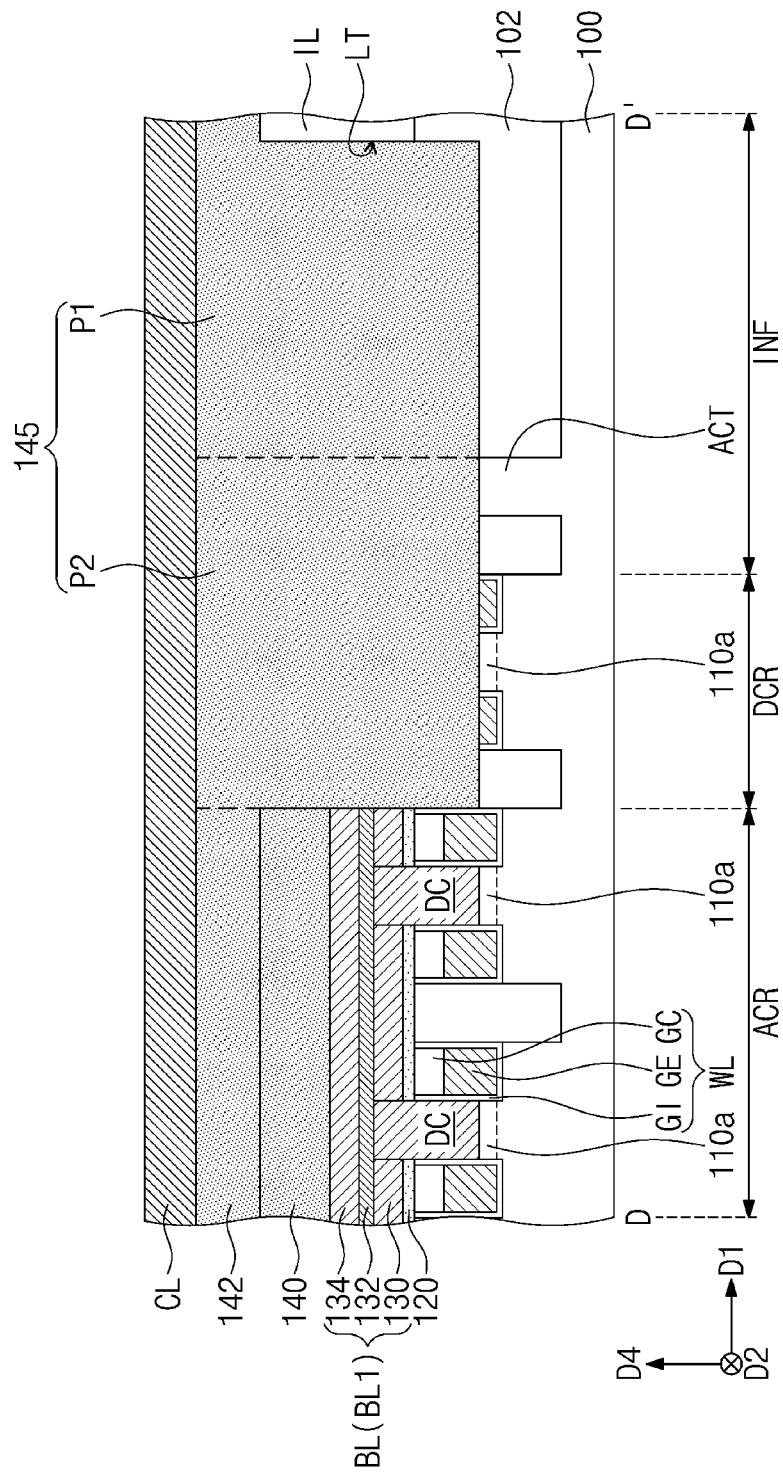
Figure 19E:
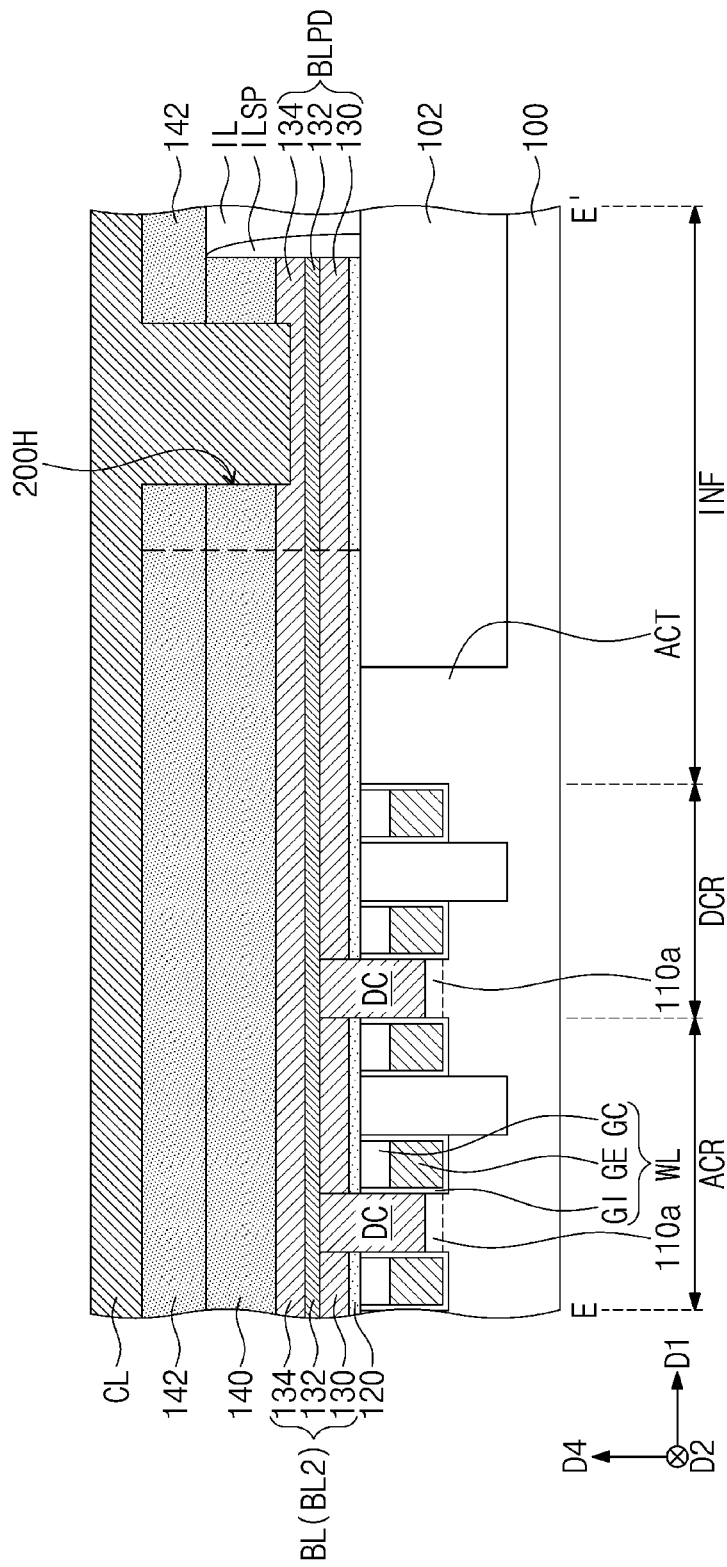

The peripheral blocks 2, 3, 4, and 5 may include a first peripheral block 2, a second peripheral block 3, a third peripheral block 4, and a fourth peripheral block 5, which are arranged to enclose each of the cell blocks 1. Each of the first to fourth peripheral blocks 2, 3, 4, and 5 may include a sense amplifier (S/A) circuit, a sub-word line driver (SWD) circuit, and power and ground driver circuits for driving the sense amplifier. In an embodiment, the first and third peripheral blocks 2 and 4, which are opposite to each other, may include the sense amplifier (S/A) circuits, and the second and fourth peripheral blocks 3 and 5, which are opposite to each other, may include the sub-word line driver (SWD) circuits. In an embodiment as shown in FIG. 2, the sense amplifier (S/A) circuits at the first peripheral block 2 may be electrically connected to second bit lines BL2 via bit line pads BLPD, and the sense amplifier (S/A) circuits at the third peripheral block 4 may be electrically connected to first bit lines BL1 via bit line pads (not shown in FIG. 2). The first bit lines BL1 and the second bit lines BL2 may have the same length, and may be alternately arranged and connected to the sense amplifier (S/A) circuits at the third peripheral block 4 and the sense amplifier (S/A) circuits at the first peripheral block 2, respectively. The second and fourth peripheral blocks 3 and 5 may further include the power and ground driver circuits for driving the sense amplifier, but the inventive concept is not limited to this example.

FIG. 2 is a plan view illustrating a semiconductor device according to an embodiment of the inventive concept and corresponding to a portion 'PP' of FIG. 1. FIGS. 3A, 3B, 3C, 3D, and 3E are sectional views, which are respectively taken along lines A-A', B-B', C-C', D-D', and E-E' of FIG. 2.

Referring to FIGS. 2 and 3A to 3E, a substrate 100 may be provided. The substrate 100 may be a semiconductor substrate (e.g., a silicon wafer, a germanium wafer, or a silicon-germanium wafer). The substrate 100 may include an active cell region ACR, in which each cell block 1 of FIG. 1 is provided, a peripheral region, in which each peripheral block 2, 3, 4, or 5 of FIG. 1 is provided, a boundary region INF between the active cell region ACR and the peripheral region, and a dummy cell region DCR between the active cell region ACR and the boundary region INF.

Active patterns ACT may be disposed on the active cell region ACR of the substrate 100. The active patterns ACT may be spaced apart from each other in a first direction D1 and a second direction D2, which are parallel to a bottom surface 100L of the substrate 100. The first and second directions D1 and D2 may not be parallel (or may cross) to each other. Each of the active patterns ACT may be a bar-shaped pattern extended in a third direction D3, which is parallel to the bottom surface 100L of the substrate 100 but is not parallel (or cross) to the first and second directions D1 and D2. Each of the active patterns ACT may be a protruding portion of the substrate 100, which is extended in a fourth direction D4 perpendicular to the bottom surface 100L of the substrate 100. The active patterns ACT may also be disposed on the dummy cell region DCR and the boundary region INF of the substrate 100.

A device isolation layer 102 may be disposed on the substrate 100 to define the active patterns ACT. For example, the device isolation layer 102 may define each of the active patterns ACT or may surround a side surface of each of the active patterns ACT. The device isolation layer 102 may be disposed on the active cell region ACR, the dummy cell region DCR, and the boundary region INF of the substrate 100 and may be interposed between the active patterns ACT. The device isolation layer 102 may be formed of or may include at least one of, for example, silicon oxide, silicon nitride, and/or silicon oxynitride.

Word lines WL may be disposed on the active cell region ACR of the substrate 100 to cross the active patterns ACT and the device isolation layer 102. The word lines WL may be spaced apart from each other in the first direction D1 and may be extended in the second direction D2. The word lines WL may also be disposed on the dummy cell region DCR of the substrate 100 to cross the active patterns ACT and the device isolation layer 102 on the dummy cell region DCR. In an embodiment, the word lines WL may be buried word lines, which are disposed in the active patterns ACT and the device isolation layer 102.

Each of the word lines WL may include a gate electrode GE penetrating upper portions of the active patterns ACT and the device isolation layer 102, a gate dielectric pattern GI interposed between the gate electrode GE and the active patterns ACT and between the gate electrode GE and the device isolation layer 102, and a gate capping pattern GC on a top surface of the gate electrode GE. A top surface of the gate capping pattern GC may be coplanar with top surfaces of the active patterns ACT. In an embodiment, the top surface of the gate capping pattern GC may be located at the same height as the top surfaces of the active patterns ACT.

The gate electrode GE may be formed of or may include a conductive material. In an embodiment, the conductive material may be one of doped semiconductor materials (e.g., doped silicon or doped germanium), conductive metal nitrides (e.g., titanium nitride or tantalum nitride), metallic materials (e.g., tungsten, titanium, or tantalum), and metal-semiconductor compounds (e.g., tungsten silicide, cobalt silicide, or titanium silicide). The gate dielectric pattern GI may be formed of or may include at least one of, for example, silicon oxide, silicon nitride, and/or silicon oxynitride. The gate capping pattern GC may be formed of or may include at least one of, for example, silicon oxide, silicon nitride, and silicon oxynitride. In an embodiment, the gate electrode GE may be formed of or may include titanium nitride (TiN), and the gate capping pattern GC may include a double layer, which is composed of a silicon layer, which is doped with n-type impurities, and a silicon oxide layer.

A first impurity injection region 110a and second impurity injection regions 110b may be provided in each of the active patterns ACT. The second impurity injection regions 110b may be spaced apart from each other with the first impurity injection region 110a interposed the second impurity injection regions 110b. The first impurity injection region 110a may be provided between a pair of the word lines WL, which are disposed to cross each of the active patterns ACT. The second impurity injection regions 110b may be spaced apart from each other with the pair of word lines WL interposed between the second impurity injection regions 110b. The first impurity injection region 110a may contain or may be doped with impurities that are of the same conductivity type as the second impurity injection regions 110b.

An insulating layer 120 may be disposed on the active cell region ACR, the dummy cell region DCR, and the boundary region INF of the substrate 100 to cover the active patterns ACT, the device isolation layer 102, and the word lines WL. The insulating layer 120 may be formed of or may include at least one of, for example, silicon oxide, silicon nitride, and silicon oxynitride and may have a single- or multi-layered structure.

Bit lines BL may be disposed on the active cell region ACR of the substrate 100 and on the insulating layer 120. The bit lines BL may cross the word lines WL. The bit lines BL may be extended in the first direction D1 and may be spaced apart from each other in the second direction D2. The bit lines BL may include first bit lines BL1 and second bit lines BL2, which are alternately arranged in the second direction D2. In an embodiment, the first bit lines BL1 may be disposed on the active cell region ACR of the substrate 100. The second bit lines BL2 may be disposed on the active cell region ACR and may be extended in the first direction D1 or to the dummy cell region DCR and the boundary region INF.

Bit line pads BLPD may be disposed on the boundary region INF and may be spaced apart from each other in the second direction D2. The second bit lines BL2 may be connected to the bit line pads BLPD, respectively. Each of the bit lines BL may have a first width W1 in the second direction D2, and each of the bit line pads BLPD may have a second width W2 in the second direction D2. The second width W2 may be larger than the first width W1. At the region between the cell block 1 and the third peripheral block 4, the first bit lines BL1 may be connected to bit line pads, not shown in FIG. 2, which are disposed on an interface region adjacent to the peripheral block 4.

Each of the bit lines BL may include a polysilicon pattern 130, an ohmic pattern 132, and a metal-containing pattern 134, which are sequentially stacked on the insulating layer 120. The polysilicon pattern 130, the ohmic pattern 132, and the metal-containing pattern 134 of each of the first bit lines BL1 may be sequentially stacked on the insulating layer 120 of the active cell region ACR and may be extended in the first direction D1. The polysilicon pattern 130, the ohmic pattern 132, and the metal-containing pattern 134 of each of the second bit lines BL2 may be sequentially stacked on the insulating layer 120 of the active cell region ACR, the dummy cell region DCR, and the boundary region INF and may be extended in the first direction D1. Each of the bit line pads BLPD may include the polysilicon pattern 130, the ohmic pattern 132, and the metal-containing pattern 134, which are sequentially stacked on the insulating layer 120 of the boundary region INF. The polysilicon pattern 130 may be formed of or include doped or undoped polysilicon. The ohmic pattern 132 may be formed of or include at least one of metal silicide materials. The metal-containing pattern 134 may be formed of or include at least one of metallic materials (e.g., tungsten, titanium, and tantalum) or conductive metal nitrides (e.g., titanium nitride, tantalum nitride, tungsten nitride). In an embodiment, the first bit lines BL1 may be disposed on the active cell region ACR, a dummy cell region, and an interface region. For example, the dummy cell region and the interface region may be disposed between the active cell region ACR and the first peripheral block 2 and between the active cell region ACR and the third peripheral block 4. The first and third peripheral blocks 2 and 4 may be adjacent to opposite sides of the active cell region ACR. First end portions of the first bit lines BL1 that are adjacent to first peripheral block 2 may be disposed only on the active cell region ACR (as shown in FIG. 2), and second end portions, opposite to the first end portions, of the first bit lines BL1 may be connected to bit line pads that are adjacent to the third peripheral block 4. The second bit lines BL2 may be disposed on the active cell region ACR, the dummy cell region, and the interface region. First end portions of the second bit lines BL2 that are adjacent to the first peripheral block 2 may be disposed on the interface region INF to be connected to the bit line pads BLPD as shown in FIG. 2, and second end portions, opposite to the first end portions, of the second bit lines BL2 may be disposed on the active cell region ACR without extending into the dummy cell region and the interface region between the active cell region ACR and the third peripheral block 4. For the simplicity of drawings, FIG. 2 shows the portion PP of FIG. 1 which is a region between the cell block 1 and the first peripheral block 2. At a region between the cell block 1 and the third peripheral block 4 which is not shown in FIG. 2, end portions of the first bit lines BL1 may be disposed on the interface region adjacent to the third peripheral block 4, and end portions of the second bit lines BL2 may be disposed on the active cell region ACR without extending into the dummy cell region and the interface region that are adjacent to the third peripheral block 4.

A lower capping pattern 140 and an upper capping pattern 142 may be sequentially stacked on each of the bit lines BL. The lower capping pattern 140 may be disposed between each of the bit lines BL and the upper capping pattern 142. The lower and upper capping patterns 140 and 142 on each of the first bit lines BL1 may be provided on the active cell region ACR to extend in the first direction D1 or along a top surface of each of the first bit lines BL1. The lower and upper capping patterns 140 and 142 on each of the second bit lines BL2 may be provided on the active cell region ACR, the dummy cell region DCR, and the boundary region INF to extend in the first direction D1 or along a top surface of each of the second bit lines BL2. On the boundary region INF, the lower and upper capping patterns 140 and 142 on each of the second bit lines BL2 may be extended to a region on each of the bit line pads BLPD. The lower capping pattern 140 may be formed of or may include at least one of nitride materials (e.g., silicon nitride) and/or oxynitride materials (e.g., silicon oxynitride), and the upper capping pattern 142 may be formed of or may include at least one of nitride materials (e.g., silicon nitride).

An insulating separation pattern 145 may be disposed on the boundary region INF and between the bit line pads BLPD. In an embodiment, a portion of the insulating separation pattern 145 may be extended into a region between the second bit lines BL2 on the boundary region INF and the dummy cell region DCR. The insulating separation pattern 145 may include a first portion P1, which is disposed on the boundary region INF and between the bit line pads BLPD, and a second portion P2, which is disposed on the dummy cell region DCR and the boundary region INF and between the second bit lines BL2.

The second portion P2 of the insulating separation pattern 145 may be spaced apart from the second bit lines BL2 on the dummy cell region DCR and the boundary region INF and may be extended in the first direction D1, between the second bit lines BL2 on the dummy cell region DCR and the boundary region INF. The second portion P2 of the insulating separation pattern 145 may cover an end portion of a corresponding first bit line of the first bit lines BL1 (e.g., a side surface of the end portion). The second portion P2 of the insulating separation pattern 145 may be in contact with the end portion of the corresponding first bit line BL1 (e.g., the side surface of the end portion). An end portion of the second portion P2 of the insulating separation pattern 145 may be in contact with the end portion of the corresponding first bit line BL1. The end portion of the second portion P2 of the insulating separation pattern 145 may be in contact with the polysilicon pattern 130, the ohmic pattern 132, and the metal-containing pattern 134 of the corresponding first bit line BL1. In an embodiment, the corresponding first bit line BL1 may be disposed between two adjacent bit lines BL2 on the active cell region ACR without extending into the dummy cell region DCR. Each of the second portion P2 of the insulating separation pattern 145 and the corresponding first bit line BL1 may extend along a straight line extending in the first direction D1, and may contact each other at a boundary between the active cell region ACR and the dummy cell region DCR.

A side surface of the second portion P2 of the insulating separation pattern 145 may be aligned to a side surface of the corresponding first bit line BL1, in the first direction D1. Between the bit line pads BLPD on the boundary region INF, the first portion P1 of the insulating separation pattern 145 may be extended in the first direction D1 and may be in contact with side surfaces of the bit line pads BLPD.

The first portion P1 of the insulating separation pattern 145 may have a third width W3 in the second direction D2, and the second portion P2 of the insulating separation pattern 145 may have a fourth width W4 in the second direction D2. The third width W3 may be larger than the fourth width W4. The fourth width W4 may be substantially equal to the first width W1 of each of the bit lines BL. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

The first portion P1 of the insulating separation pattern 145 may be extended into a region between the lower capping patterns 140 on the bit line pads BLPD and between the upper capping patterns 142 on the bit line pads BLPD. The first portion P1 of the insulating separation pattern 145 and the upper capping patterns 142 may be in contact with each other without any interface therebetween or may constitute a single object. In an embodiment, the first portion P1 of the insulating separation pattern 145 and the upper capping pattern 142 may be formed of the same material as each other. In an embodiment, the first portion P1 of the insulating separation pattern 145 and the upper capping pattern 142 may be integrally formed as a single object. The second portion P2 of the insulating separation pattern 145 may be extended into a region between the lower capping patterns 140 on the second bit lines BL2 and between the upper capping patterns 142 on the second bit lines BL2. The second portion P2 of the insulating separation pattern 145 may be spaced apart from the lower and upper capping patterns 140 and 142 on the second bit lines BL2.

The insulating separation pattern 145 may be formed of or may include the same material (e.g., silicon nitride) as the upper capping patterns 142. The insulating separation pattern 145 may penetrate the insulating layer 120 on the dummy cell region DCR and the boundary region INF and may be extended into the substrate 100 and the device isolation layer 102. In an embodiment, the insulating separation pattern 145 may be provided to penetrate at least a portion of the word lines WL on the dummy cell region DCR.

Boundary spacers ILSP may be disposed on the boundary region INF of the substrate 100 to cover the side surfaces of the bit line pads BLPD, respectively. The first portion P1 of the insulating separation pattern 145 may be extended in the first direction D1 from a region between the bit line pads BLPD (i.e., two adjacent bit line pads BLPD in the second direction D2) and may be interposed between the boundary spacers ILSP. A boundary insulating layer IL may be disposed on the boundary region INF of the substrate 100. The boundary insulating layer IL may cover side surfaces of the boundary spacers ILSP and a side surface of the first portion P1 of the insulating separation pattern 145.

Bit line contacts DC may be disposed below each of the bit lines BL and may be spaced apart from each other in the first direction D1. Some of the bit line contacts DC may be disposed on the active cell region ACR, and others of the bit line contacts DC may be disposed on the dummy cell region DCR. Each of the bit line contacts DC may be provided to penetrate the polysilicon pattern 130 and the insulating layer 120 and may be electrically connected to the first impurity injection region 110a of a corresponding one of the active patterns ACT. The ohmic pattern 132 and the metal-containing pattern 134 may cover top surfaces of the bit line contacts DC. The bit line contacts DC may be formed of or may include at least one of doped semiconductor materials (e.g., doped silicon, doped germanium, and so forth), conductive metal nitrides (e.g., titanium nitride, tantalum nitride, and so forth), metallic materials (e.g., tungsten, titanium, tantalum, and so forth), and metal-semiconductor compounds (e.g., tungsten silicide, cobalt silicide, titanium silicide, and so forth).

A bit line spacer 150 may be disposed on a side surface of each of the bit lines BL. The bit line spacer 150 may be extended along the side surface of each of the bit lines BL in the first direction D1. The bit line spacer 150 may be extended from the side surface of each of the bit lines BL to a side surface of the lower capping pattern 140 and a side surface of the upper capping pattern 142.

The bit line spacer 150 on a side surface of each of the first bit lines BL1 may be extended in the first direction D1 to cover the side surface of the second portion P2 of the insulating separation pattern 145. The bit line spacer 150 on the side surface of each of the first bit lines BL1 may be extended along the side surface of each of the first bit lines BL1 and the side surface of the second portion P2 of the insulating separation pattern 145, in the first direction D1. The bit line spacer 150 on a side surface of each of the second bit lines BL2 may be extended along the side surface of each of the second bit lines BL2 in the first direction D1. The bit line spacer 150 may be extended from the active cell region ACR to the dummy cell region DCR and the boundary region INF in the first direction D1. On the boundary region INF, the bit line spacer 150 may be extended in the second direction D2 to cover a portion (e.g., a side surface) of the first portion P1 of the insulating separation pattern 145 and a portion (e.g., a side surface) of a corresponding one of the bit line pads BLPD. In an embodiment, on the boundary region INF, the bit line spacer 150 may be extended in the second direction D2 to be in contact with the portion (e.g., the side surface) of the first portion P1 of the insulating separation pattern 145 and the portion (e.g., the side surface) of the corresponding bit line pad BLPD.

The bit line spacer 150 may include a first spacer 151, a second spacer 155, and a third spacer 157, which are sequentially stacked on the side surface of each of the bit lines BL. The first spacer 151 and the second spacer 155 may be disposed on the insulating layer 120, and the bottommost surface of the first spacer 151 and the bottommost surface of the second spacer 155 may be in contact with a top surface of the insulating layer 120. The third spacer 157 may cover a side surface of the insulating layer 120, and the bottommost surface of the third spacer 157 may be in contact with a top surface of the substrate 100. The first to third spacers 151, 155, and 157 may be extended to cover the side surface of the lower capping pattern 140 and the side surface of the upper capping pattern 142. The first spacer 151 and the third spacer 157 may be formed of or may include the same insulating material (e.g., silicon nitride). In an embodiment, the second spacer 155 may include an insulating material (e.g., silicon oxide) having etch selectivity with respect to the first and third spacers 151 and 157. In an embodiment, the second spacer 155 may be an air gap region (i.e., an air gap spacer). The phrase "air gap" will be understood to include gaps (e.g., pockets) of air or gases other than air, such as other atmospheric gases or chamber gases that may be present during manufacturing. An "air gap" may also constitute a space having no or substantially no gas or other material therein."

A gapfill insulating pattern 153 may be disposed on a side surface of each of the bit line contacts DC. The gapfill insulating pattern 153 may be formed of or may include at least one of silicon oxide, silicon nitride, and silicon oxynitride. The first spacer 151 may be extended into a region between the side surface of each of the bit line contacts DC and the gapfill insulating pattern 153 and may be further extended into a region between the device isolation layer 102 and the gapfill insulating pattern 153. An insulating liner 152 may be interposed between the first spacer 151 and the gapfill insulating pattern 153. The gapfill insulating pattern 153 may be spaced apart from the first spacer 151 with the insulating liner 152 interposed between the gapfill insulating pattern 153 and the first spacer 151. At least a portion of the insulating liner 152 may be extended into a region between the first spacer 151 and the third spacer 157 and may be in contact with the bottommost surface of the second spacer 155. The gapfill insulating pattern 153 may be in contact with the bottommost surface of the third spacer 157. In an embodiment, the insulating liner 152 may be formed of or may include silicon oxide.

The first to third spacers 151, 155, and 157 on the side surface of each of the first bit lines BL1 may be extended in the first direction D1 to face the side surface of the second portion P2 of the insulating separation pattern 145. For example, the first to third spacers 151, 155, and 157 may extend along a side surface of a corresponding first bit line BL1 and a side surface of the second portion of a corresponding insulating separation pattern 145. The corresponding first bit line BL1 and the corresponding insulating separation pattern 145 may extend along a straight line extending in the first direction D1. A lower portion of the second portion P2 of the insulating separation pattern 145 may be extended into a region below the first to third spacers 151, 155, and 157, and thus, the bottommost surfaces of the first to third spacers 151, 155, and 157 may be in contact with the lower portion of the second portion P2 of the insulating separation pattern 145. The bottommost surface of the second portion P2 of the insulating separation pattern 145 may be located at a level lower than the bottommost surfaces of the first to third spacers 151, 155, and 157.

Storage node contacts BC may be disposed between a pair of bit lines BL, which are adjacent to each other, and may be spaced apart from each other in the first direction D1. The storage node contacts BC may be disposed on the active cell region ACR, and some of the storage node contacts BC may be disposed on the dummy cell region DCR. In an embodiment, the storage node contacts BC on the dummy cell region DCR may be spaced apart from each other in the first direction D1, between each of the second bit lines BL2 and the second portion P2 of the insulating separation pattern 145. The second portion P2 of the insulating separation pattern 145 may be extended in the first direction D1, between the storage node contacts BC on the dummy cell region DCR. The second portion P2 of the insulating separation pattern 145 may electrically separate adjacent storage node contacts of the storage node contacts BC, which are placed on the dummy cell region DCR, from each other.

Each of the storage node contacts BC may be electrically connected to a corresponding one of the second impurity injection regions 110b of each of the active patterns ACT. In an embodiment, the storage node contacts BC on the dummy cell region DCR may be electrically disconnected from the active patterns ACT. The storage node contacts BC may be formed of or include a conductive material (e.g., doped or undoped polysilicon). Insulating fences may be disposed on the active cell region ACR and the dummy cell region DCR and between the storage node contacts BC. The insulating fences and the storage node contacts BC may be alternately arranged in the first direction D1, between the pair of bit lines BL or between each of the second bit lines BL2 and the second portion P2 of the insulating separation pattern 145. The insulating fences may be disposed on the boundary region INF to cover or may be in contact with side surfaces of corresponding ones of the storage node contacts BC. In an embodiment, the insulating fences may be formed of or may include silicon nitride.

The bit line spacer 150 may be interposed between each of the bit lines BL and the storage node contacts BC and may be extended into a region between the second portion P2 of the insulating separation pattern 145 and the storage node contacts BC.

Landing pads LP may be respectively disposed on the storage node contacts BC on the active cell region ACR. In an embodiment, the landing pads LP may not be provided on the storage node contacts BC on the dummy cell region DCR. The landing pads LP may be formed of or may include a metal-containing material (e.g., tungsten). An upper portion of each of the landing pads LP may cover a top surface of the upper capping pattern 142 and may have a width larger than each of the storage node contacts BC. The upper portion of each of the landing pads LP may be shifted from each of the storage node contacts BC laterally (e.g., in the second direction D2 or in an opposite direction of the second direction D2). The upper portion of each of the landing pads LP may vertically overlap a corresponding one of the bit lines BL. Although not shown, a storage node ohmic layer and a diffusion prevention pattern may be interposed between each of the storage node contacts BC and each of the landing pads LP. The storage node ohmic layer may be formed of or may include at least one of metal silicide materials (e.g., cobalt silicide). The diffusion prevention pattern may be formed of or may include at least one of metal nitride materials (e.g., titanium nitride and tantalum nitride).

A first upper insulating layer 160 may be provided to fill a space between the landing pads LP on the active cell region ACR. The first upper insulating layer 160 may be provided to partially penetrate the upper capping pattern 142 and the lower capping pattern 140 and to be in contact with top surfaces of the first to third spacers 151, 155, and 157. The first upper insulating layer 160 may be extended to the dummy cell region DCR to cover the upper capping pattern 142, which is placed on each of the second bit lines BL2, and the second portion P2 of the insulating separation pattern 145. The first upper insulating layer 160 may be extended into a region between the upper capping pattern 142, which is placed on each of the second bit lines BL2, and the second portion P2 of the insulating separation pattern 145 and may be in contact with top surfaces of the storage node contacts BC on the dummy cell region DCR. The first upper insulating layer 160 may be formed of or may include at least one of silicon oxide, silicon nitride, and silicon oxynitride.

Connection structures CNS may be disposed on the boundary region INF and may be disposed on the bit line pads BLPD, respectively. Each of the connection structures CNS may include a connection contact 200, which is provided to penetrate the upper and lower capping patterns 142 and 140 and is connected to each of the bit line pads BLPD, and a connection conductive line 210, which is provided on the connection contact 200. The connection conductive line 210 may be extended to a region on the upper capping pattern 142 on each of the bit line pads BLPD and may be electrically connected to peripheral circuits (e.g., the peripheral blocks 2, 3, 4, and 5 of FIG. 1) on the peripheral region. The connection contact 200 and the connection conductive line 210 may be formed of or may include the same material as the landing pads LP. The topmost surfaces of the connection structures CNS (e.g., the topmost surface of the connection conductive line 210) may be coplanar with the topmost surfaces of the landing pads LP.

The first upper insulating layer 160 may be extended to the boundary region INF to fill a space between the connection structures CNS. The first upper insulating layer 160 may fill a space between the connection conductive lines 210 of the connection structures CNS, and a portion of the first upper insulating layer 160 may be extended into the first portion P1 of the insulating separation pattern 145.

Bottom electrodes BE may be disposed on the active cell region ACR and may be disposed on the landing pads LP, respectively. The bottom electrodes BE may be formed of or may include at least one of doped poly-silicon, metal nitride materials (e.g., titanium nitride), and metallic materials (e.g., tungsten, aluminum, and copper). Each of the bottom electrodes BE may have a circular pillar shape, a hollow cylinder shape, or a cup shape. An upper supporting pattern 182 may be provided to support upper side surfaces of the bottom electrodes BE, and a lower supporting pattern 180 may be provided to support lower side surfaces of the bottom electrodes BE. The upper and lower supporting patterns 182 and 180 may be formed of or may include at least one of insulating materials (e.g., silicon nitride, silicon oxide, and silicon oxynitride).

An etch stop layer 170 may cover the first upper insulating layer 160, between the bottom electrodes BE. The etch stop layer 170 may be formed of or may include at least one of insulating materials (e.g., silicon nitride, silicon oxide, and silicon oxynitride). A dielectric layer 175 may be provided to cover the bottom electrodes BE and the upper and lower supporting patterns 182 and 180. The dielectric layer 175 may be formed of or may include at least one of silicon oxide, silicon nitride, silicon oxynitride, and high-k dielectric materials (e.g., hafnium oxide layer). A top electrode TE may be disposed on the dielectric layer 175 and may fill a space between the bottom electrodes BE. The top electrode TE may be formed of or may include at least one of doped poly-silicon, doped silicon germanium, metal nitride materials (e.g., titanium nitride), and metallic materials (e.g., tungsten, aluminum, and copper). The bottom electrodes BE, the dielectric layer 175, and the top electrode TE may constitute a capacitor CAP.

A second upper insulating layer 190 may be disposed on the dummy cell region DCR and the boundary region INF to cover the first upper insulating layer 160. The second upper insulating layer 190 may be provided to cover a side surface of the capacitor CAP (e.g., a side surface of the top electrode TE) and top surfaces of the connection structures CNS. The second upper insulating layer 190 may cover top surfaces of the connection conductive lines 210 of the connection structures CNS. In an embodiment, the second upper insulating layer 190 may be formed of or may include at least one of silicon oxide, silicon nitride, and silicon oxynitride.

According to an embodiment of the inventive concept, the bit lines BL may include the first bit lines BL1 and the second bit lines BL2, which are alternately arranged in the second direction D2. For example, the first bit lines BL1 may be disposed on the active cell region ACR, and the second bit lines BL2 may be disposed on the active cell region ACR and may be extended to the dummy cell region DCR and the boundary region INF in the first direction D1. The second bit lines BL2 may be respectively connected to the bit line pads BLPD with a relatively large width or a width greater than a width of each of the second bit lines BL2, and thus, an electric connection between the second bit lines BL2 and the connection structures CNS may be easily achieved. The present invention is not limited thereto. In an embodiment, the first bit lines BL1 and the second bit lines BL2 may have the same length, and may be alternately arranged and connected to the sense amplifier (S/A) circuits at the third peripheral block 4 and the sense amplifier (S/A) circuits at the first peripheral block 2, respectively. For example, the first bit lines BL1 may be disposed on the active cell region ACR, a dummy cell region, and an interface region. The dummy cell region and the interface region may be disposed between the active cell region ACR and the first peripheral block 2 and between the active cell region ACR and the third peripheral block 4. The first and third peripheral blocks 2 and 4 may be adjacent to opposite sides of the active cell region ACR. First end portions of the first bit lines BL1 that are adjacent to first peripheral block 2 may be disposed only on the active cell region ACR (as shown in FIG. 2), and second end portions, opposite to the first end portions, of the first bit lines BL1 may be connected to bit line pads that are adjacent to the third peripheral block 4. The second bit lines BL2 may be disposed on the active cell region ACR, the dummy cell region, and the interface region. First end portions of the second bit lines BL2 that are adjacent to the first peripheral block 2 may be disposed on the interface region INF to be connected to the bit line pads BLPD as shown in FIG. 2, and second end portions, opposite to the first end portions, of the second bit lines BL2 may be disposed on the active cell region ACR without extending into the dummy cell region and the interface region between the active cell region ACR and the third peripheral block 4. For the simplicity of drawings, FIG. 2 shows the portion PP of FIG. 1 which is a region between the cell block 1 and the first peripheral block 2. At a region between the cell block 1 and the third peripheral block 4 which is not shown in FIG. 2, end portions of the first bit lines BL1 may be disposed on the interface region adjacent to the third peripheral block 4, and end portions of the second bit lines BL2 may be disposed on the active cell region ACR without extending into the dummy cell region and the interface region that are adjacent to the third peripheral block 4.

The first portion P1 of the insulating separation pattern 145 may be interposed between the bit line pads BLPD, and the second portion P2 of the insulating separation pattern 145 may be disposed between the second bit lines BL2. The second portion P2 of the insulating separation pattern 145 between the second bit lines BL2 may be extended in the first direction D1 to cover or be in contact with an end portion of a corresponding one of the first bit lines BL1. Due to this structure, it may be possible to reduce a parasitic capacitance between adjacent ones of the bit lines BL. The bit lines BL1 and BL2 may be spaced apart from the boundary spacer ILSP and the boundary insulating layer IL by the first portion P1 of the insulating separation pattern 145 and the bit line pads BLPD, which have relatively large widths and are interposed therebetween. Owing to this structure, it may be possible to reduce a bridge defect between adjacent bit lines of the bit lines BL, which is caused by the boundary spacer ILSP and the boundary insulating layer IL when an etching process is performed to form the bit lines BL.

The storage node contacts BC may be disposed between each of the second bit lines BL2 and the second portion P2 of the insulating separation pattern 145. Accordingly, it may be possible to reduce a defect, which may be caused by a contact between the storage node contacts BC and the first bit lines BL1.

Thus, it may be possible to fabricate a semiconductor device with improved electric and reliability characteristics.

FIGS. 4, 6, 8, 10, 12, 14, 16, and 18 are plan views illustrating a method of fabricating a semiconductor device according to an embodiment of the inventive concept and corresponding to the portion 'PP' of FIG. 1. FIGS. 5A, 7A, 9A, 11A, 13A, 15A, 17A, and 19A are sectional views taken along lines A-A' of FIGS. 4, 6, 8, 10, 12, 14, 16, and 18, respectively. FIGS. 5B, 7B, 9B, 11B, 13B, 15B, 17B, and 19B are sectional views taken along lines B-B' of FIGS. 4, 6, 8, 10, 12, 14, 16, and 18, respectively. FIGS. 5C, 7C, 9C, 11C, 13C, 15C, 17C, and 19C are sectional views taken along lines C-C' of FIGS. 4, 6, 8, 10, 12, 14, 16, and 18, respectively. FIGS. 5D, 7D, 9D, 11D, 13D, 15D, 17D, and 19D are sectional views taken along lines D-D' of FIGS. 4, 6, 8, 10, 12, 14, 16, and 18, respectively. FIGS. 5E, 7E, 9E, 11E, 13E, 15E, 17E, and 19E are sectional views taken along lines E-E' of FIGS. 4, 6, 8, 10, 12, 14, 16, and 18, respectively. For concise description, an element previously described with reference to FIGS. 1, 2, and 3A to 3E may be identified by the same reference number without repeating an overlapping description thereof.

Referring to FIGS. 4 and 5A to 5E, a substrate 100 including an active cell region ACR, a dummy cell region DCR, and a boundary region INF may be provided. Active patterns ACT may be formed on the active cell region ACR and the dummy cell region DCR of the substrate 100. Some of the active patterns ACT may be formed on the boundary region INF. In an embodiment, the formation of the active patterns ACT may include forming first mask patterns on the substrate 100 and etching an upper portion of the substrate 100 using the first mask patterns as an etch mask. Since the upper portion of the substrate 100 is etched, a trench T exposing side surfaces of the active patterns ACT may be formed in the substrate 100. A device isolation layer 102 may be formed to fill the trench T. In an embodiment, the formation of the device isolation layer 102 may include forming an insulating device isolation layer on the substrate 100 to fill the trench T and planarizing the insulating device isolation layer to expose a top surface of the substrate 100.

Word lines WL may be formed on the active cell region ACR and the dummy cell region DCR of the substrate 100 to cross the active patterns ACT and the device isolation layer 102. The word lines WL may be spaced apart from each other in the first direction D1 and may be extended in the second direction D2. Each of the word lines WL may include a gate electrode GE penetrating upper portions of the active patterns ACT and the device isolation layer 102, a gate dielectric pattern GI interposed between the gate electrode GE and the active patterns ACT and between the gate electrode GE and the device isolation layer 102, and a gate capping pattern GC on a top surface of the gate electrode GE. In an embodiment, the formation of the gate electrode GE and the gate dielectric pattern GI may include forming grooves in the substrate 100 to penetrate upper portions of the active patterns ACT and the device isolation layer 102, forming a gate dielectric layer to cover an inner surface of each of the grooves, forming a gate electrode layer to fill each of the grooves, and planarizing the gate dielectric layer and the gate electrode layer to expose the top surface of the substrate 100. In an embodiment, the formation of the gate capping pattern GC may include recessing an upper portion of the gate electrode GE to form an empty region in each of the grooves, forming a gate capping layer to fill the empty region, and planarizing the gate capping layer to expose the top surface of the substrate 100.

A first impurity injection region 110*a* and second impurity injection regions 110*b* may be formed in each of the active patterns ACT. In an embodiment, the formation of the first and second impurity injection regions 110*a* and 110*b* may include injecting impurities of the same conductivity type into the active patterns ACT using the gate capping pattern GC and the device isolation layer 102 as a mask.

An insulating layer 120 may be formed on the active cell region ACR, the dummy cell region DCR, and the boundary region INF of the substrate 100 to cover the active patterns ACT, the device isolation layer 102, and the word lines WL. A poly-silicon layer 130L may be formed on the active cell region ACR, the dummy cell region DCR, and the boundary region INF of the substrate 100 and may be stacked on the insulating layer 120. Recess regions R1 may be formed to penetrate the insulating layer 120 and the poly-silicon layer 130L and to extend into the active patterns ACT and the device isolation layer 102. In an embodiment, the formation of the recess regions R1 may include forming second mask patterns on the poly-silicon layer 130L to define a region, on which the recess regions R1 will be formed, and etching the poly-silicon layer 130L, the insulating layer 120, the active patterns ACT, and the device isolation layer 102 using the second mask patterns as an etch mask. The second mask patterns may be removed, after the formation of the recess regions R1.

A bit line contact layer DCL may be formed to fill the recess regions R1. In an embodiment, the formation of the bit line contact layer DCL may include forming the bit line contact layer DCL on the poly-silicon layer 130L to fill the recess regions R1 and planarizing the bit line contact layer DCL to expose a top surface of the poly-silicon layer 130L. Accordingly, the bit line contact layer DCL may be locally formed in the recess regions R1.

An ohmic layer 132L, a metal-containing layer 134L, and a lower capping layer 140L may be formed on the active cell region ACR, the dummy cell region DCR, and the boundary region INF of the substrate 100 and may be sequentially stacked on the poly-silicon layer 130L. The ohmic layer 132L may cover a top surface of the poly-silicon layer 130L and a top surface of the bit line contact layer DCL.

A boundary spacer ILSP may be formed on the boundary region INF of the substrate 100 to cover side surfaces of the insulating layer 120, the poly-silicon layer 130L, the ohmic layer 132L, the metal-containing layer 134L, and the lower capping layer 140L (i.e., a side surface of a stacked structure of the insulating layer 120, the poly-silicon layer 130L, the ohmic layer 132L, the metal-containing layer 134L, and the lower capping layer 140L). A boundary insulating layer IL may be formed on the boundary region INF of the substrate 100. The boundary spacer ILSP may be interposed between the boundary insulating layer IL and the side surfaces of the insulating layer 120, the poly-silicon layer 130L, the ohmic layer 132L, the metal-containing layer 134L, and the lower capping layer 140L.

Referring to FIGS. 6 and 7A to 7E, separation trenches LT may be formed on the boundary region INF of the substrate 100. The separation trenches LT may be extended in the first direction D1 and may be spaced apart from each other in the second direction D2. In an embodiment, the separation trenches LT may be extended to the dummy cell region DCR. On the dummy cell region DCR and the boundary region INF, each of the separation trenches LT may penetrate the insulating layer 120, the poly-silicon layer 130L, the ohmic layer 132L, the metal-containing layer 134L, and the lower capping layer 140L and may also penetrate upper portions of the active patterns ACT, the device isolation layer 102, and the word lines WL. On the boundary region INF, the separation trenches LT may be extended in the first direction D1 to penetrate the boundary spacer ILSP.

In an embodiment, the formation of the separation trenches LT may include forming third mask patterns on the lower capping layer 140L to define regions, in which the separation trenches LT will be formed, and performing a first etching process using the third mask patterns as an etch mask. The first etching process may include etching the lower capping layer 140L, the metal-containing layer 134L, the ohmic layer 132L, the poly-silicon layer 130L, and the insulating layer 120 and etching upper portions of the active patterns ACT, the device isolation layer 102, and the word lines WL. The first etching process may further include removing the bit line contact layer DCL, which is exposed by the separation trenches LT, from the dummy cell region DCR. The third mask patterns may be removed, after the formation of the separation trenches LT.

Referring to FIGS. 8 and 9A to 9E, an insulating separation layer 145L may be formed on the active cell region ACR, the dummy cell region DCR, and the boundary region INF of the substrate 100 and may be stacked on the lower capping layer 140L. The insulating separation layer 145L may fill the separation trenches LT and may be extended to a region on the boundary spacer ILSP and the boundary insulating layer IL. The insulating separation layer 145L may be formed by at least one of a chemical vapor deposition method and a physical vapor deposition method. In an embodiment, the insulating separation layer 145L may be formed of or may include silicon nitride.

Referring to FIGS. 10 and 11A to 11E, line mask patterns M1 may be formed on the active cell region ACR, the dummy cell region DCR, and the boundary region INF of the substrate 100 and on the insulating separation layer 145L. The line mask patterns M1 may be extended in the first direction D1 and may be spaced apart from each other in the second direction D2. Each of the separation trenches LT filled with the insulating separation layer 145L may overlap a corresponding line mask pattern of the line mask patterns M1 vertically (e.g., in the fourth direction D4). The line mask patterns M1 may be formed of or may include a material (e.g., silicon oxide and/or silicon oxynitride) having etch selectivity with respect to the insulating separation layer 145L.

A peripheral mask pattern M2 may be formed on the boundary region INF of the substrate 100 to cover portions of the line mask patterns M1 on the boundary region INF. The peripheral mask pattern M2 may be formed to expose the active cell region ACR and the dummy cell region DCR of the substrate 100 and to expose a portion of the boundary region INF adjacent to the dummy cell region DCR. The peripheral mask pattern M2 may be, for example, a photoresist pattern.

Referring to FIGS. 12 and 13A to 13E, a second etching process may be performed using the line mask patterns M1 and the peripheral mask pattern M2 as an etch mask. The second etching process may include etching the insulating separation layer 145L, the lower capping layer 140L, the metal-containing layer 134L, the ohmic layer 132L, the poly-silicon layer 130L, and the bit line contact layer DCL using the line mask patterns M1 and the peripheral mask pattern M2 as an etch mask. Bit lines BL, bit line contacts DC, bit line pads BLPD, and insulating separation pattern 145 may be formed at the same time by the second etching process.

The bit lines BL may be formed on the active cell region ACR of the substrate 100 and on the insulating layer 120. The bit lines BL may cross the word lines WL without contacting each other. The bit lines BL may be extended in the first direction D1 and may be spaced apart from each other in the second direction D2. The bit lines BL may include first bit lines BL1 and second bit lines BL2, which are alternately arranged in the second direction D2. In an embodiment, the first bit lines BL1 may be disposed on the active cell region ACR of the substrate 100. The second bit lines BL2 may be disposed on the active cell region ACR and may be extended in the first direction D1 or to the dummy cell region DCR and the boundary region INF. The bit line pads BLPD may be formed on the boundary region INF of the substrate 100 and on the insulating layer 120. The bit line pads BLPD may be spaced apart from each other in the second direction D2, on the boundary region INF. The second bit lines BL2 may be connected to the bit line pads BLPD, respectively. The present invention is not limited thereto. In an embodiment, the first bit lines BL1 and the second bit lines BL2 may have the same length. The arrangement of the first bit lines BL1 and the second bit lines BL2 is described above, and detailed description thereof will be omitted.

In an embodiment, the formation of the bit lines BL and the bit line pads BLPD may include etching the insulating separation layer 145L, the lower capping layer 140L, the metal-containing layer 134L, the ohmic layer 132L, and the poly-silicon layer 130L using the line mask patterns M1 and the peripheral mask pattern M2 as an etch mask. Each of the bit lines BL and the bit line pads BLPD may include a polysilicon pattern 130, an ohmic pattern 132, and a metal-containing pattern 134, which are sequentially stacked on the insulating layer 120 and are formed by etching the poly-silicon layer 130L, the ohmic layer 132L, and the metal-containing layer 134L using the line mask patterns M1 and the peripheral mask pattern M2 as an etch mask.

A lower capping pattern 140 and an upper capping pattern 142 may be formed on each of the bit lines BL and the bit line pads BLPD. The lower and upper capping patterns 140 and 142 may be formed by etching the insulating separation layer 145L and the lower capping layer 140L using the line mask patterns M1 and the peripheral mask pattern M2 as an etch mask.

The insulating separation pattern 145 may be formed on the boundary region INF and between the bit line pads BLPD. In an embodiment, a portion of the insulating separation pattern 145 may be extended into a region between the second bit lines BL2 on the boundary region INF and the dummy cell region DCR. The insulating separation pattern 145 may include a first portion P1, which is disposed on the boundary region INF and between the bit line pads BLPD, and a second portion P2, which is disposed on the dummy cell region DCR and the boundary region INF and between the second bit lines BL2.

In an embodiment, the formation of the insulating separation pattern 145 may include etching the insulating separation layer 145L, which fills the separation trenches LT, using the line mask patterns M1 and the peripheral mask pattern M2 as an etch mask. The insulating separation layer 145L below the peripheral mask pattern M2 may constitute the first portion P1 of the insulating separation pattern 145, and the first portion P1 of the insulating separation pattern 145 may fill a space between the bit line pads BLPD, on the boundary region INF. The first portion P1 of the insulating separation pattern 145 may be in contact with a side surface of each of the bit line pads BLPD and may be in contact with the side surface of the lower capping pattern 140. The first portion P1 of the insulating separation pattern 145 and the upper capping pattern 142 may be in contact with each other without any interface therebetween or may constitute a single object. The second portion P2 of the insulating separation pattern 145 may be formed by etching the insulating separation layer 145L, which fills the separation trenches LT, using the line mask patterns M1 as an etch mask. Between the second bit lines BL2 on the dummy cell region DCR and the boundary region INF, the second portion P2 of the insulating separation pattern 145 may be extended in the first direction D1 to be in contact with an end portion of a corresponding first bit line of the first bit lines BL1. Side surfaces of the second portion P2 of the insulating separation pattern 145 may be aligned to side surfaces of the corresponding first bit line BL1 in the first direction D1, respectively.

Bit line contacts DC may be formed below each of the bit lines BL and may be spaced apart from each other in the first direction D1. In an embodiment, the formation of the bit line contacts DC may include etching the bit line contact layer DCL using the line mask patterns M1 as an etch mask. Portions of the bit line contact layer DCL filling the recess regions R1 may be removed by the second etching process, and thus, an inner surface of each of the recess regions R1 at both sides of each of the bit line contacts DC may be exposed. In an embodiment, the inner surface of each recess region R1 may define or may expose a side surface of each of the bit line contacts DC. For example, the bit line contact layer DCL may be patterned into the bit line contacts DC that are separated from each other by the formation of the recess regions R1.

A first spacer 151 may be formed on the side surface of each of the bit lines BL and the side surface of the second portion P2 of the insulating separation pattern 145. The first spacer 151 may be extended to the side surfaces of the lower and upper capping patterns 140 and 142. The first spacer 151 may be extended to a side surface of each of the bit line contacts DC to cover the exposed inner surface of each of the recess regions R1. An insulating liner 152 and a gapfill insulating pattern 153 may be formed at both sides of each of the bit line contacts DC to fill a remaining portion of each of the recess regions R1. The insulating liner 152 may be interposed between the first spacer 151 and the gapfill insulating pattern 153. In an embodiment, the insulating liner 152 and the gapfill insulating pattern 153 may be formed in the recess regions R1 and may surround a side surface of each of the bit line contacts DC.

In an embodiment, the formation of the first spacer 151, the insulating liner 152, and the gapfill insulating pattern 153 may include forming a first spacer layer to cover the side surfaces of the upper and lower capping patterns 142 and 140, the side surface of each of the bit lines BL, the side surface of the second portion P2 of the insulating separation pattern 145, the side surface of each of the bit line contacts DC, and the exposed inner surface of each of the recess regions R1, forming an insulating liner layer on the first spacer layer to extend along the first spacer layer, forming an insulating gapfill layer to fill the remaining portion of each of the recess regions R1, and anisotropically etching the insulating gapfill layer, the insulating liner layer, and the first spacer layer.

Referring to FIGS. 14 and 15A to 15E, a second spacer 155 may be formed on the side surface of each of the bit lines BL and the side surface of the second portion P2 of the insulating separation pattern 145. The second spacer 155 may be extended to the side surfaces of the lower and upper capping patterns 140 and 142. The first spacer 151 may be interposed between the side surfaces of the upper and lower capping patterns 142 and 140 and the second spacer 155, between the side surface of each of the bit lines BL and the second spacer 155, and between the side surface of the second portion P2 of the insulating separation pattern 145 and the second spacer 155.

In an embodiment, the formation of the second spacer 155 may include forming a second spacer layer to cover the side surfaces of the upper and lower capping patterns 142 and 140, the side surface of each of the bit lines BL, and the side surface of the second portion P2 of the insulating separation pattern 145 and anisotropically etching the second spacer layer. A portion of the insulating layer 120 and a portion of the second portion P2 of the insulating separation pattern 145, which are exposed by the second spacer 155, may be etched during the anisotropic etching performed on the second spacer layer.

A third spacer 157 may be formed on the side surfaces of the upper and lower capping patterns 142 and 140, the side surface of each of the bit lines BL, and the side surface of the second portion P2 of the insulating separation pattern 145. The first and second spacers 151 and 155 may be interposed between the third spacer 157 and the side surfaces of the upper and lower capping patterns 142 and 140, between the side surface of each of the bit lines BL and the third spacer 157, and between the side surface of the second portion P2 of the insulating separation pattern 145 and the third spacer 157. The third spacer 157 may cover a side surface of the insulating layer 120 and a side surface of a lower portion of the second portion P2 of the insulating separation pattern 145 and may be in contact with the top surface of the substrate 100, a top surface of the gapfill insulating pattern 153, and the lower portion of the second portion P2 of the insulating separation pattern 145. The third spacer 157 and the second spacer 155 may be formed by substantially the same method.

The first to third spacers 151, 155, and 157 may constitute a bit line spacer 150. The bit line spacer 150 may be extended along the side surface of each of the bit lines BL and the side surface of the second portion P2 of the insulating separation pattern 145 or in the first direction D1. On the boundary region INF, the bit line spacer 150 may be extended in the second direction D2 to cover a portion of the first portion P1 of the insulating separation pattern 145 and a portion of a corresponding one of the bit line pads BLPD. For example, on the boundary region INF, the bit line spacer 150 may be extended in the second direction D2 to be in contact with the portion of the first portion P1 of the insulating separation pattern 145 and the portion of the corresponding bit line pad BLPD.

Referring to FIGS. 16 and 17A to 17E, a preliminary contact layer PBC may be formed on the active cell region ACR, the dummy cell region DCR, and the boundary region INF of the substrate 100 and may be formed between the bit lines BL and between the second portion P2 of the insulating separation pattern 145 and the second bit lines BL2. The bit line spacer 150 may be interposed between the preliminary contact layer PBC and each of the bit lines BL, between the preliminary contact layer PBC and each of the lower and upper capping patterns 140 and 142, and between the second portion P2 of the insulating separation pattern 145 and the preliminary contact layer PBC. In an embodiment, the formation of the preliminary contact layer PBC may include forming a contact conductive layer on the substrate 100 to cover a top surface of the upper capping pattern 142 and a top surface of the insulating separation pattern 145 and to fill spaces between the bit lines BL and between the second portion P2 of the insulating separation pattern 145 and the second bit lines BL2 and planarizing the contact conductive layer to expose the top surface of the upper capping pattern 142 and the top surface of the insulating separation pattern 145. The preliminary contact layer PBC may be extended in the first direction D1, between a pair of bit lines BL, which are adjacent to each other, or between the second portion P2 of the insulating separation pattern 145 and the second bit line BL2 adjacent thereto.

Referring to FIGS. 18 and 19A to 19E, an upper portion of the preliminary contact layer PBC may be recessed. Thereafter, storage node contacts BC may be formed by patterning the preliminary contact layer PBC. The storage node contacts BC may be spaced apart from each other in the first direction D1, between an adjacent pair of bit lines BL or between the second portion P2 of the insulating separation pattern 145 and the second bit line BL2 adjacent thereto. Insulating fences may be formed on the active cell region ACR and the dummy cell region DCR and between the storage node contacts BC. The insulating fences and the storage node contacts BC may be alternately arranged in the first direction D1, between the pair of bit lines BL or between the second portion P2 of the insulating separation pattern 145 and the second bit line BL2 adjacent thereto. The insulating fences may be formed on the boundary region INF to cover side surfaces of corresponding ones of the storage node contacts BC.

A connection contact hole 200H may be formed to penetrate the upper and lower capping patterns 142 and 140 on each of the bit line pads BLPD and to expose each of the bit line pads BLPD. In an embodiment, the connection contact hole 200H may penetrate the upper and lower capping patterns 142 and 140 and may expose the metal-containing pattern 134.

A conductive layer CL may be formed on the active cell region ACR, the dummy cell region DCR, and the boundary region INF of the substrate 100. The conductive layer CL may cover a top surface of the upper capping pattern 142, a top surface of the insulating separation pattern 145, and top surfaces of the storage node contacts and may fill the connection contact hole 200H.

Referring back to FIGS. 2 and 3A to 3E, landing pads LP and connection structures CNS may be formed by patterning the conductive layer CL. Each of the connection structures CNS may include a connection contact 200 filling the connection contact hole 200H and a connection conductive line 210 on the connection contact 200. A first upper insulating layer 160 may be formed to fill a space between the landing pads LP and a space between the connection structures CNS.

An etch stop layer 170 may be formed on the active cell region ACR to cover a top surface of the landing pads LP and a top surface of the first upper insulating layer 160. Bottom electrodes BE may be formed on the active cell region ACR and on the landing pads LP, respectively. Each of the bottom electrodes BE may be provided to penetrate the etch stop layer 170 and may be connected to a corresponding one of the landing pads LP.

An upper supporting pattern 182 may be formed on upper side surfaces of the bottom electrodes BE to support the upper side surfaces of the bottom electrodes BE. A lower supporting pattern 180 may be formed on lower side surfaces of the bottom electrodes BE to support the lower side surfaces of the bottom electrodes BE. A dielectric layer 175 may be formed to cover the bottom electrodes BE and the upper and lower supporting patterns 182 and 180. A top electrode TE may be formed on the active cell region ACR to fill a space between the bottom electrodes BE. The bottom electrodes BE, the dielectric layer 175, and the top electrode TE may constitute a capacitor CAP.

A second upper insulating layer 190 may be formed on the dummy cell region DCR and the boundary region INF to cover the first upper insulating layer 160. The second upper insulating layer 190 may cover a side surface of the capacitor CAP (e.g., a side surface of the top electrode TE) and top surfaces of the connection structures CNS.

Figure 20:
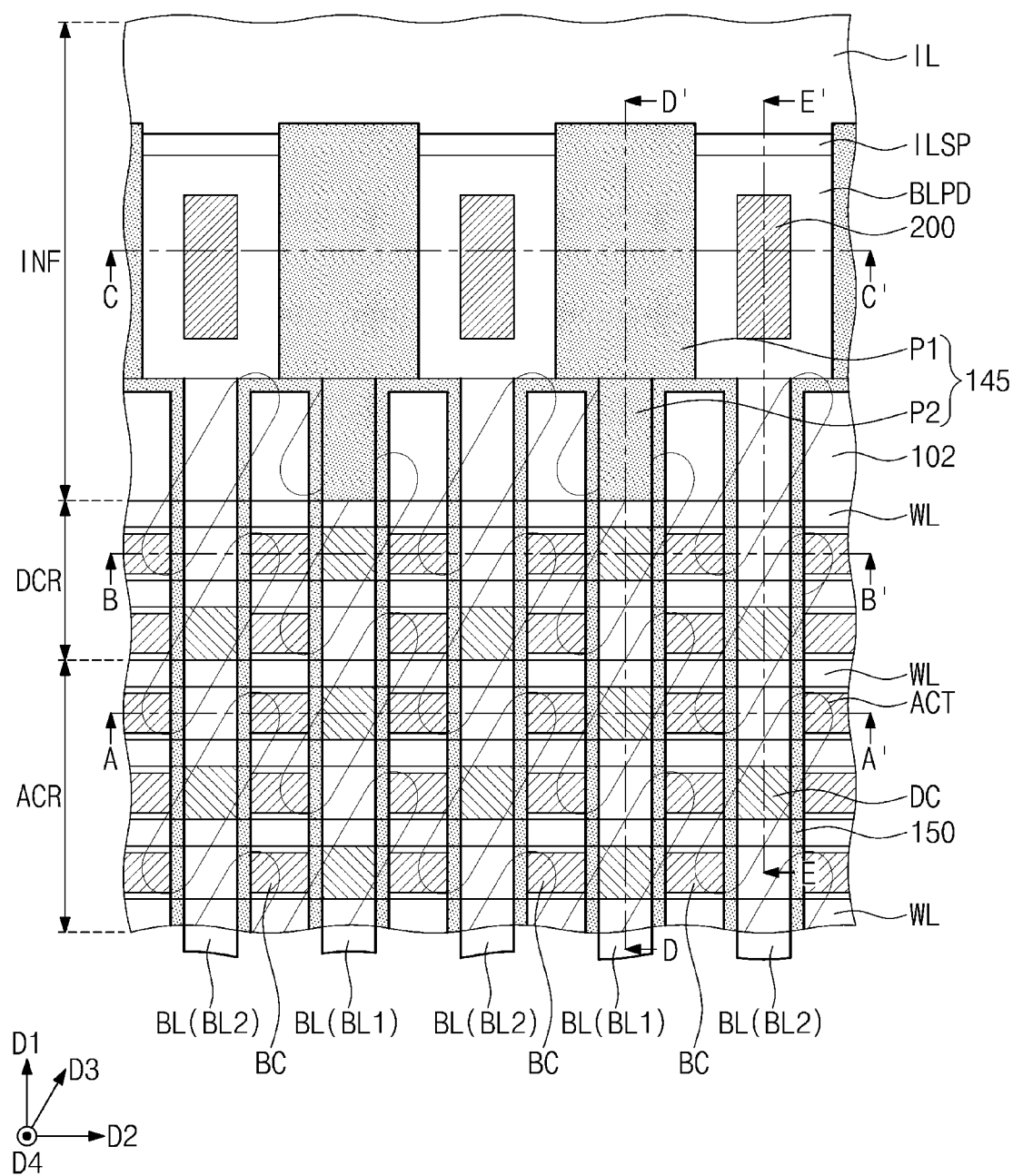
FIG. 20 is a plan view illustrating a semiconductor device according to an embodiment of the inventive concept and corresponding to the portion 'PP' of FIG. 1.
Figure 21:
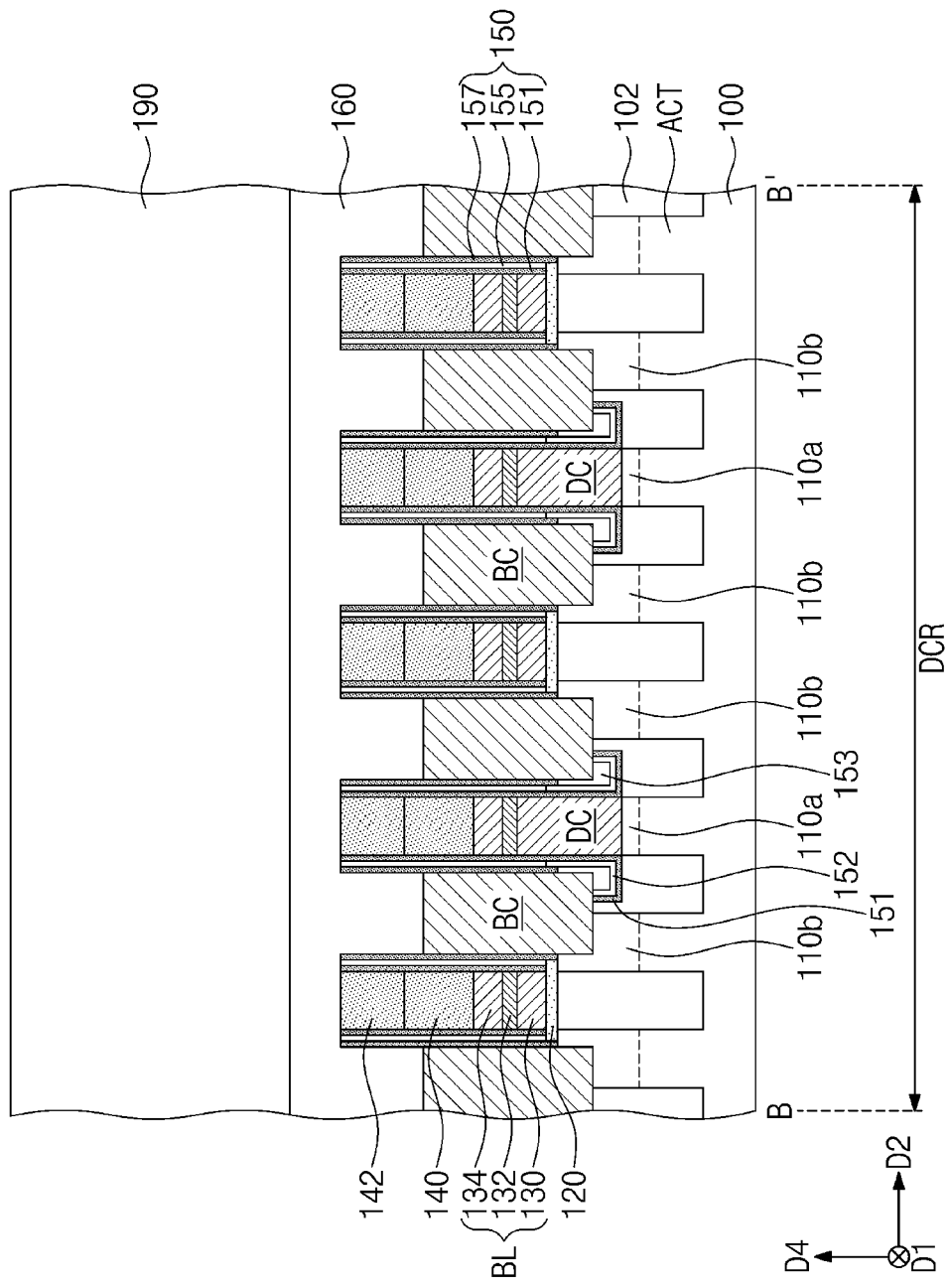
FIG. 21 is a sectional view taken along a line B-B' of FIG. 20.
Figure 22:
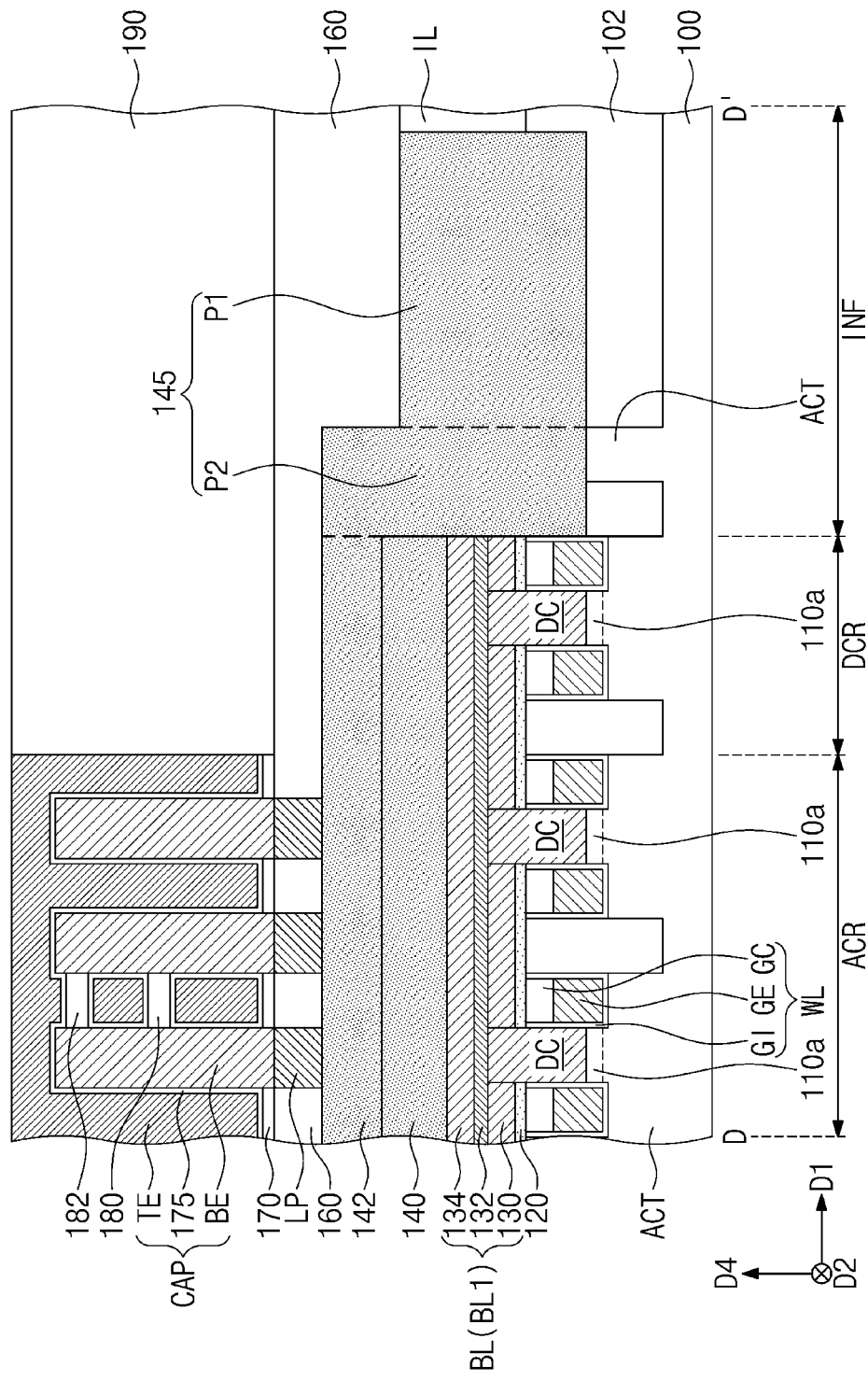
FIG. 22 is a sectional view taken along a line D-D' of FIG. 20.

FIG. 20 is a plan view illustrating a semiconductor device according to an embodiment of the inventive concept and corresponding to the portion 'PP' of FIG. 1. FIG. 21 is a sectional view taken along a line B-B' of FIG. 20, and FIG. 22 is a sectional view taken along a line D-D' of FIG. 20. Sectional views, which are taken along lines A-A', C-C', and E-E' of FIG. 20, may be substantially the same as FIGS. 3A, 3C, and 3E, respectively. For concise description, an element previously described with reference to FIGS. 2 and 3A to 3E may be identified by the same reference number without repeating an overlapping description thereof.

Referring to FIGS. 20 to 22, the bit lines BL may include first bit lines BL1 and second bit lines BL2, which are alternately arranged in the second direction D2. In an embodiment, the first bit lines BL1 may be disposed on the active cell region ACR of the substrate 100 and may be extended in the first direction D1 or to the dummy cell region DCR of the substrate 100 (without further extending into the interface region INF between the active cell region ACR and the first peripheral block 2 as shown in FIG. 1). The second bit lines BL2 may be disposed on the active cell region ACR and may be extended in the first direction D1 or to the dummy cell region DCR and the boundary region INF between the active cell region ACR and the first peripheral block 2 as shown in FIG. 1. The second bit lines BL2 may be respectively connected to bit line pads BLPD disposed on the boundary region INF between the active cell region ACR and the first peripheral block 2 as shown in FIG. 1.

The lower and upper capping patterns 140 and 142 on each of the first bit lines BL1 may be provided on the active cell region ACR and the dummy cell region DCR and may be extended along a top surface of each of the first bit lines BL1 or in the first direction D1. The lower and upper capping patterns 140 and 142 on each of the second bit lines BL2 may be provided on the active cell region ACR, the dummy cell region DCR, and the boundary region INF to extend in the first direction D1 or along a top surface of each of the second bit lines BL2. On the boundary region INF, the lower and upper capping patterns 140 and 142 on each of the second bit lines BL2 may be extended to a region on each of the bit line pads BLPD. On the boundary region between the active cell region ACR and the third peripheral block 4, the lower and upper capping patterns 140 and 142 on each of the first bit lines BL1 may be extended to a region on each of bit line pads adjacent to the third peripheral block 4 as shown in FIG. 1.

An insulating separation pattern 145 may be disposed on the boundary region INF and between the bit line pads BLPD. In an embodiment, a portion of the insulating separation pattern 145 may be extended into a region between the second bit lines BL2 on the boundary region INF. The insulating separation pattern 145 may include a first portion P1, which is disposed on the boundary region INF and between the bit line pads BLPD, and a second portion P2, which is disposed on the boundary region INF and between the second bit lines BL2.

The second portion P2 of the insulating separation pattern 145 may be extended in the first direction D1 between the second bit lines BL2 on the boundary region INF to cover an end portion of a corresponding one of the first bit lines BL1. An end portion of the second portion P2 of the insulating separation pattern 145 may be in contact with the end portion of the corresponding first bit line BL1. For example, the end portion of the second portion P2 of the insulating separation pattern 145 may contact the end portion of the corresponding first bit line BL1 at a boundary between the dummy cell region DCR and the interface region INF. Side surfaces of the second portion P2 of the insulating separation pattern 145 may be aligned to side surfaces of the corresponding first bit line BL1 in the first direction D1. Between the bit line pads BLPD on the boundary region INF, the first portion P1 of the insulating separation pattern 145 may be extended in the first direction D1 and may be in contact with side surfaces of the bit line pads BLPD.

The insulating separation pattern 145 may penetrate the insulating layer 120 on the boundary region INF and may be extended into the substrate 100 and the device isolation layer 102.

Except for the above differences, the semiconductor device according to the present embodiments may be configured to have substantially the same features as the semiconductor device described with reference to FIGS. 2 and 3A to 3E.

Figure 23:
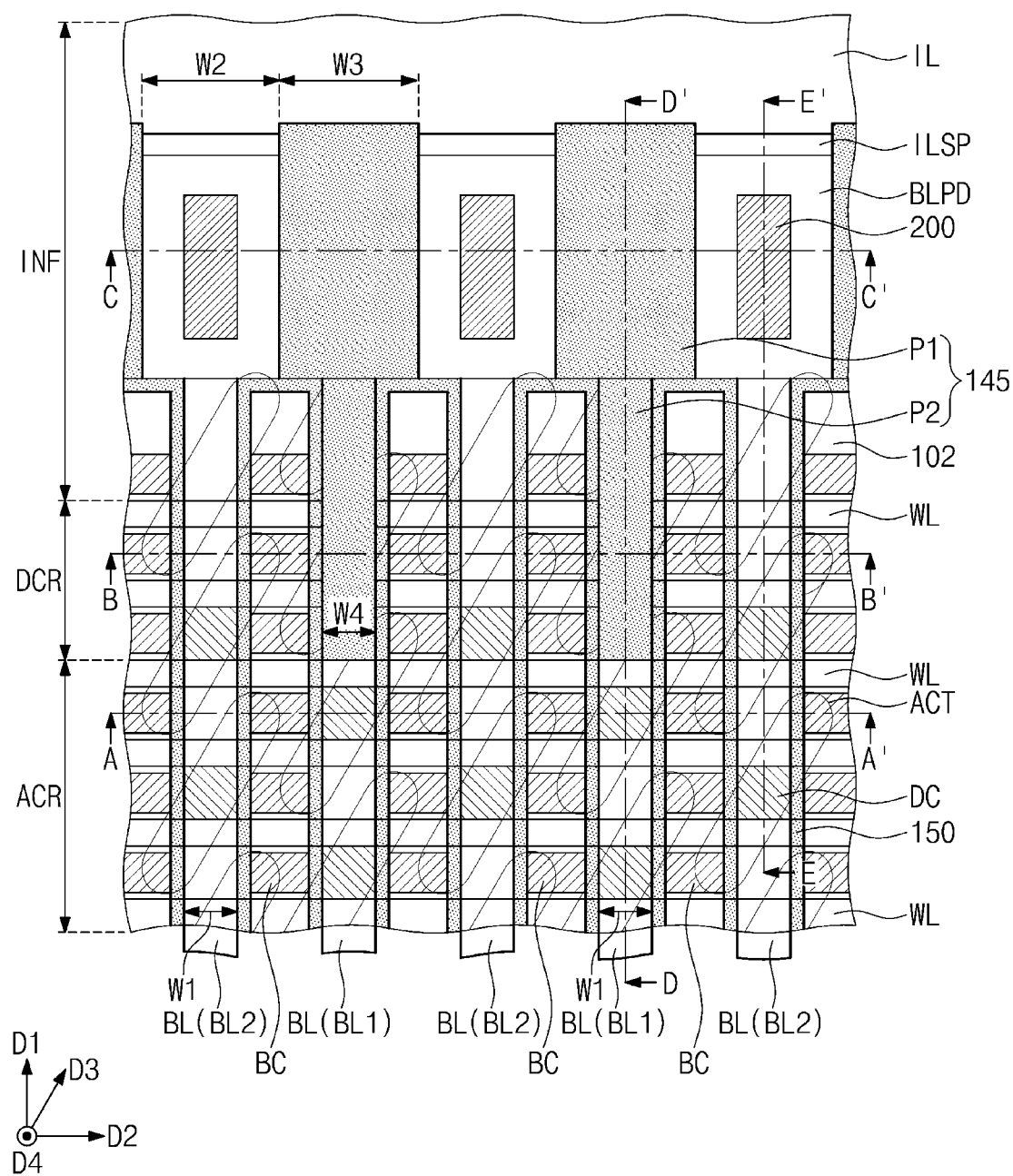
FIGS. 23 and 24 are plan views, each of which illustrates a semiconductor device according to an embodiment of the inventive concept and corresponds to the portion 'PP' of FIG. 1.

FIG. 23 is a plan view illustrating a semiconductor device according to an embodiment of the inventive concept and corresponding to the portion 'PP' of FIG. 1. Sectional views, which are respectively taken along lines A-A', B-B', C-C', D-D', and E-E' of FIG. 23, may be substantially the same as FIGS. 3A, 3B, 3C, 3D, and 3E.

Referring to FIG. 23, in an embodiment, some of the storage node contacts BC may be disposed on the boundary region INF. The storage node contacts BC on the boundary region INF may be spaced apart from each other in the first direction D1, between the second portion P2 of the insulating separation pattern 145 and each of the second bit lines BL2. The second portion P2 of the insulating separation pattern 145 may be extended in the first direction D1, between the storage node contacts BC on the boundary region INF. The second portion P2 of the insulating separation pattern 145 may electrically separate adjacent storage node contacts of the storage node contacts BC on the boundary region INF from each other.

In an embodiment, on the boundary region INF, the storage node contacts BC may not be electrically connected to the active patterns ACT. The landing pads LP may not be provided on the storage node contacts BC on the boundary region INF. The storage node contacts BC may be formed of or may include a conductive material (e.g., doped or undoped polysilicon). The insulating fences may be disposed on the boundary region INF and between the storage node contacts BC.

Except for the above differences, the semiconductor device according to the present embodiments may be configured to have substantially the same features as the semiconductor device described with reference to FIGS. 2 and 3A to 3E.

Figure 24:
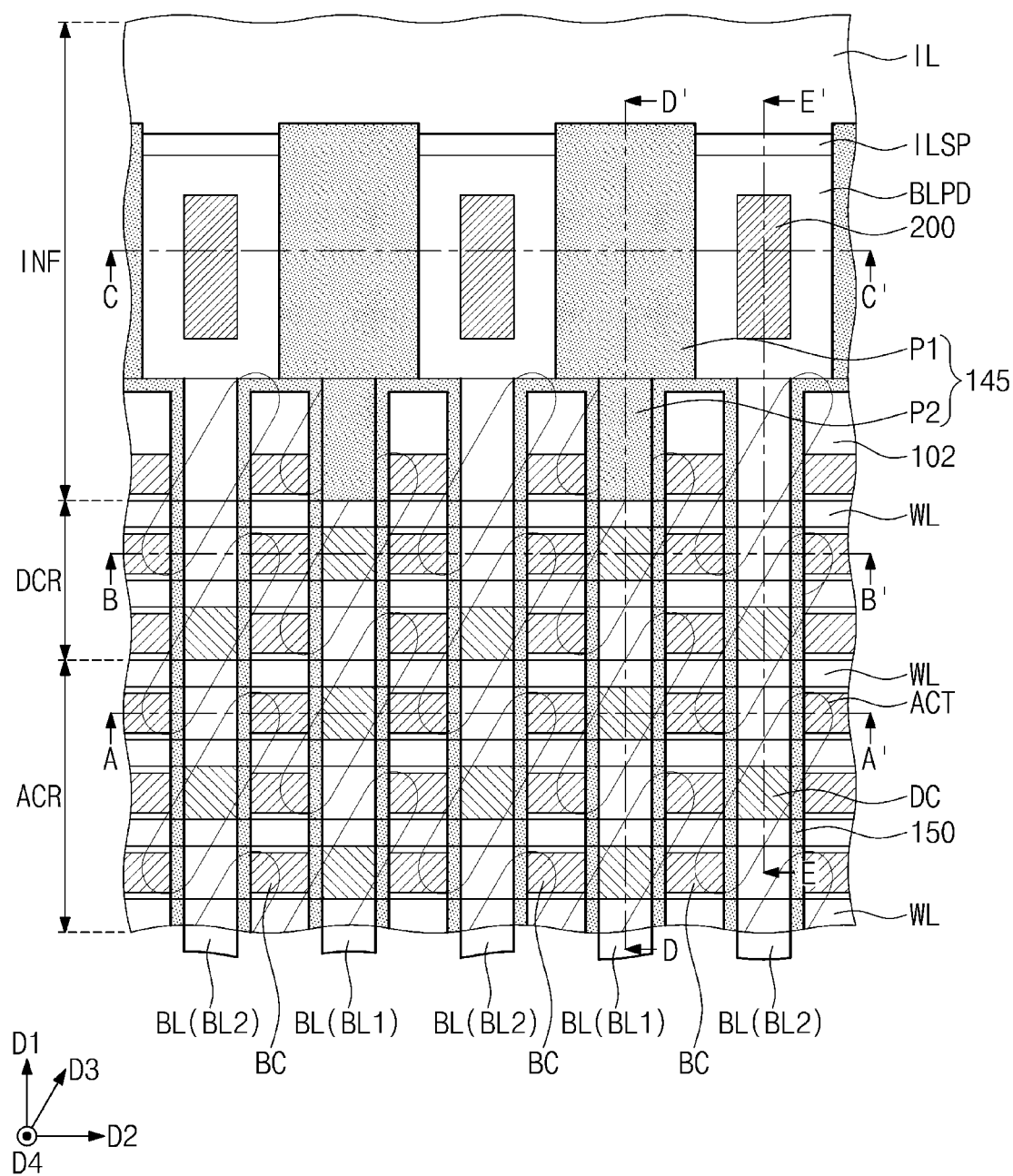

FIG. 24 is a plan view illustrating a semiconductor device according to an embodiment of the inventive concept and corresponding to the portion 'PP' of FIG. 1. Sectional views, which are respectively taken along lines A-A', C-C', and E-E' of FIG. 24, may be substantially the same as FIGS. 3A, 3C, and 3E, and sectional views, which are respectively taken along lines B-B' and D-D' of FIG. 24, may be substantially the same as FIGS. 21 and 22.

Referring to FIG. 24, according to an embodiment of the inventive concept, some of the storage node contacts BC may be disposed on the boundary region INF. The storage node contacts BC on the boundary region INF may be disposed between the second portion P2 of the insulating separation pattern 145 and each of the second bit lines BL2. The second portion P2 of the insulating separation pattern 145 may be extended in the first direction D1, between the storage node contacts BC on the boundary region INF. The second portion P2 of the insulating separation pattern 145 may electrically separate adjacent storage node contacts of the storage node contacts BC on the boundary region INF from each other.

In an embodiment, on the boundary region INF, the storage node contacts BC may not be electrically connected to the active patterns ACT. The landing pads LP may not be provided on the storage node contacts BC on the boundary region INF. The storage node contacts BC may be formed of or may include a conductive material (e.g., doped or undoped polysilicon). The insulating fences may be disposed on the boundary region INF and may be disposed between the storage node contacts BC.

Except for the above differences, the semiconductor device according to the present embodiments may be configured to have substantially the same features as the semiconductor device described with reference to FIGS. 20 to 22.

According to an embodiment of the inventive concept, bit lines may include first bit lines and second bit lines, which are alternately arranged. The second bit lines may be respectively connected to bit line pads having a relatively large width or a width greater than a width of each of the second bit lines, and thus, an electric connection between the second bit lines and connection structures on the bit line pads may be easily achieved.

An insulating separation pattern may be interposed between the bit line pads. The insulating separation pattern may include a first portion, which is provided between the bit line pads, and a second portion, which is extended from the first portion to a region between the second bit lines. The second portion of the insulating separation pattern may be interposed between the second bit lines and may cover an end portion of a corresponding one of the first bit lines BL1. Due to this structure, it may be possible to reduce a parasitic capacitance between adjacent ones of the bit lines. In addition, the bit lines may be spaced apart from a boundary spacer and a boundary insulating layer by the first portion of the insulating separation pattern and the bit line pads, which have relatively large widths and are interposed therebetween. Owing to this structure, it may be possible to reduce a bridge defect between adjacent ones of the bit lines, which is caused by the boundary spacer and the boundary insulating layer when an etching process is performed to form the bit lines.

In addition, storage node contacts may be disposed between each of the second bit lines and the second portion of the insulating separation pattern. Accordingly, it may be possible to reduce a defect, which may be caused by a contact between the storage node contacts and the first bit lines.

Thus, it may be possible to realize a semiconductor device with improved electric and reliability characteristics and a method of fabricating the same.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a substrate including an active cell region in which a cell circuit is provided, a peripheral region in which peripheral circuits for an operation of the cell circuit provided, a boundary region between the active cell region and the peripheral region, and a dummy cell region between the active cell region and the boundary region;
a plurality of word lines on the active cell region of the substrate, the plurality of word lines being spaced apart from each other in a first direction and extending in a second direction crossing the first direction;
a plurality of bit lines on the active cell region of the substrate, the plurality of bit lines crossing the plurality of word lines, extending in the first direction and being spaced apart from each other in the second direction, the plurality of bit lines comprising a plurality of first bit lines and a plurality of second bit lines, and the plurality of first and second bit lines being alternately arranged in the second direction;
a plurality of bit line pads on the boundary region of the substrate and spaced apart from each other in the second direction, wherein the plurality of second bit lines extend on the dummy cell region and the boundary region in the first direction, and are connected to the plurality of bit line pads, respectively; and
an insulating separation pattern on the boundary region of the substrate and between two adjacent bit line pads among the plurality of bit line pads, wherein a portion of the insulating separation pattern extends into a region between two adjacent second bit lines among the plurality of second bit lines on the boundary region and is in contact with an end portion of a corresponding first bit line of the plurality of first bit lines.

2. The semiconductor device of claim 1,
wherein each of the plurality of bit lines has a first width in the second direction,
wherein each of the plurality of bit line pads has a second width in the second direction, and
wherein the second width is larger than the first width.

3. The semiconductor device of claim 2,
wherein the insulating separation pattern comprises a first portion between the two adjacent bit line pads and a second portion between the two adjacent second bit lines,
wherein the first portion has a third width in the second direction,
wherein the second portion has a fourth width in the second direction, and
wherein the third width is larger than the fourth width.

4. The semiconductor device of claim 3,
wherein the fourth width of the second portion of the insulating separation pattern is equal to the first width of each of the plurality of bit lines.

5. The semiconductor device of claim 1,
wherein the insulating separation pattern comprises a first portion between the two adjacent bit line pads and a second portion between the two adjacent second bit lines, and
wherein the second portion of the insulating separation pattern is spaced apart from each of the two adjacent second bit lines and extends in the first direction, between the two adjacent second bit lines.

6. The semiconductor device of claim 5,
wherein an end portion of the second portion of the insulating separation pattern is in contact with the end portion of the corresponding first bit line, and
wherein side surfaces of the second portion of the insulating separation pattern are respectively aligned to side surfaces of the corresponding first bit line in the first direction.

7. The semiconductor device of claim 5,
wherein the second portion of the insulating separation pattern extends into the region between the two adjacent second bit lines on the dummy cell region, and
wherein an end portion of the second portion of the insulating separation pattern is in contact with the end portion of the corresponding first bit line.

8. The semiconductor device of claim 7,
wherein the corresponding first bit line and the end portion of the second portion of the insulating separation pattern contact each other at a boundary between the active cell region and the dummy cell region.

9. The semiconductor device of claim 5,
wherein each of the plurality of bit lines comprises a polysilicon pattern, an ohmic pattern, and a metal-containing pattern, which are sequentially stacked on the substrate, and
wherein an end portion of the second portion of the insulating separation pattern is in contact with the polysilicon pattern, the ohmic pattern, and the metal-containing pattern of the corresponding first bit line.

10. The semiconductor device of claim 5,
wherein an end portion of the second portion of the insulating separation pattern is in contact with the end portion of the corresponding first bit line, wherein the semiconductor device further comprises a bit line spacer on a side surface of each of the plurality of bit lines, and wherein a bit line spacer on a side surface of the corresponding first bit line extends along a side surface of the second portion of the insulating separation pattern.

11. The semiconductor device of claim 5, wherein the plurality of first bit lines are disposed on the active cell region of the substrate and extend on the dummy cell region of the substrate in the first direction, wherein the second portion of the insulating separation pattern extends in the first direction, between the two adjacent second bit lines on the boundary region, and wherein an end portion of the second portion of the insulating separation pattern is in contact with the end portion of the corresponding first bit line at a boundary between the boundary region and the dummy cell region.

12. The semiconductor device of claim 5, further comprising:

a plurality of storage node contacts disposed on the active cell region and the dummy cell region, wherein the plurality of storage node contacts include:

a plurality of first node contacts disposed between the plurality of bit lines and on the active cell region; and a plurality of second node contacts disposed between each of the plurality of second bit lines and the second portion of the insulating separation pattern and on the dummy cell region.

13. A semiconductor device, comprising:

a substrate including an active cell region in which a cell circuit is provided, a peripheral region in which peripheral circuits for an operation of the cell circuit provided, a boundary region between the active cell region and the peripheral region, and a dummy cell region between the active cell region and the boundary region;

a plurality of word lines on the active cell region of the substrate, the plurality of word lines being spaced apart from each other in a first direction and extending in a second direction crossing the first direction;

a plurality of bit lines on the active cell region of the substrate, the plurality of bit lines crossing the plurality of word lines, extending in the first direction and being spaced apart from each other in the second direction, the plurality of bit lines comprising a plurality of first bit lines and a plurality of second bit lines, and the plurality of first and second bit lines being alternately arranged in the second direction;

a bit line spacer on a side surface of each of the plurality of bit lines;

a plurality of bit line pads on the boundary region of the substrate and spaced apart from each other in the second direction, wherein the plurality of second bit lines extend on the dummy cell region and the boundary region in the first direction, and are connected to the plurality of bit line pads, respectively; and an insulating separation pattern disposed on the boundary region of the substrate and between two adjacent bit line pads of the plurality of bit line pads, wherein the insulating separation pattern comprises a first portion, which is disposed between the two adjacent bit line pads, and a second portion, which is extended into a region between two adjacent second bit lines, on the boundary region, of the plurality of second bit lines, wherein the second portion of the insulating separation pattern covers an end portion of a corresponding first bit line of the plurality of first bit lines, and wherein the bit line spacer on a side surface of the corresponding first bit line extends along a side surface of the second portion of the insulating separation pattern.

14. The semiconductor device of claim 13, wherein the second portion of the insulating separation pattern is spaced apart from each of the two adjacent second bit lines and extends in the first direction, between the two adjacent second bit lines.

15. The semiconductor device of claim 14, wherein the bit line spacer extends along the side surface of the corresponding first bit line and the side surface of the second portion of the insulating separation pattern in the first direction.

16. The semiconductor device of claim 15, wherein, on the boundary region, the bit line spacer is extended in the second direction to cover a portion of the first portion of the insulating separation pattern and a portion of a corresponding bit line pad of the plurality of bit line pads.

17. The semiconductor device of claim 13, wherein the second portion of the insulating separation pattern further extends into the region between the two adjacent second bit lines on the dummy cell region.

18. The semiconductor device of claim 17, wherein the corresponding first bit line and the end portion of the second portion of the insulating separation pattern contact each other at a boundary between the active cell region and the dummy cell region.

19. The semiconductor device of claim 13, wherein an end portion of the second portion of the insulating separation pattern is in direct contact with a bit line material of the end portion of the corresponding first bit line.

20. The semiconductor device of claim 19, wherein each of the plurality of bit lines comprises a polysilicon pattern, an ohmic pattern, and a metal-containing pattern, which are sequentially stacked on the substrate, and wherein the end portion of the second portion of the insulating separation pattern is in contact with the polysilicon pattern, the ohmic pattern, and the metal-containing pattern of the corresponding first bit line.

* * * * *